United States Patent
Yaegashi et al.

(10) Patent No.: US 7,057,936 B2
(45) Date of Patent: Jun. 6, 2006

(54) NONVOLATILE SEMICONDUCTOR MEMORY DEVICE

(75) Inventors: Toshitake Yaegashi, Yokohama (JP); Akira Goda, Yokohama (JP); Mitsuhiro Noguchi, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 143 days.

(21) Appl. No.: 10/896,081

(22) Filed: Jul. 22, 2004

(65) Prior Publication Data

US 2004/0264264 A1 Dec. 30, 2004

Related U.S. Application Data

(63) Continuation of application No. 10/393,453, filed on Mar. 21, 2003.

(30) Foreign Application Priority Data

Jun. 20, 2002 (JP) .................................. 2002-179751
Nov. 29, 2002 (JP) .................................. 2002-347798

(51) Int. Cl.
  *G11C 16/06* (2006.01)

(52) U.S. Cl. .................. 365/185.22; 365/185.27; 365/185.29

(58) Field of Classification Search ............ 365/185.22, 365/185.24, 185.27, 185.29
See application file for complete search history.

(56) References Cited

U.S. PATENT DOCUMENTS

| 5,555,204 A | 9/1996 | Endoh et al. |
| 5,774,397 A | 6/1998 | Endoh et al. |
| 5,946,231 A | 8/1999 | Endoh et al. |
| 6,014,330 A | 1/2000 | Endoh et al. |
| 6,031,760 A | 2/2000 | Sakui et al. |
| 6,108,238 A | 8/2000 | Nakamura et al. |
| 6,396,741 B1 | 5/2002 | Bloom et al. |
| 6,522,580 B1 | 2/2003 | Chen et al. |

FOREIGN PATENT DOCUMENTS

| JP | 05-343695 | 12/1993 |
| JP | 7-169284 | 7/1995 |
| JP | 08-087895 | 4/1996 |
| JP | 11-31391 | 2/1999 |
| JP | 11-219593 | 6/1999 |
| JP | 2001-084788 | 3/2001 |
| JP | 2001-167589 | 6/2001 |
| JP | 2003-196988 | 7/2003 |

OTHER PUBLICATIONS

G. J. Hemink, et al., "Fast and Accurate Programming Method for Multi–Level Nand EEPROMS" 1995 Symposium on VLSI Technology Digest of Technical Papers, pp. 129–130.

(Continued)

*Primary Examiner*—Anh Phung
*Assistant Examiner*—Hien Nguyen
(74) *Attorney, Agent, or Firm*—Oblon, Spivak, McClelland, Maier & Neustadt, P.C.

(57) ABSTRACT

A cell array is configured by arranging a plurality of electrically writable erasable nonvolatile memory cells on a semiconductor substrate. Each of the memory cells has a charge accumulation layer formed via a first gate insulating film and a gate electrode formed on the charge accumulation layer via a second gate insulating film. A control circuit controls the sequence of writing and erasing the data into and from a memory cell selected in the memory cell. In writing the data into the memory cell, a first write operation is to apply a write pulse voltage with a first step-up voltage between the gate electrode and the semiconductor substrate. A second write operation is to apply a write pulse voltage with a second step-up voltage lower than the first step-up voltage.

20 Claims, 38 Drawing Sheets

OTHER PUBLICATIONS

S.C. Everist, et al., "Modeling the Cycling Degradation of Silicon–Oxide–Nitride–Oxide–Semiconductor Transistors" Appl. Phys. Lett. 60 (17), Apr. 27, 1992, pp. 2101–2103.

Shin–ichi Minami, et al., "A Novel Monos Nonvolatile Memory Device Ensuring 10–Year Data Retention After $10^7$ Erase/Write Cycles" IEEE Transaction on Electron Devices, vol. 40, No. 11, Nov. 1993.

Margaret L. French, et al., "Scaling of Multidielectric Nonvolatile Sonos Memory Structures" Solid State Electronics, vol. 37, No. 12, 1994, pp. 1913–1923.

F. Musuoka, "Handbook of Flash Memory Technologies" Science Forum, pp. 176–178.

H.G. Hemink et al., "Fast and Accurate Programming Method for Multi–level NAND EEPROMS", VLSI Technology Dig. Tech. Papers, pp. 129–130, Jun. 1995.

Kang–Deog Suh et al. "A 3.3V 32 Mb NAND Flash Memory with Incremental Step Pulse Programming Scheme" ISSCC Dig. Tech. Papers, pp. 128–129, Feb. 1995.

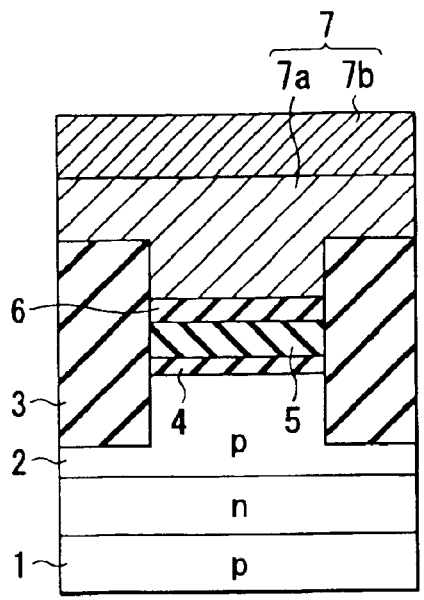
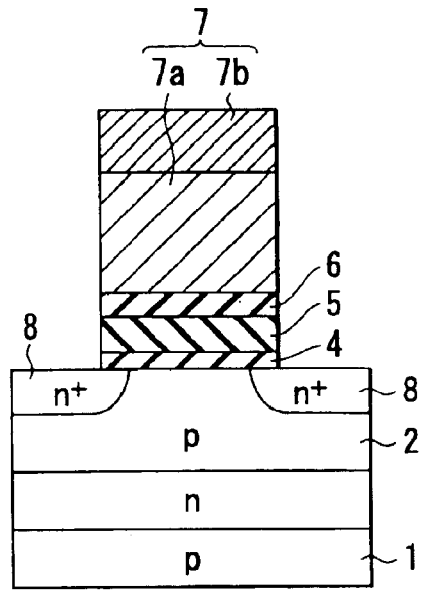
FIG. 5A    FIG. 5B
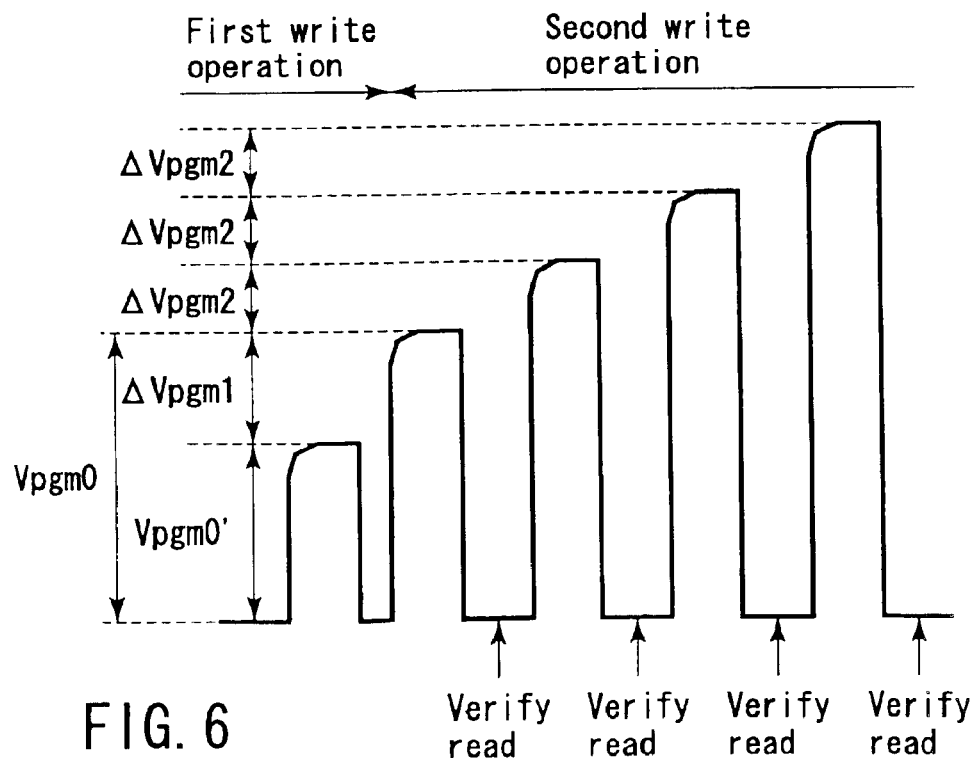
FIG. 6

(Threshold voltage distribution width with constant step-up width)

(Threshold voltage distribution width with $\Delta Vpgm1 > \Delta Vpgm2 = \Delta pgm3$)
$(\alpha + \Delta Vth(n0))/2$

NONVOLATILE SEMICONDUCTOR MEMORY DEVICE

CROSS-REFERENCE TO RELATED APPLICATIONS

This application is a continuation of and claims the benefit of priority under 35 USC §20 from U.S. application Ser. No. 10/393,453, filed Mar. 21, 2003, and is based upon and claims the benefit of priority under 35 USC §119 from Japanese Patent Applications No. 2002-179751, filed Jun. 20, 2002; and No. 2002-347798, filed Nov. 29, 2002, the entire contents of both of which are incorporated herein by reference.

BACKGROUND OF THE INVENTION

1. Field of the Invention

This invention relates to a nonvolatile semiconductor memory device, and more particularly to a step-up write/erase operation.

2. Description of the Related Art

A floating-gate memory cell has been widely used as one of the electrically writable erasable nonvolatile semiconductor memory devices. A floating-gate memory cell has a structure where a floating gate and a control gate are stacked, on a semiconductor substrate. A tunnel oxide film of about 9 nm thick is formed between the semiconductor substrate and the floating gate. An ONO film equivalent to an oxide film of about 14 nm thick is formed between the floating gate and the control gate. The memory cell changes the threshold value of the cell according to the amount of charge accumulated in the floating gate and thereby distinguishes between the state of data "0" (written state) and the state of data "1" (erased state).

In recent years, a MONOS memory cell using a silicon nitride film as a charge accumulation layer in place of a floating gate has been developed. In a MONOS memory cell, a silicon nitride film formed above the semiconductor substrate via a thin tunnel oxide film of about 2 nm is used as a charge accumulation layer. Data is written into or erased from a MONOS cell by injecting electrons or holes from the substrate into the silicon nitride film to change the amount of accumulated charge in the silicon nitride film and thereby changing the threshold value of the memory cell.

When writing and erasing are done repeatedly in a MONOS cell, the interface level increases at the interface between the silicon substrate and the tunnel oxide film as pointed out by S. C. Everist, et al. (reference 1: "Modeling the cycling degradation of silicon-oxide-nitride-oxide-semiconductor transistors," Appl. Phys. Lett. 60(17)27, April 1992, pp. 2101–2103).

According to reference 1, the increase in the interface level depends on the total amount of charge of the holes passed through the tunnel oxide film. Shin-ichi Minami, et al. have proposed a model where the holes accumulated in the charge accumulation layer pass through the tunnel oxide film when a write voltage is applied, thereby generating an interface level (reference 2: "A Novel MONOS Nonvolatile Memory Device Ensuring 10-Year Data Retention after $10^7$ Erase/Write Cycles," IEEE TRANSACTIONS ON ELECTRON DEVICES, VOL. 40, NO. 11, November 1993, pp. 2011–2017).

According to these references, in order to increase the reliability of a MONOS memory cell, the total amount of charge of the holes passed through the tunnel oxide film and the number of holes accumulated after erasure have only to be decreased. To decrease the total number of holes passing through without changing the number of program and erase cycles, it is suggested that the difference (the threshold voltage window) between the programmed threshold voltage (the threshold voltage after writing) and the erased threshold voltage (the threshold voltage after erasing) have to be made smaller. In addition, to decrease the number of holes after erasure, it is suggested that the threshold value after erasure have to be made more positive.

However, this method has the following problem.

Let a state where electrons are accumulated in the charge accumulation layer be a written state. In this state, when the cell is left at it is for a long time, the accumulated electrons leak gradually into the silicon substrate via the thin tunnel oxide film. As a result, the threshold value of the cell lowers gradually. This might make it impossible to distinguish between the written state and the erased state. When the difference in threshold value between the written state and the erase state is small, the margin for such data collapse becomes small. A similar problem arises in a case where the threshold value of a cell in the erased state increases gradually to the extent that it cannot be distinguished from the written state.

Furthermore, when the erased threshold voltage is made positive and the threshold window is made constant, the written threshold voltage increases. As a result, the amount of negative charge in the charge storage (charge accumulation) electrode in the written state increases further. The increase in the amount of charge in the charge storage electrode makes it easier for the charge to escape from the charge storage electrode through its electric field, which adversely influences the charge retention characteristic.

Therefore, in the prior art, it is difficult to make the increase of the number of program and erase cycles compatible with the securing of a sufficient threshold margin for data collapse. Furthermore, an increase in the interface level when there is no hole accumulation has not been described and measures against the increase have not been disclosed in references 1 and 2.

On the other hand, a step-up writing method where a write voltage of Vpgm is increased gradually has been proposed by G. J. Hemink, et al., as a method of writing data into a conventional floating-gate NAND EEPROM (reference 3: "Fast and accurate programming method for multilevel NAND flash EERPOMS," VLSI Tech. Dig., pp. 129–130, 1995). In a write operation ("0" program) in a floating-gate memory cell, a high-voltage write pulse Vpgm of about +15V to +25V is applied, with 0V being applied to the well and diffused layer, and a Flowler-Nordheim current (FN tunnel current) is caused to flow thorough the tunnel oxide film, electrons are injected from the channel into the floating gate to charge the floating gate negatively, and the threshold voltage of the memory cell is raised, which completes the write operation.

Using FIGS. 1 and 2, a step-up write operation will be explained. FIG. 2 schematically shows a write voltage pulse waveform applied to the control gate of a memory cell. First, a pulse with a write start voltage of Vpgm0 is applied to the control gage. Thereafter, a verify read operation to verify whether the memory cell has reached a desired threshold voltage is carried out. If the threshold voltage of the cell has not reached the desired one, a write pulse with a voltage obtained by raising the write voltage by a step-up voltage of ΔVpgm is applied to the control gate and the write operation is carried out again. Then, the threshold voltage of the memory cell is verified in a verify operation. Thereafter, a write operation to apply a voltage stepped up in ΔVpgm increments to the control electrode of the memory cell and a verify operation are repeated until the memory cell has exceeded a desired threshold voltage of Vverify.

FIG. 1 shows the change of a drain-current (Id)-gate-voltage (Vg) characteristic of a floating-gate memory cell when writing is done by raising a write pulse voltage of FIG. 2 in ΔVpgm increments and applying the voltage a plurality of times. In FIG. 1, Ith indicates the drain current value of a memory cell producing a threshold voltage. As shown in FIG. 1, in the prior art, the write pulse voltage Vpgm0 is applied to a memory cell with an erased threshold voltage of Vthe, with the result that the threshold voltage of the memory cell rises close to the write threshold voltage significantly. Furthermore, each time a pulse ΔVpgm higher in voltage than the preceding one is applied, the Id-Vg curve shifts in parallel in ΔVth (Pgm) steps toward the high-voltage side. That is, each time a pulse ΔVpgm higher in voltage than the preceding one is applied, the threshold voltage of the memory cell rises in ΔVth (Pgm) steps.

The threshold voltage change ΔVth (pgm) becomes larger, as the step-up voltage ΔVpgm becomes higher. According to a detailed analysis based on "Flash Memory Technical Handbook," pp. 176–178, 1993, compiled by Fujio Masuoka, it goes as follows. It is assumed that the gate length is $L_G$, the channel width is W, the total capacitance of the floating gate electrode is Ctot, the thickness of the tunnel oxide film is tox, the electric field of the tunnel oxide film at time t is Eox (t), α and β are invariables. It is also assumed that the density of tunnel current satisfies the expression $\alpha[Eox(t)]^2 \times \exp[-\beta/Eox(t)]$ and each write pulse duration is tpgm. It is further assumed that the charge density of a surface depletion layer is $Q_B$, the inversion potential is $2\phi_F$, the equivalent gate capacitance per unit area measured from the channel is Ceff, the channel potential in programming is Vchannel, and the control gate voltage in programming is $V_{CG}$. Under these conditions, the dependence Vth(t) of the threshold voltage on the write time when a constant voltage of $V_{CG}$ at t=0 is given by equation (1):

$$Vth(t) = 2\phi_F - Q_B/Ceff + V_{CG} - Vchannel - (Ctot \cdot tox)\beta/\{Cpoly \cdot ln[(L_G W \alpha \beta/Ctot \cdot tox)t + \exp[\beta/Eox(0)]]\} \quad (1)$$

Here, in a write operation, the channel potential Vchannel can be considered almost constant in the inverted state. Therefore, the difference ΔVpgm in the control gate voltage in writing is equal to the difference ΔVth(pgm) in the increase in the threshold voltage in a specific time within an error of ±10% under the condition that equation (2) holds:

$$tpgm \geq 6 \times [(tox \cdot Ctot)/(L_G W \alpha \beta)] \times \exp\{\beta/Eox(0)\} \quad (2)$$

In an ordinary floating-gate memory cell, to hold the control gate voltage in writing low, the coupling ratio C1/Ctot (where C1 is the capacitance between the control gate and the floating gate) is designed to be 0.5 or more. At this time, if the permittivity of the oxide film is $\in ox$, the electric field of the tunnel oxide film meets the following expression:

$$(tox \cdot Ctot)/(L_G W) \in ox/\{1 - (C1/Ctot)\} \geq 6.9 \times 10^{-11} [F/m]$$

Furthermore, in the case of FN tunnel current in a cell using a polycrystalline silicon floating-gate electrode, the following equations are fulfilled:

$$\alpha = 3.2 \times 10^{-6} [A/V^2], \beta = 2.4 \times 10^{10} [V/m]$$

Therefore, it follows that, with Eox (0)≧11.5 [Mv/cm], tpgm satisfies equation (2) in the range of a write pulse duration equal to or longer than $6.2 \times 10^{-6}$ [s], and that ΔVth (pgm) can be considered almost equal to ΔVpgm in the practical operation range using a write electric field of 11.5 [MV/cm] and a pulse duration of 6.2 µs or longer.

FIG. 3 shows, in more detail, the change of the threshold voltage of a memory cell in fast and slow writing, using the writing method of FIG. 1 is applied. The figure is based on the assumption that a write and erase threshold voltage distribution as shown in FIG. 4 holds. In FIG. 4, it is assumed that the erase threshold voltage has a spread that has Vthel as the lower limit and Vtheh as the upper limit and is broader than the distribution of the write threshold voltage.

In a conventional floating-gate NAND flash memory, the threshold voltage after erasure may be negative. Immediately after erasure, the threshold voltage has a distribution width equal to or greater than 2V. For example, Vthel is set in the range from −4V to −2V and Vtheh is set in the range of from −2V to 0V. In the threshold voltage immediately after writing, the threshold voltage distribution width can be made smaller than the erase threshold voltage width (Vtheh−Vthel) because of a verify operation. Immediately after writing, the threshold voltage is set in the range that has Vverify as the lower limit and Vverify+ΔVth (pgm) as the upper limit.

In FIG. 3, white circles indicate a memory cell with the fastest write speed and black circles indicate a memory cell with the slowest write speed. Here, it is assumed that the cell with the fastest write speed has the upper limit Vtheh of the erase threshold as the initial erase threshold voltage and the cell with the slowest write speed has the lower limit Vthel of the erase threshold voltage as the initial erase threshold. However, even if the initial threshold voltage and the write speed are independent factors, the same reasoning holds because the condition of FIG. 3 is the worst one that will probably happen.

Traditionally, to reduce the number of write pulses and shorten the write time, Vpgm is set so as to be higher than the lower limit Vthw of the write threshold voltage in the memory cell with the fastest write speed. It is preferable that Vpgm be set so as to be in the range that has Vverify as the lower limit and Vverify+ΔVth (pgm) as the upper limit. Normally, Vverify is set, for example, 0.1 to 1V higher than the minimum setting value Vthw of the write threshold value, because the threshold voltage changes with time due to variations in the charge retention characteristic.

On the other hand, in the memory cell with the slowest write speed in FIG. 3, a first write pulse has a threshold voltage smaller than Vverify and a further write operation is carried out. Thereafter, the application of step-up pulses raises the threshold value of the memory cell in ΔVth (pgm) increments each time the number of write pulses increases. After a third write pulse is applied, the threshold voltage of the memory cell is a little lower than Vverify. Consequently, it is determined that the writing is insufficient and a fourth write operation is carried out, with the result that the threshold voltage of the memory cell rises by ΔVth (pgm). This completes the write operation.

Even in the memory cell with the slowest write speed, immediately after the verify write operation, the threshold voltage is in the range that has Vverify as the lower limit and Vverify+ΔVth (pgm) as the upper limit. Although not shown in FIG. 3, even in memory cells with other write speeds, vpgm is in the range that has Vverify as the lower limit and Verify+ΔVth (pgm) as the upper limit immediately after the verify write operation, with the result that Vpgm has a threshold distribution as shown in FIG. 4.

As seen from FIG. 3 and the above explanation, when ΔVpgm is made smaller to narrow the threshold distribution width, the number of pulses necessary for writing increases, depending on the number obtained by raising (Vtheh–Vthel)/ΔVpgm to an integer. This results in an increase in the write time.

In such a step-up write operation, as the step-up voltage ΔVpgm is made higher, the number of pulses necessary for writing decreases, which enables a higher-speed write operation. On the other hand, since the increment ΔVth(pgm) of the threshold voltage of the cell written into becomes almost equal to ΔVpgm, making ΔVpgm larger results in an increase in the threshold distribution width.

Furthermore, consider a case where Vpgm is set so as to be higher than the lower limit Vthw of the write threshold voltage in the memory cell with the fastest write speed to shorten the write time by reducing the number of write pulses. In this case, if C1 is the capacitance between the charge accumulation electrode and the control gate electrode and (Vth–$V_{FB}$) is the threshold voltage with no charge accumulation on the basis of the flat band voltage of the control electrode, the tunnel insulating film electric field when a first pulse is applied to the memory cell with the slowest write speed of FIG. 3 is expressed as equation (3) in the worst case:

$$\{(Vpgm0-Vthel)+(Vth-V_{FB})\}\times(C1/Ctot)/tox \quad (3)$$

That is, in the case of the memory cell with the fastest write memory cell of FIG. 3, a greater electric field than the one expressed by equation (3) is applied. As a result, the stress electric field causes a dielectric breakdown of the tunnel insulating film or an increase in the interface level or in the fixed charge traps, which result in the deterioration of the charge retention characteristic and a shift in the threshold voltage after writing and erasing are done repeatedly. This causes a reliability problem.

Furthermore, in a NAND EEPROM, when the data is read, a read pass voltage Vread is applied to the control gate of the memory cells unselected in reading. The memory cells unselected in reading must be on (conducting), regardless of the data state. Thus, Vread has to be a sufficiently higher voltage than the write threshold voltage. Therefore, when the threshold distribution width ΔVth of the cell written into is large, the pass voltage Vread must also be high.

As the pass voltage Vread gets higher, the threshold value of the memory cell rises due to Vread stress during the read operation, with the result that the cells can change their state from the erased state (or the state with a low threshold voltage) to the written state (or the state with a high threshold voltage). That is, when making ΔVpgm larger increases ΔVth, it is necessary to raise Vread, which decreases the reliability of the memory cells.

Moreover, in cells written into too high threshold voltage, the number of charges passing through their gate electrode film is large, which causes the problem of degrading the gate insulating film due to repetitive rewrite operations.

For the above reasons, it is difficult to make a high-speed write operation compatible with high reliability (a narrow threshold width). To solve this problem, a method of setting the step-up voltage ΔVpgm to two or more values by switching modes according to the application has been proposed (as disclosed in U.S. Pat. No. 6,031,760 or 6,108,238). With this method, a mode with a large ΔVpgm can be used when the application of memory cells requires a high-speed write operation, whereas a mode with a small ΔVpgm can be used when the application of memory cells requires high reliability (a narrow threshold width).

In this method, however, either the high-speed write operation or the narrow threshold distribution is given priority by mode selection, but both of them cannot be satisfied at the same time.

As described above, with the conventional MONOS cell, it is difficult to make the increase in the number of repeatable rewrite operations compatible with securing a threshold margin for data collapse. Furthermore, in the conventional floating-gate cell step-up writing method, it is not clear how the step-up voltage ΔVpgm is set to make high-speed writing compatible with high reliability (or a narrow threshold distribution). Therefore, a nonvolatile semiconductor memory using a step-up writing method capable of making high-speed writing compatible with high reliability has been needed. In addition, a step-up writing method capable of increasing the number of repeatable rewrite operations without degrading the threshold margin was also needed.

BRIEF SUMMARY OF THE INVENTION

According to an aspect of the present invention, there is provided a nonvolatile semiconductor memory device comprising: a semiconductor substrate; a cell array which is configured by arranging a plurality of electrically writable erasable nonvolatile memory cells on the semiconductor substrate, each of the memory cells having a gate insulating film including a stacked structure of a tunnel insulating film and a charge accumulation insulating film, and a gate electrode formed on the gate insulating film; and a control circuit which controls write operation and erase operation of a memory cell selected in the cell array and which has an operation mode in which a sequentially stepped-up pulse voltage is applied between the gate electrode and the semiconductor substrate in at least one of the write operation and the erase operation.

According to another aspect of the present invention, there is provided a nonvolatile semiconductor memory device comprising: a semiconductor substrate; a cell array which is configured by arranging a plurality of electrically writable erasable nonvolatile memory cells on the semiconductor substrate, each of the memory cells including a charge accumulation layer formed on a first gate insulating film, a second gate insulating film on the charge accumulation layer, and a gate electrode on the second gate insulating film; and a control circuit which controls the sequence of writing and erasing data into and from a memory cell selected in the cell array and which has a write operation mode including a first operation of applying sequentially a write pulse voltage with a first step-up voltage between the gate electrode and the semiconductor substrate and a second write operation of applying a write pulse voltage with a second step-up voltage lower than the first step-up voltage in writing the data into the memory cell.

According to another aspect of the present invention, there is provided a nonvolatile semiconductor memory device comprising: a semiconductor substrate; a cell array which is configured by arranging a plurality of electrically writable erasable nonvolatile memory cells on the semiconductor substrate, each of the memory cells including a charge accumulation layer made of a conductive material film formed on a first gate insulating film, a second gate insulating film on the charge accumulation layer, and a gate electrode on the second gate insulating film, the second gate insulating film including a lower insulating film, an upper insulating film and a middle insulating film located therebetween, the lower insulating film being thinner than the upper insulating film; and a control circuit which controls the sequence of writing and erasing data into and from a memory cell selected in the cell array and which has an erase operation mode in which a sequentially stepped-up pulse voltage is applied between the gate electrode and the semiconductor substrate in erasing the data from the memory cell.

According to another aspect of the present invention, there is provided a nonvolatile semiconductor memory device comprising: a semiconductor substrate; a cell array which is configured by arranging a plurality of electrically writable erasable nonvolatile memory cells on the semiconductor substrate, each of the memory cells having a gate insulating film including a stacked structure of a tunnel insulating film and a charge accumulation insulating film, and a gate electrode on the gate insulating film; and a control circuit which controls the sequence of writing and erasing data into and from a memory cell selected in the cell array and which has an erase operation mode in which a first erase pulse defined by a first voltage and a first pulse width is applied between the gate electrode and the semiconductor substrate and thereafter applying a second erase pulse defined by a second voltage smaller in absolute value than the first voltage and a second pulse width greater than the first pulse width in erasing the data from the memory cell.

According to another aspect of the present invention, there is provided a nonvolatile semiconductor memory device comprising: a memory cell array which is configured by arranging a plurality of electrically rewritable nonvolatile semiconductor memory cells in a matrix, each of the memory cells having a control gate and a charge accumulation layer; a write circuit which writes data by applying a write voltage to the control gate of a memory cell selected in the memory cell array; and a verify circuit which is connected to the selected memory cell and which senses the threshold voltage of the memory cell each time the write voltage is generated and verifies whether the threshold voltage has reached a specific value, wherein each time a write operation is carried out, the write voltage outputted from the write circuit is increased in such a manner that the increment of a first write voltage between a first write operation and a second write operation is larger than the increment of a second write voltage between the second write operation and a third write operation and the increments of the second and later write voltages are constant.

According to another aspect of the present invention, there is provided a nonvolatile semiconductor memory device comprising: a memory cell array which is configured by arranging a plurality of electrically rewritable nonvolatile semiconductor memory cells in a matrix, each of the memory cells having a control gate and a charge accumulation layer; a write circuit which writes data by applying a write voltage to the control gate of a memory cell selected in the memory cell array; and a verify circuit which is connected to the selected memory cell and which senses the threshold voltage of the memory cell each time the write voltage is generated and verifies whether the threshold voltage has reached a specific value, wherein the write voltage outputted from the write circuit is such that a first write time is shorter than a second and later write times and the second and later write times are the same and that a second and later write voltages increase in a specific increment each time a write operation is carried out.

BRIEF DESCRIPTION OF THE SEVERAL VIEWS OF THE DRAWING

FIGS. 5A and 5B are sectional views of a MONOS memory cell according to a first embodiment of the present invention;

FIG. 6 shows a write operation waveform in the first embodiment;

DETAILED DESCRIPTION OF THE INVENTION

Figure 1:
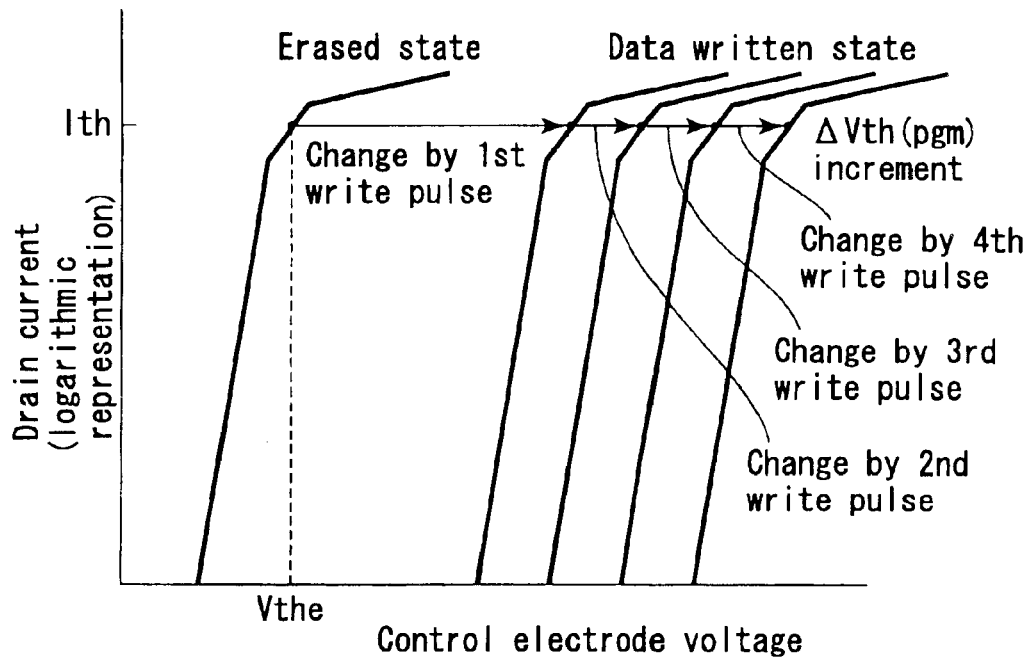
FIG. 1 shows a drain-current-gate-voltage characteristic in writing data into a floating-gate memory cell.

Hereinafter, referring to the accompanying drawings, embodiments of the present invention will be explained.

[First Embodiment]

A MONOS flash memory according to a first embodiment of the present invention will be explained. In a MONOS cell, if the captured charge centroid is in a place a distance of tox equivalent to oxide film thickness from the semiconductor substrate, the electric field in the tunnel oxide film is Eox, the capacitance between the captured charge centroid and the gate electrode is C1, and the sum of the capacitance between the charge centroid and the control gate and the capacitance between the charge centroid and the semiconductor substrate is Ctot, these reference symbols can be considered in the same manner as those in a conventional floating-gate memory cell.

It is well known that writing data into a MONOS cell (that is, injecting electrons) can be expressed in FN tunnel current as into a floating-gate cell (reference 4: "Scaling of Multi-dieledtric Nonvolatile SONOS Memory Structures," M. L. French and M. H. White, Solid State Electronics Vol. 37, No. 12, 1994, pp. 1913–1923). According to equation (25) in reference 4, in a MONOS cell whose tunnel oxide film is thinner than, for example, 3 nm, the tunnel current density is expressed as $\alpha[Eox(t)]^2 \times \exp[-\beta/Eox(t)]$, where $\alpha=3.2\times10^{-6}$ [A/V$^2$] and $\beta=1.6\times10^{10}$ [V/m].

If the equivalent oxide film thickness of the tunnel insulating film is toxeq, the equivalent oxide film thickness of the charge accumulation insulating film is tNeq, and the equivalent oxide film thickness of the block insulating film is tboxeq, (tNeq+tboxeq)/(toxeq+tNeq+tboxeq) is made 0.9 or less in an ordinary MONOS to suppress the write voltage of the control gate to a low level. Under this condition, the coupling ratio of C1/Ctot=1−(tNeq+tboxeq)/(toxeq+tNeq+tboxeq) becomes 0.1 or more.

As described earlier, according to an analysis based on "Flash Memory Technical Handbook," pp. 176–178, 1993, compiled by Fujio Masuoka, it is assumed that the gate length is $L_G$, the channel width is W, the electric field at time t in the tunnel oxide film is Eox(t), $\alpha$ and $\beta$ are invariables, the tunnel current density is expressed as $\alpha[Eox(t)]^2 \times \exp[-\beta/Eox(t)]$, and each write pulse width (or duration) is tpgm. It is also assumed that charge density of a surface depletion layer in a write operation is $Q_B$, the inversion potential is $2\phi_F$, the equivalent gate capacitance per unit area measured from the channel is Ceff, the channel potential in a write operation is Vchannel, and the control gate electrode voltage in a write operation is $V_{CG}$. Under these assumptions, the dependence Vth(t) of the threshold voltage on the write time when a specific voltage of $V_{CG}$ is applied to the control gate at t=0 is expressed by equation (1) as described earlier.

The channel potential Vchannel in writing can be considered almost constant in the inverted state. As a result, the difference $\Delta$Vth(pgm) of the control gate voltage in writing is equal to the difference $\Delta$Vpgm of the increase in the threshold in a specific time within an error of ±10% under the condition where equation (2) holds.

Therefore, in the MONOS cell, when Eox(0)≧8 [MV/cm], it can be considered that equation (2) is satisfied in the write pulse duration range of tpgm≧2.2×10$^{-6}$ [s] and that $\Delta$Vth(pgm) is almost equal to $\Delta$Vpgm in the a practical operation range using a write pulse duration equal to or longer than 2.2 µs. When the tunnel oxide film is as thick as 3 nm or more and FN tunnel current caused by the tunnel insulating film is predominant, the same equation holds as in the prior art even in the MONOS cell. In addition, when Eox(0)≧11.5 [MV/cm], it can be considered that equation (2) is satisfied in the write pulse duration range of tpgm equal to or larger than 6.2×10$^{-6}$ [s] and that $\Delta$Vth(pgm) is almost equal to $\Delta$Vpgm in a practical operation range using a write pulse duration equal to or longer than 6.2 µs. It can be seen from equation (1) that $\Delta$Vth(pgm) increases as $\Delta$Vpgm becomes larger, regardless of the value of tpgm, when the initial charge state is the same.

The first embodiment is characterized in that, in a write operation, after a first write operation in which data is written with a weak electric field in such a manner that a write end decision voltage (or a verify voltage) Vverify has not been exceeded, data is written in a second write operation in such a manner that Vverify has been exceeded. Writing data into the MONOS memory cell by the method of the first embodiment makes it possible to increase the number of possible rewrite operations without degrading a threshold value margin for data collapse and write data at a high speed.

Furthermore, in the first embodiment, it is preferable that the step-up voltage in the first write operation is made higher or the write pulse width in the first write operation is made greater than those of the second embodiment. That is, the first embodiment is characterized in that two stages of step-up voltage are used in writing data into a memory cell and that its range and effect are clarified.

Use of the first embodiment makes it possible to increase the number of possible rewrite operations without degrading the threshold value margin even after writing and erasing are done repeatedly in writing data into a memory cell using an insulating film as a charge accumulation layer and write data at a high speed. Even when the writing method using two kinds of step-up voltage is applied to a floating-gate memory cell, the electric field applied to the inter-gate insulating film can be made smaller, which realizes a high reliability of the memory cells. Furthermore, the amount of change in the threshold voltage against the number of applications of write pulses can be made larger at the beginning of a write operation and made smaller at the end of the write operation. Therefore, it is possible to make a high-speed write operation compatible with a narrow threshold distribution, or a high reliability.

FIGS. 5A and 5B are sectional views taken along the channel width and along the channel length of a nonvolatile semiconductor memory cell in the first embodiment. In a cell array region of a silicon substrate 1, a p-type well 2 with, for example, a boron or indium impurity concentration of 10$^{14}$ (cm$^{-3}$) to 10$^{19}$ (cm$^{-3}$) is formed. In the p-type well 2, an element isolation insulating film 3 is formed to a thickness of about 10 to 500 nm. In the element region defined by the element isolation insulating film 3, a stacked gate insulating film including a charge accumulation layer is formed. The stacked gate insulating film is composed of a tunnel insulating film 4 composed of, for example, a silicon oxide film or silicon oxynitride film with a thickness of 0.5 to 10 nm, a charge accumulation layer 5 composed of a silicon nitride film with a thickness of 3 to 50 nm, and a block insulating film 6 composed of a silicon oxide film or silicon oxynitride film with a thickness of 3 to 30 (nm). It is preferable that the thickness of the tunnel insulating film 4 is 4 nm or less.

On the stacked gate insulating film, a control gate electrode 7 is formed. The control gate electrode 7 can be composed of an n-type or p-type polysilicon layer to which phosphorus, arsenic, or boron are heavily added. In this embodiment, however, the control gate electrode 7 has a stacked structure of a polysilicon layer 7a and a metal silicide layer 7b of 10 to 500 nm thickness. Not only WSi (tungsten silicide) but also NiSi, MoSi, TiSi, CoSi may be used as the metal silicide 7b. Alternatively, a polysilicon layer and a metal layer, such as Al or W, may be combined to form a stacked structure. On both sides of the gate electrode 7, n-type source-drain diffused layers 8 are formed.

The well 2, control gate electrode 7, and source-drain diffused layers 8 are each connected to electrode wires, which makes it possible to control voltages. Normally, the control gate electrode 7 is connected to a word line, one of the source-drain diffused layers 8 is connected to a bit line and the other is connected to a common source line.

To erase data, an erase voltage of Vera is applied to the well, with the control gate electrode 7 at 0V, thereby injecting holes from the semiconductor substrate via the tunnel insulating film into the charge accumulation layer 5, which shifts the threshold voltage of the memory cell in the negative direction. To read the data, the well 2 and source are set to 0V, a positive voltage is applied to the drain, and a decision voltage of Vref is applied to the gate electrode 7. In this state, whether the threshold voltage of the memory cell is higher or lower than Vref is determined, depending on whether current flows between the source and the drain. In this determination, data "0" (written state) and data "1" (erased state) are decided. The reading and erasing method may be a known method as disclosed in, for example, U.S. Pat. No. 6,031,760 or 6,108,238.

To write data, a high-voltage write pulse is applied to, for example, the gate electrode 7, with the well 2 and source-drain diffused layers 8 at 0V, thereby injecting electrons from the semiconductor substrate into the charge accumulation layer 5 via the tunnel insulating layer 4. In this way, the threshold voltage of the memory cell is shifted in the positive direction, thereby writing the data.

A write operation in the first embodiment will be explained concretely by reference to FIGS. 6 to 9.

Figure 7:
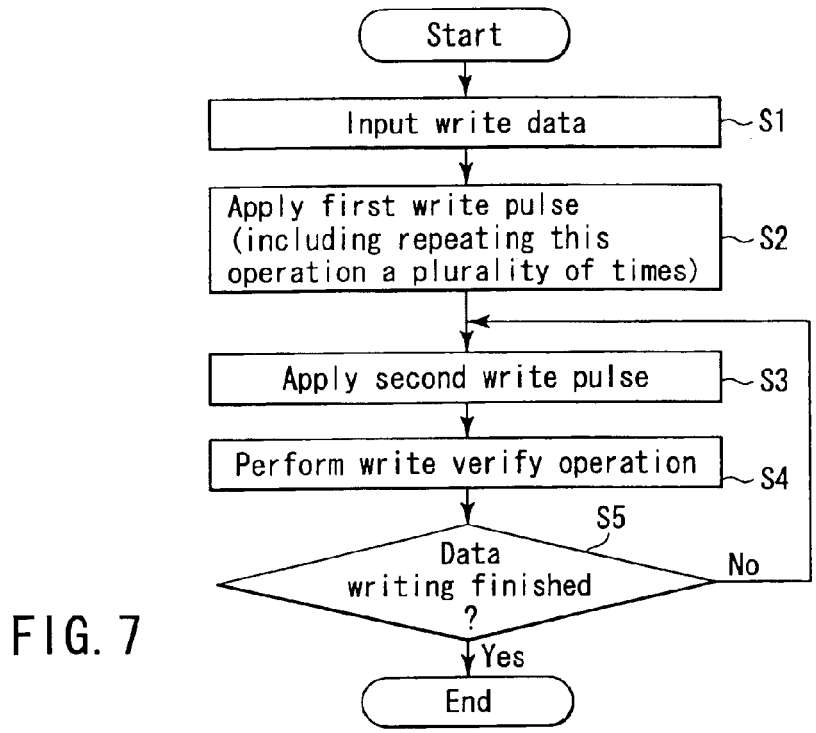
FIG. 7 is a flowchart for write sequence in the first embodiment.

FIG. 7 shows a write sequence. When write data is inputted in step S1, write control in step S2 to step S5 are performed automatically in the chip. In a first write pulse voltage applying operation (step S2), the data is written with a weak write electric field in such a manner that a write end decision voltage (or verify voltage) Vverify has not been exceeded. Thus, in the write operation, a verify read operation is not carried out. After the first write pulse applying operation (S2), a second write pulse voltage applying operation (step S3) is carried out. After the second write pulse voltage applying operation (S3), a verify read operation to determine the threshold is carried out (step S4), thereby determining whether all of the memory cells have been written into using the verify voltage Vverify (step S5). If any one of the memory cells has not been written into, the write pulse applying operation (S3) and the verify read operation (S4) are repeated until it has been written into.

FIG. 6 shows write pulses and the timing of a verify read operation. In a first write operation, a pulse with a write start voltage of Vpgm0' [V] is applied and thereafter the write operation is repeated n times (n≧1) with the voltage raised in steps of a step-up voltage of ΔVpgm1 (=ΔVth(pgm1)). FIG. 6 shows the case of n=1 at which the first write operation is the simplest. After the first write operation is completed, all of the memory cells are such that their thresholds have not reached the write end decision voltage Vverify yet and a verify operation is not required, as described above.

Next, the step-up voltage is set to ΔVpgm2 (>ΔVpgm1) and a second write operation is started. In the second write operation, a verify read operation is carried out after a write pulse voltage is applied. After the verify read operation, if the desired threshold voltage has been reached, the write operation is ended. If the desired threshold voltage has not been reached, the write pulse voltage is further stepped up by ΔVpgm2 and the same operation is repeated.

Figure 8:
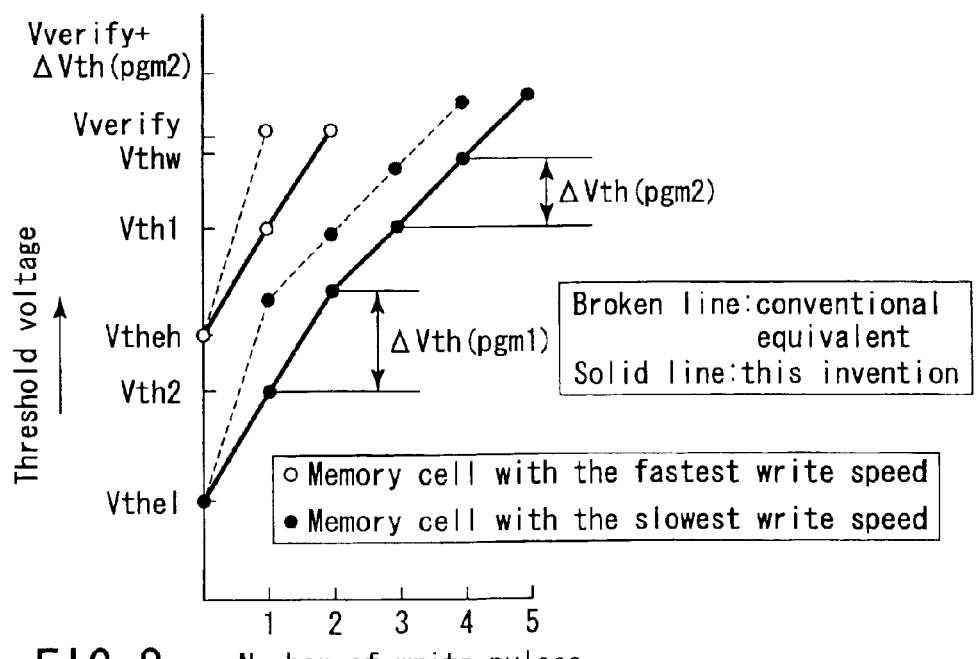
FIG. 8 is a characteristic diagram showing the relationship between the number of write pulses and the change of the threshold in a memory cell in the first embodiment.
Figure 9:
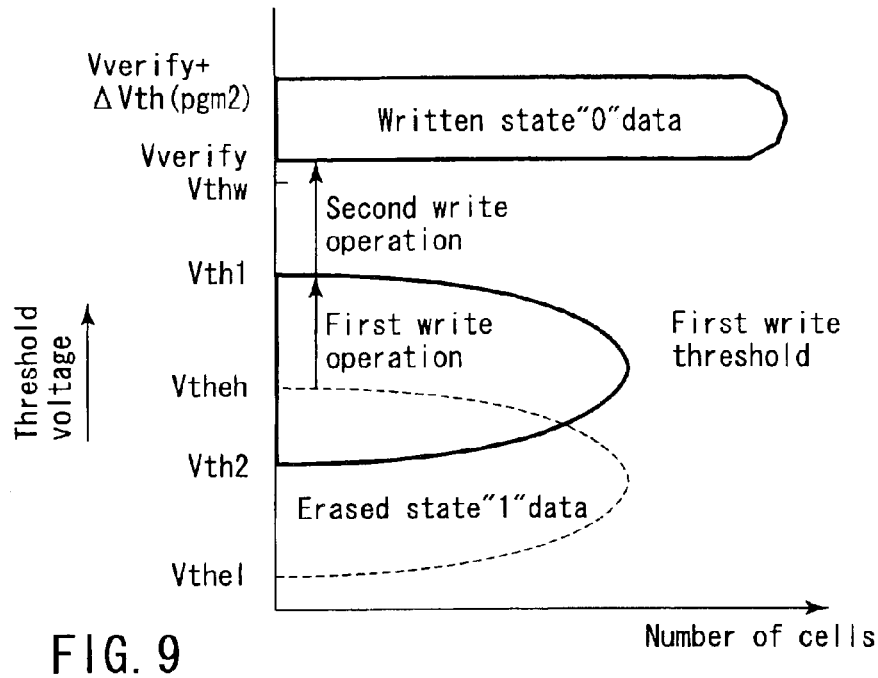
FIG. 9 shows a change in the threshold distribution in writing data into a memory cell in the first embodiment.

In FIG. 8, a solid line shows the change of the threshold voltage in a step-up write operation in the first embodiment and a broken line shows a case in the prior art. The cell with the fastest write speed represented by a white circle has an erase threshold upper limit of Vtheh as the initial erase threshold and the cell with the slowest write speed represented by a black circle has an erase threshold lower limit value of Vthel as the initial erase threshold. Even if the initial threshold and the write speed are independent factors, the same reasoning holds because the condition is the worst one that will probably happen. Since a verify read operation is not carried out in the first write operation as described above, the time required to make a write end verify determination can be reduced.

The first write pulse voltage in the second write operation is set to Vpgm0, the first write pulse voltage in the first write operation is set to Vpgm0', and the initial voltage Vpgm0' is set in the range equal to or higher than 5V and equal to or lower than 20V. Specifically, taking the threshold distribution of FIG. 9 into account, when n=1, ΔVth(pgm1) is set to a voltage fulfilling the expression (Vverify−Vtheh)/2≦ΔVth (pgm1)≦(Verify+ΔVth(pgm2)−Vtheh)/2, and Vpgm0'= Vpgm0−ΔVth(pgm1) holds. The threshold voltage of the memory cell written into the earliest with the first write pulse is Vth1=Vtheh+ΔVth(pgm1) and the threshold voltage of the memory cell written into the latest is Vth2=Vthel+ΔVth (pgm1), which produces a distribution shown in FIG. 9.

Next, a second write pulse is applied. Since the increment of the second pulse voltage with respect to the first write pulse voltage is ΔVth(pgm1), the threshold voltage of the memory cell written into the earliest with the second write pulse is Vth1=Vtheh+2×ΔVth(pgm1), which lies in the range from Vverify and (Vverify+ΔVth(pgm2)). This completes the write operation. On the other hand, the threshold voltage of the memory cell written into the latest is Vthel+ 2×ΔVth(pgm1), which is equal to the threshold when the first pulse is applied as explained in the prior art.

Thereafter, a step-up voltage obtained by raising the preceding pulse by ΔVpgm2 (=ΔVth(pgm2), is applied, thereby carrying out a verify operation so as to place the write threshold voltage between Vverify and Vverify+ΔVth (pgm2). To realize the same threshold distribution as that in the prior art, setting is done to meet the equation ΔVth (pgm2)=ΔVth(pgm).

In the memory cell written into the latest in FIG. 8, if the total capacitance viewed from the charge accumulation layer is Ctot and the capacitance between the charge accumulation layer and the control gate electrode is C1, the tunnel insulating film electric field when the first write pulse is applied to the memory cell written into the latest in FIG. 8 is expressed by the following equation in the worst case:

$$\{(Vpgm0'-Vthel)+(Vth-V_{FB})\}\times(C1/Ctot)/tox\{(Vpgm0-\Delta Vth- (pgm1)-Vthel)+(Vth-V_{FB})\}\times(C1/Ctot)/tox$$

Figure 3:
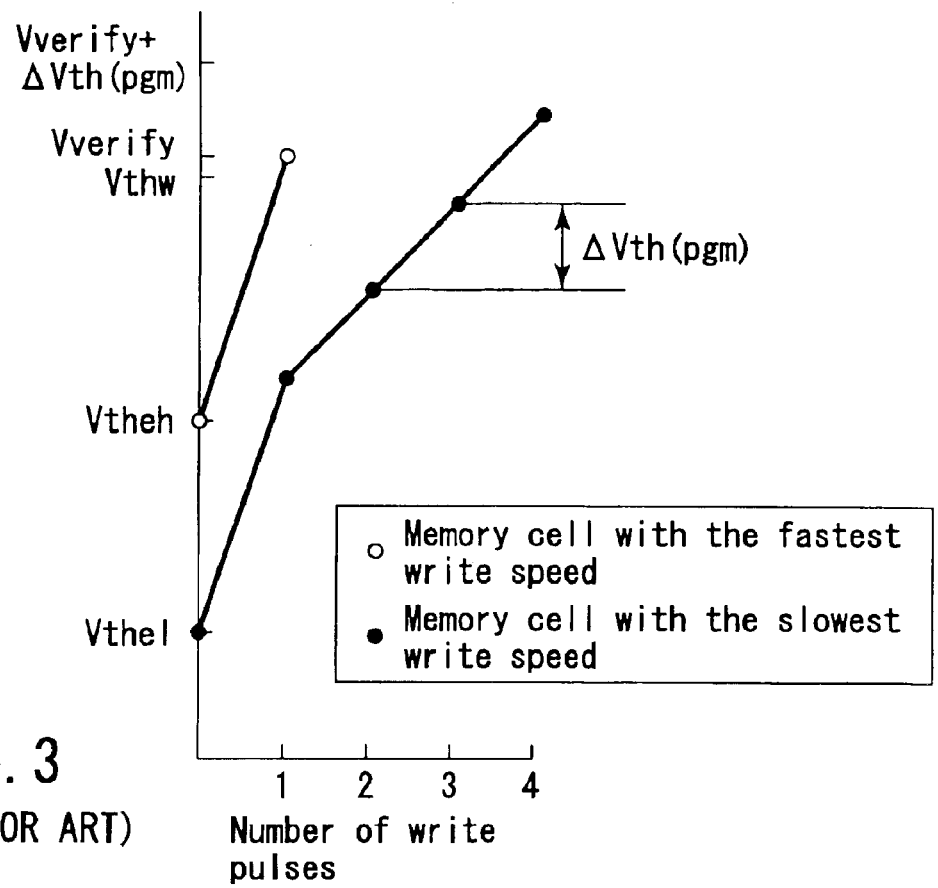
FIG. 3 is a characteristic diagram showing the relationship between the number of write pulses and the change of the threshold in a floating-gate memory cell.
Figure 4:
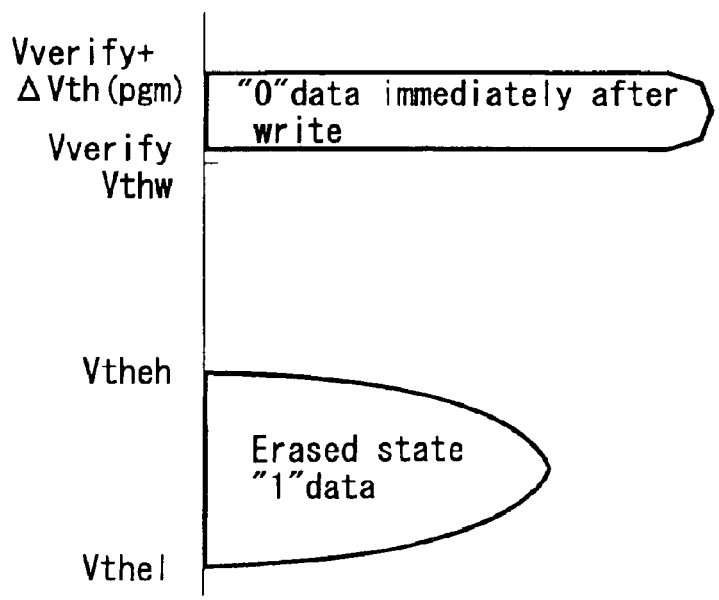
FIG. 4 shows a data threshold distribution in a floating-gate memory cell.

In the case of FIG. 3, the tunnel insulating film electric field is smaller than the electric field $\{(Vpgm0-Vthel)+ (Vth-V_{FB})\}\times(C1/Ctot)/tox$ by $\Delta Vth(pgm1)\times(C1/Ctot)/tox$.

On the other hand, the tunnel insulating film electric field when the second write pulse is applied to the memory cell written into the latest is expressed by the following equation in the worst case:

$$\{(Vpgm0'+\Delta Vth(pgm1)-(Vthel+\Delta Vth(pgm1)+(Vth-V_{FB})\times(C1/Ctot)/ tox=\{(Vpgm0-\Delta Vth(pgm1)-Vthel)+(Vth-V_{FB})\}\times(C1/Ctot)/tox$$

That is, the tunnel insulating film electric field caused by the application of the second write pulse is equal to that by the application of the first write pulse. Therefore, in the application of any of the first and second write pulse, the tunnel insulating film electric field is smaller than the electric field $\{(Vpgm0-Vthel)+(Vth-V_{FB})\}\times(C1/Ctot)/tox$ by $\Delta Vth(pgm1)\times(C1/Ctot)/tox$. Therefore, dielectric breakdown of the tunnel insulating film caused by the stress electric field, or an increase in the interface level or in the fixed charge trap, are suppressed more than in the prior art. This alleviates the deterioration of the charge retention characteristic and reduces a shift in the threshold voltage after writing and erasing are done repeatedly, which therefore increases the reliability.

As comparative example 1, consider a case where as many write pulses as those in the first embodiment are applied, with $\Delta Vth(pgm1)=\Delta Vth(pgm2)$. In comparative example 1, the tunnel insulating film electric field when a first write pulse is applied is $(Vpgm0-Vth(pgm2)-Vthel) \times (C1/Ctot)/tox$ in the worst case. This means that, when $\Delta Vth(pgm1)>\Delta Vth(pgm2)$, the electric field applied to the tunnel insulating film increases as compared with the first embodiment. In the first embodiment, the electric field applied to the tunnel insulating film of the memory cell written into the latest in the first application of a write pulse is made equal to that in the second application of a write pulse. Therefore, the first embodiment improves the reliability more than the comparative example. In this case, because the write pulse application cumulative time in the comparative example is the same as that in the first embodiment, there is no increase in the write time. Since the effect of increasing the reliability has been a new effect newly achieved by the inventors of this invention, it will be explained in detail later.

The step-up voltage $\Delta Vpgm2$ in the second write operation must be lower than the step-up voltage $\Delta Vpgm1$ in the first write operation, as described earlier. For example, the step-up voltage $\Delta Vpgm2$ is a voltage equal to or higher than 0.1V and equal to or lower than 2V. In the second write operation, when a third write pulse is applied to the memory cell written into the latest, the electric field of the tunnel insulating film is expressed by the following equation in the worst case:

$$\{(Vpgm0+\Delta Vth(pgm2)-(Vthel+2\times\Delta Vth(pgm1))+(Vth-V_{FB}))\times(C1/Ctot)/tox=\{(Vpgm0-\Delta Vth(pgm1)-Vthel)+(\Delta Vth(pgm2)-\Delta Vth(pgm1))+(Vth-V_{FB})\}\times(C1/Ctot)/tox$$

Thus, if the expression $\Delta Vth(pgm2)<\Delta Vth(pgm1)$ is met, the tunnel insulating film electric field in the third application of a write pulse can be made smaller than that in the first or second application of a write pulse, which prevents the tunnel insulating film from deteriorating as compared with the first and second write pulses.

[Modification 1 of First Embodiment]

The case where a write pulse is applied only once in the first write operation has been explained. Next, a case where a pulse with a write start voltage of $Vpgm0'$ [V] is applied in the first write operation and thereafter a write operation is repeated a plurality of times (n>1) with a voltage raised in steps of the step-up voltage $\Delta Vpgm1$ will be explained.

Figure 10:
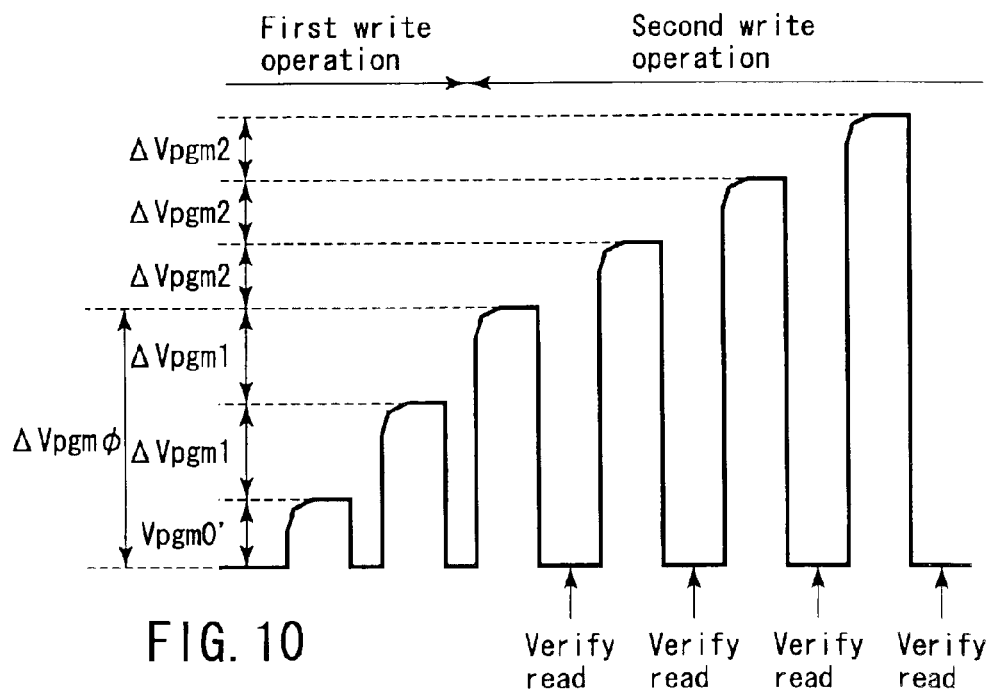
FIG. 10 shows a write operation waveform in a modification of the first embodiment.
Figure 11:
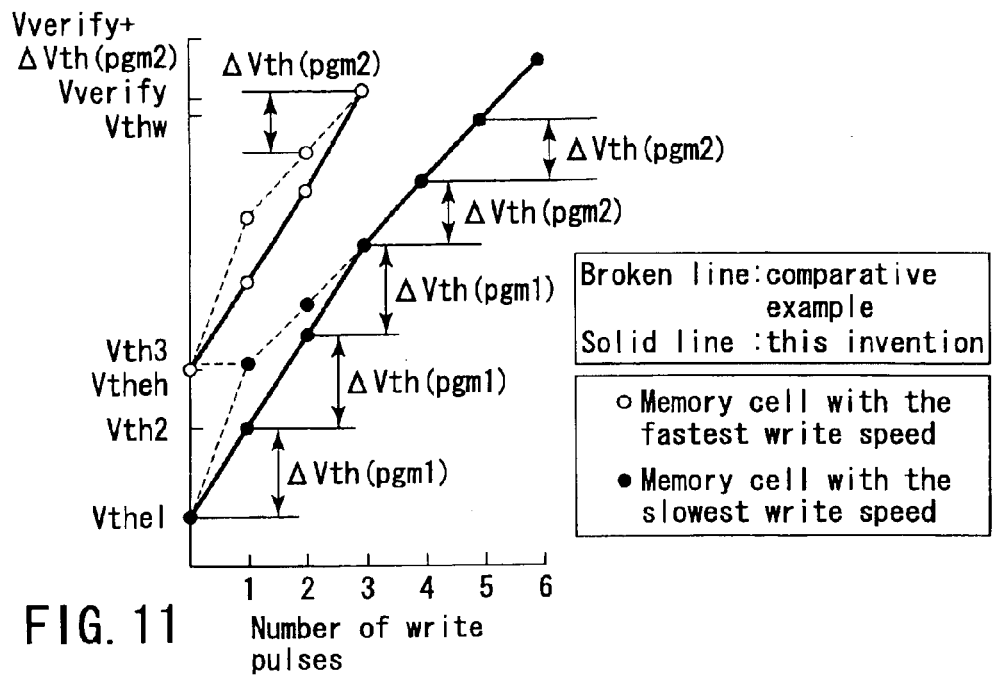
FIG. 11 is a characteristic diagram showing the relationship between the number of write pulses and the change of the threshold in a memory cell in a modification of the first embodiment, together with a comparative example.

FIGS. 10 and 11 correspond to FIGS. 6 and 8, respectively. A broken line in FIG. 11 shows the case of the comparative example ($\Delta Vth(pgm1)=\Delta Vth(pgm2)$).

As shown in FIG. 10, in modification 1, two write pulses are applied in the first write operation. During and after the first write operation, the thresholds voltages of all of the memory cells have not reached the write end decision voltage Vverify and therefore a verify operation is not needed. By doing this, the time required to make a write end verify determination can be reduced further. Here, when n>1, $\Delta Vth(pgm1)$ is determined so as to satisfy the expression $(Vverify-Vtheh)/(n+1) \leq -\Delta Vth(pgm1) \leq (Vverify+\Delta Vth(pgm2)-Vtheh)/(n+1)$ and the expression $\Delta Vth(pgm2)<\Delta Vth(pgm1)$.

It is assumed that the first write pulse voltage in the second write operation is $Vpgm0$ and the first write pulse voltage in the first write operation is $Vpgm0'$ where $Vpgm0'=Vpgm0-n\times\Delta Vth(pgm1)$. The threshold voltage of the memory cell written into the earliest with the first write pulse is $Vtheh+\Delta Vth(pgm1)$. The threshold value of the memory cell written into the latest with the first write pulse is $Vth2=Vthel+\Delta Vth(pgm1)$. As a result, a threshold distribution shown in FIG. 11 is obtained.

Next, a second write pulse is applied. An increment of the second write pulse with respect to the first write pulse is assumed to be $\Delta Vth(pgm1)$. Consequently, the threshold voltage of the memory cell written into the earliest with the second write pulse is $Vtheh+2\times\Delta Vth(pgm1)$. The threshold value of the memory cell written into the latest with the second write pulse is $Vth2=Vthel+2\times\Delta Vth(pgm1)$. Up to now, it is apparent that all of the threshold voltages of the memory cells are smaller than Vverify. Therefore, a verify operation is not needed.

Furthermore, a third write pulse is applied. An increment of the third write pulse with respect to the second write pulse is also assumed to be $\Delta Vth(pgm1)$. Consequently, the threshold voltage of the memory cell written into the earliest with the third write pulse is $Vth1=Vtheh+3\times\Delta Vth(pgm1)$, which is in the range of Vverify to $[Vverify+\Delta Vth(pgm2)]$. Then, the write operation is ended. On the other hand, the threshold of the memory cell written into the latest with the third write pulse is $Vth2=Vthel+3\times\Delta Vth(pgm1)$, which is equal to the threshold when the first write pulse is applied as explained in the prior art.

Thereafter, a second write operation is started. A verify operation is carried out by applying a write pulse voltage in steps of the step-up voltage $\Delta Vpgm2$ ($=\Delta Vth(pgm2)$) higher than in the first write operation in such a manner the write threshold voltage lies between Vverify and $Vverify+\Delta Vth(pgm2)$. To realize the same write threshold distribution as that in the prior art, setting is done to satisfy $\Delta Vth(pgm2)=\Delta Vth(pgm)$.

In the modification, the tunnel insulating film electric field when the first write pulse is applied to the memory cell written into the latest in FIG. 11 is expressed by the following expression in the worst case:

$$\{(Vpgm0'-Vthel)+(Vth-V_{FB})\}\times(C1/Ctot)/tox=\{(Vpgm0-n\times\Delta Vth(pgm1)-Vthel)+(Vth-V_{FB})\}(C1/Ctot)/tox$$

This is smaller than the electric field $\{(Vpgm0-Vthel)+(Vth-VFB)\}\times(C1/Ctot)/tox$ in FIG. 3 by $n\times\Delta Vth(pgm1)\times(C1/Ctot)/tox$.

On the other hand, the tunnel insulating film electric field when the second and later write pulses are applied to the memory cell written into the latest in the first write operation is expressed by the following expression in the worst case:

$$\{(Vpgm0-n\times\Delta Vth(pgm1)-Vthel)+(Vth-V_{FB})\}\times(C1/Ctot)/tox$$

That is, the tunnel insulating film electric field is equal to that caused by the first write pulse. As a result, in the first write operation, the tunnel insulating film electric field is smaller than the electric field $\{(Vpgm0-Vthel)+(Vth-V_{FB})\}\times(C1/Ctot)/tox$ in FIG. 3 by $n\times\Delta Vth(pgm1)\times(C1/Ctot)/tox$ in any pulse application.

Therefore, a dielectric breakdown of the tunnel insulating film caused by the stress electric field or an increase in the interface level or in the fixed charge trap are suppressed more than in the prior art. This alleviates the deterioration of the charge retention characteristic and reduces a shift in the threshold value after writing and erasing are done repeatedly, which therefore increases the reliability. Furthermore, when n>1, the electric field applied to the tunnel insulating film is decreased by $[n/(n+1)]\times(C1/Ctot)/tox$ as compared with when n=1, which improves the reliability further.

In FIG. 11, a broken line shows comparative example 2 of applying as many write pulses as in the modification assumed to be ΔVth(pgm1)=ΔVth(pgm2). In this comparative example, the tunnel insulating film electric field when the first write pulse is applied is expressed as (Vpgm0−2×ΔVth(pgm2)−Vthel)×(C1/Ctot)/tox in the worst case. When ΔVth(pgm1)>ΔVth(pgm2), the electric field applied to the tunnel insulating film increases as compared with the modification. This can be seen from the fact that the threshold value shift from a write pulse being 0 to a write pulse being 1 in FIG. 11 in comparative example 2 (represented by a broken line) is larger than that in the modification (represented by a solid line). In this modification, the tunnel insulating film electric field of the memory cell written into the latest in the first application of a write pulse is made equal to that in the second application of a write pulse. Consequently, writing is done at the same speed as in comparative example 2, which improves the reliability further.

The reason why the reliability is improved in the embodiment found by the inventor of this invention will be explained in detail below.

The inventor examined the relationship between the write voltage and the number of possible rewrite operations in a MONOS memory cell using a charge accumulation insulating film, paying attention to an increase in the interface level of the interface between the semiconductor substrate and the tunnel oxide film. In a memory cell using a charge accumulation insulating film, electrons are injected into the insulating film in a write operation and holes are injected into the insulating film in an erase operation. In the prior art, the total amount of holes injected was considered to be the possible cause of an increase in the surface level as described in reference 1. The inventor examined the dependence on the write condition in a write operation where electrons are injected.

Figure 12:
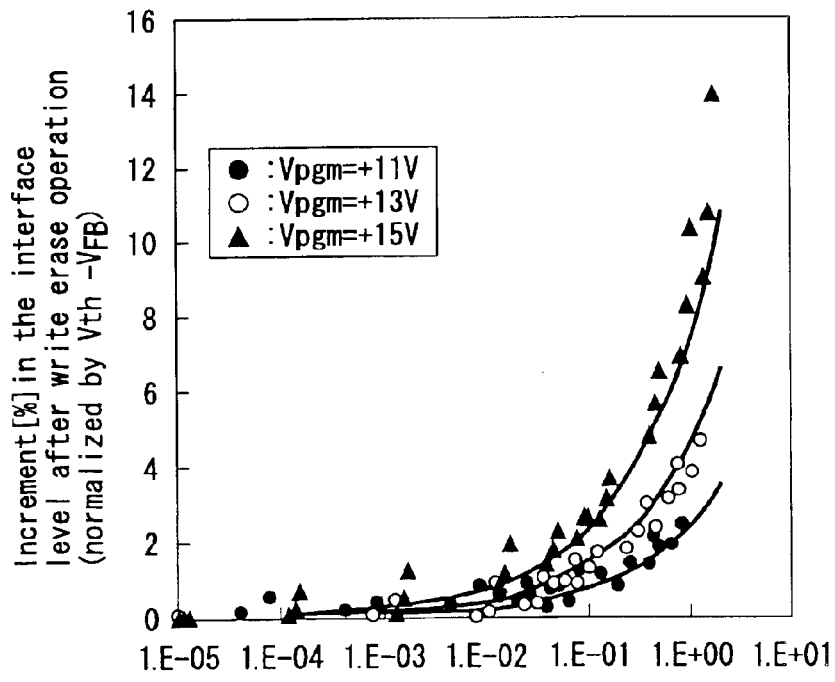
FIG. 12 is a characteristic diagram showing the relationship between the injection of holes from the bottom oxide film and an increase in the interface level in a MONOS memory cell.

FIG. 12 shows the data obtained by the inventor, with the abscissa axis representing the total amount of charges injected into the charge accumulation layer and the ordinate axis representing an increase in the interface level after writing and erasing are alternated repeatedly (after the endurance test). The abscissa axis shows the cumulative amount of charges injected into the charge accumulation layer. The coincidence of the abscissa axis with another means that the product Qp of the amount of the injected charges in one round of write and erase operations multiplied by the number of repetitions is the same. The ordinate axis represents, in percent, (Vth−$V_{FB}$) normalized after the endurance by using the difference between the threshold voltage Vth with no accumulated charge before the repetition of write and erase operations and the flat band voltage $V_{FB}$.

In the figure, a black circle (●), a white circle (○), and a triangle (▲) represent cases where writing was done with Vpgm=11, 13, and 15 [V], respectively, while the erase voltage and the conditions were unchanged. In FIG. 12, the sample points show that the write voltage and the number of write and erase operations differ in the same structure shown in the embodiment. The tunnel insulating film was equal to or less than 4 nm, specifically as thick as lies in the range of 2 nm to 3 nm, which is a thickness that allows holes to be injected from the semiconductor substrate into the charge accumulation layer by the tunnel effect.

As seen from FIG. 12, use of the write voltage as a parameter enables an increase in the interface level to be expressed as a uniform function of Qp, without depending on the number of repetitions, the charge injection cumulative time, the amount of injected charges per round of write and erase operations. From the results, the inventors discovered that the interface level increases as the write voltage rises, even when the total amount Qp of the injected charges remains unchanged, and that the results differ from the results explained in reference 1.

Figure 13:
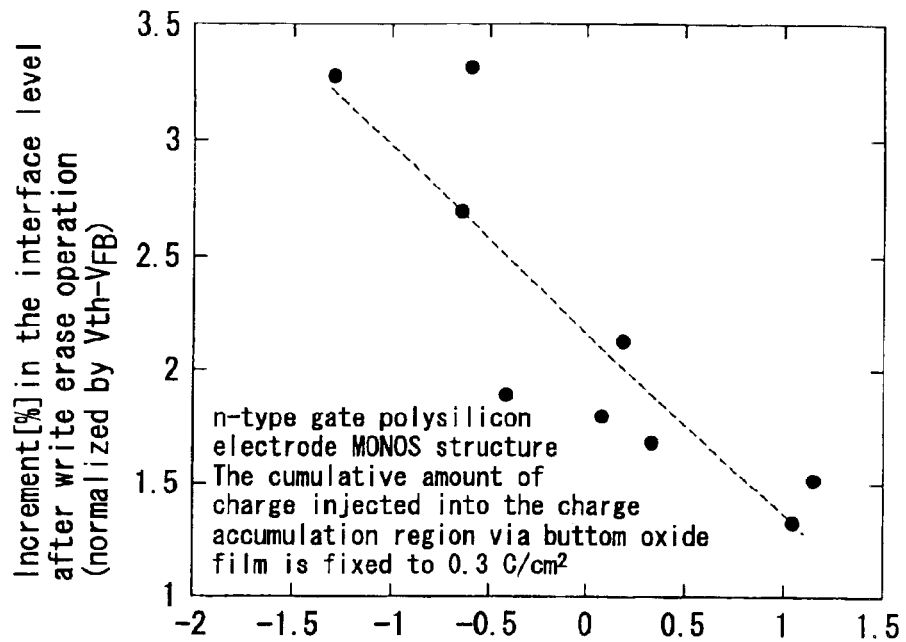
FIG. 13 is a characteristic diagram showing the relationship between the flat band voltage after erasing and an increase in the interface level in a MONOS memory cell.

FIG. 13 shows the relationship between the flat band voltage $V_{FB}$ after an erase operation and an increase in the interface level after the endurance test, in a case where the erase voltage condition and the erase pulse width condition are changed. The data shown in FIG. 13 was obtained by the inventor from experiments. In FIG. 13, the cumulative amount of charge of positive charges injected into the charge accumulation layer was fixed to 0.3 C/cm$^2$. With the write condition being fixed, the erase voltage condition and the pulse width condition were changed. The structure used for measurement was a MONOS structure using an n-type polysilicon gate electrode as a control electrode. The flat band voltage in the state where no charge was accumulated was in the range of −0.5V to −1V.

As seen from the result shown FIG. 13, the increase in the interface level decreases more as the flat band voltage rises after an erase operation, even when the flat band voltage after erasure is equal to or higher than −0.5V, that is, even in a state where no holes are accumulated in the erase operation. The dotted line in FIG. 13 represents a linear regression line obtained by the method of linear squares. However, a large change in the inclination of the increase in the interface level cannot be seen at about a flat band voltage of −0.5V after erasure. Therefore, with a model where the interface level is formed as a result of the holes in the charge accumulation layer flowing into the semiconductor substrate, the generation of the interface level in the present device cannot be explained comprehensively. This was what was discovered by the present inventors.

From the data in FIGS. 12 and 13, the inventors found that an increase in the interface level is a function of the total amount Qp of injected charges and the tunnel insulating film electric field Eox caused by the write pulse applied after erasure, which expresses an increase in the interface level uniquely. In qualitative terms, even when the total amount Qp of injected charges is the same, an increase in the interface level decreases more as the tunnel oxide film electric field Eox caused by the write pulse applied after erasure is smaller.

Specifically, it was found from FIG. 12 that, with the same total amount Qp of injected charges, when the voltage of the write pulse applied after erasure dropped by 1V, this corresponded to the fact that the maximum electric field of the tunnel oxide film dropped by 0.75 [MV/cm] and the increase in the interface level decreased to $\frac{1}{1.3}$ of the original one. On the other hand, it was found that, when a comparison was made with the same increase in the interface level, a drop of 1V in the maximum voltage of the write pulse applied after erasure corresponded to a drop of 0.75 [MV/cm] in the maximum electric field of the tunnel oxide film and increased the Qp to about 1.7 times the original one. The increase in the interface level is determined by Qp and Eox, not by the charge injection cumulative time. Consequently, as compared with a conventional equivalent, there is no additional increase in the interface level in the first embodiment whose charge injection cumulative time differs from that in the conventional equivalent. This was a discovery.

As described in detail in the explanation of the tunnel oxide film electric field, when the write voltage is constant, the electric field applied to the tunnel oxide film is greater as the threshold value immediately before a write operation is smaller. That is, the threshold voltage Vth before a write operation is low, the voltage applied to the tunnel oxide film becomes the highest. Consequently, as in the first embodiment, making the write start voltage lower lowers the electric field applied to the tunnel oxide film. This makes it possible to increase the number of possible rewrite operations without degrading a threshold value margin for data collapse. Moreover, raising the write applied voltage gradually makes a write operation faster.

As described above, when an insulating film composed of, for example, a silicon nitride film is used as the charge accumulation layer, use of the first embodiment produces a first effect of improving the memory cells.

A second effect of the first embodiment is that a faster write operation is compatible with a narrow threshold distribution, or high reliability. In the first embodiment, the step-up voltage $\Delta$Vpgm1 in the first write operation and the step-up voltage $\Delta$Vpgm2 in the second write operation are set so as to fulfill the expression $\Delta$Vpgm1>$\Delta$Vpgm2. Since $\Delta$Vpgm1 is set larger at the beginning of a write operation, a variation in the threshold is large, which enables a sufficiently high-speed write characteristic to be realized. In the middle of the write operation, the step-up voltage decreases to $\Delta$Vpgm2, with the result that the maximum threshold of a memory cell written into with a voltage higher than the verify voltage becomes Vverify+$\Delta$Vth(pgm2). Furthermore, it is lower than the maximum write threshold value Vverify+$\Delta$Vth(pgm1) when the step-up voltage is not switched, with the result that the write threshold distribution width becomes narrower.

Therefore, this alleviates the following problem: the number of charges injected to the memory cells written into with a high threshold voltage becomes larger, decreasing the reliability in rewriting data repeatedly. As a result of overcoming the above problem, high reliability is realized. Furthermore, in a read operation in a NAND EEPROM, the voltage Vread applied to the gate electrode of an unselected memory cell can be made lower. This makes it possible to alleviate a variation in the threshold voltage caused by Vread stress.

A third effect of the first embodiment is that a write operation can be carried out faster because a verify operation is not carried out during the first write operation. For example, it is assumed that the write pulse application time is 20 μs and the verify read time is 20 μs and that the number of write operations in the first write operation is 5 and the number of write operations in the second operation is 5. Then, the total write operation time is 20 μs×5+(20 μs+20 μs)×5=300 μs. This is shorter than the total write time (20 μs+20 μs)×10=400 μs in carrying out a verify operation during the first write operation.

To shorten the write time, it is desirable that the number of write operations in the first write operation be made larger and the number of write operations in the second write operation be made smaller. That is, it is desirable that writing be done in the first write operation in such a manner that a threshold voltage as close to the verify voltage as possible is reached. On the other hand, if writing is done by applying a pulse a plurality of times without carrying out a verify operation, there is a strong possibility that abnormal cells written into excessively will appear. Such abnormal cells are considered to be attributable to local defects in the tunnel oxide film.

To avoid such a problem, it is desirable to use an insulating film as the charge accumulation layer. With the charge accumulation layer composed of an insulating film, even if there is a local defect in the tunnel oxide film, a large number of electrons are not injected through the defect, which prevents abnormal cells written into excessively from appearing. Therefore, since writing can be done close to the verify voltage in the first write operation where a verify read operation is not carried out, the second write operation can be shortened, which enables the write time to be shortened on the whole.

[Another Modification of First Embodiment]

Figure 14:
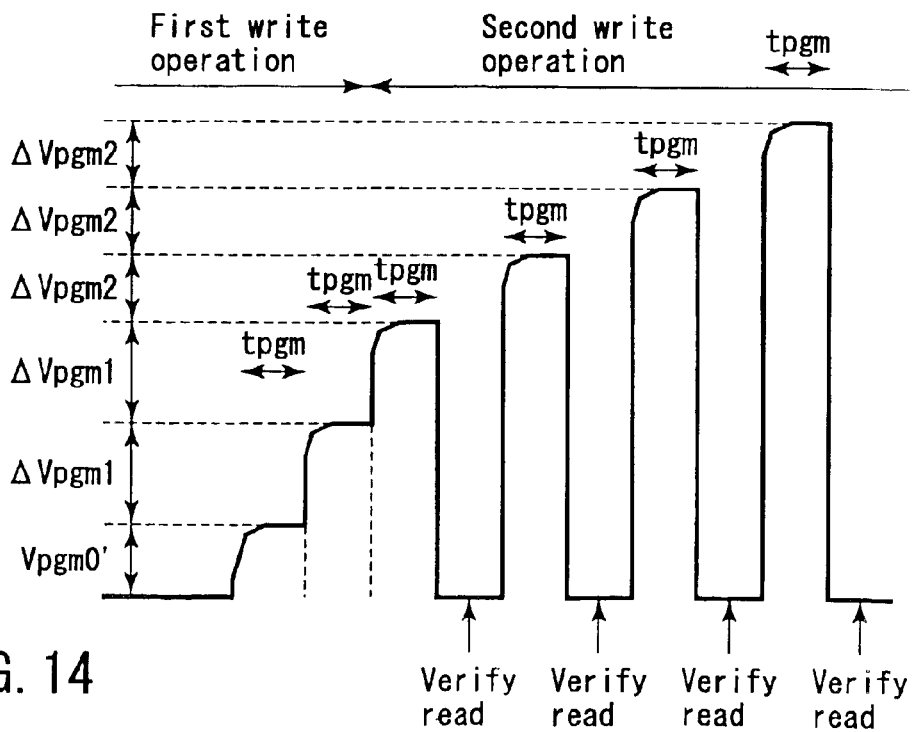
FIG. 14 shows a write operation waveform in a second modification of the first embodiment.
Figure 15:
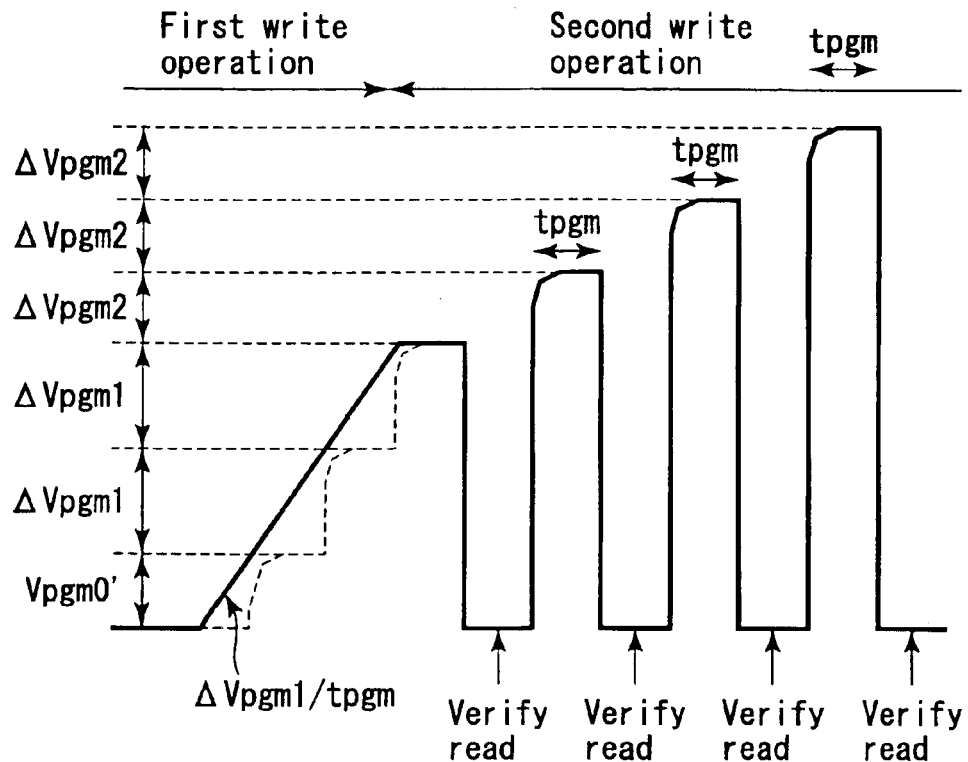
FIG. 15 shows a write operation waveform in a third modification of the first embodiment.

FIGS. 14 and 15 show pulse waveforms in modification 2 and modification 3 of the first embodiment, respectively. In modification 2 of FIG. 14, a write pulse in the first write operation is a stepwise pulse stepped up continuously, not a discrete pulse with an idle time as in modification 1. Since a verify read operation is not needed in the first write operation, such an operation can be carried out. In modification 2, the write time of the first write operation can be shortened. Furthermore, to step up the pulse voltage continuously, the voltage has only to be made higher than the preceding pulse voltage by $\Delta$Vpgm1. It is not necessary to raise the pulse voltage from the ground potential GND as in a verify operation. Therefore, as shown in FIG. 14, the write pulse voltage can be made more stable than in the second write operation. In addition, the load on the step-up circuit that generates a write pulse voltage can be decreased, which leads to a reduction in the occupied area of the step-up circuit.

In modification 3 of FIG. 15, a write pulse in the first write operation is a triangular pulse stepped up linearly, not a discrete pulse. In this case, if the write pulse width in the second write operation is tpgm, the rate of increase in the triangular write pulse voltage is expressed as ($\Delta$Vpgm1/tpgm). In this modification, too, the program time in the first write operation can be shortened. Furthermore, to step up the pulse voltage continuously in the first write operation, the pulse voltage has only to be stepped up continuously at a low change rate of ($\Delta$Vpgm1/tpgm), which makes the pulse voltage more stable than in modification 2. In addition, the load on the step-up circuit can be made smaller and therefore the occupied area of the step-up circuit can be reduced.

In the first embodiment, when the write pulse width in the first write operation is made equal to the write pulse width in the second write operation, the time constant of the pulse width control circuit in the write voltage generator circuit can be made constant. This is preferable to simplifying the circuit. However, the step-up voltage of the write pulse voltage in the first write operation may be made equal to that in the second write operation and the write pulse width in the first write operation may be made greater than that in the second write operation. This configuration produces the same effect. That is, the amount of shift in the threshold in a write operation is calculated using equation (1) and the configuration is designed to meet the above-described condition so as to satisfy the expression $\Delta$Vth(pgm1)$\geq$$\Delta$Vth(pgm12). This produces the same effect.

As described in detail, use of the write pulse applying method in the first embodiment enables the increase in the interface level to be reduced more than in a conventional equivalent. This also enables the current flowing from the silicon nitride film via the interface level to be reduced, which improves the retention characteristic of the MONOS element. The interface level has been used as a quantitative parameter of reliability. This has its origin in the formation of a dangling bond and a change in the bond angle at the interface, which is well known physically. It is also possible to suppress the charge trap generation caused by a similar origin, which improves the reliability.

In the first embodiment, the charge accumulation layer is an insulating film. Therefore, when a MONOS memory cell where the accumulated charge distribution in the charge accumulation layer is non-uniform is used and the step-up writing method is applied, this makes it possible to realize a narrow write threshold distribution unobtainable in a floating-gate memory cell.

Furthermore, use of the write sequence of switching the step-up voltage of a write pulse in two stages enables high-speed writing and improves the reliability without degrading the threshold value margin.

Specifically, a verify read operation after the application of a write pulse voltage is not carried out in the first write operation and a verify read operation to determine a threshold voltage after the application of each write pulse voltage is carried out in the second write operation, which enables a high-speed write operation.

[Second Embodiment]

The effect of the first embodiment is not peculiar to the MONOS cell structure using an insulating film as a charge accumulation layer and is also expected even in a floating-gate cell structure with an ONO film intervening between a control gate electrode and a floating-gate electrode. The reason is that the ONO film has a stacked structure of a silicon oxide film, a silicon nitride film, and a silicon oxide film in that order and that the ONO film has the same stacked insulating film configuration as that of the stacked insulating film including the charge accumulation layer of a MONOS cell explained in the first embodiment.

When either the thickness of the upper oxide film of the ONO film or the thickness of the lower oxide film is decreased to 4 nm or less, an increase in the current flowing through the ONO film resulting from the injection of holes into the silicon nitride film is observed. This phenomenon has already been reported (reference 5: K. Kobayashi, H. Miyatake, J, Mitsuhashi, M. Hirayama, T. Higaki, H. Abe, VLSI Symp. Tech, Digest, pp. 119–120, 1990, see FIG. 3 in particular).

It is clear that, even in a floating-gate memory cell with an ONO film whose upper or lower oxide film is 4 nm or less in thickness, the injection of electrons or holes resulting from write and erase operations takes place at its ONO film as in the MONOS cell structure explained in the first embodiment. In an erase operation, the direction in which the voltage is applied to the ONO film is the opposite of that in a write operation. Therefore, when electrons and holes are injected into the upper and lower oxide films, it is important to secure reliability not only in a write operation shown in the first embodiment but also in an erase operation.

Figure 16:
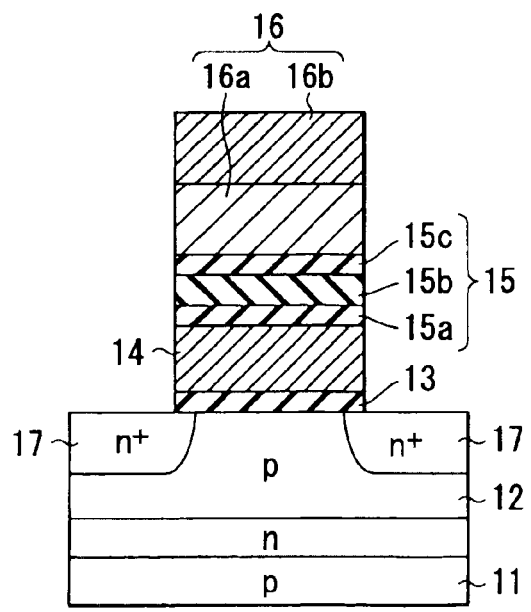
FIG. 16 is a sectional view of a floating gate memory cell according to a second embodiment of the present invention.

FIG. 16 is a sectional view of a memory cell with a floating-gate structure. On a semiconductor substrate 11, a p-type well 12 with, for example, a boron or indium impurity concentration of $10^{14}$ (cm$^{-3}$) to $10^{19}$ (cm$^{-3}$) is formed. In the p-type well 12, a tunnel insulating film 13 made of a silicon oxide film or silicon oxynitride film is formed to a thickness of about 3 to 15 nm.

On the tunnel insulating film 13, a floating gate 14 made of polysilicon to which, for example, phosphorus or arsenic has been added at a concentration of $10^{18}$ (cm$^{-3}$) to $10^{21}$ (cm$^{-3}$) is placed. On the floating gate 14, an interpoly insulating film (ONO film) 15 composed of a silicon oxide film 15a/a silicon nitride film 15b/a silicon oxide film 15c each of 1 nm to 10 nm thick is formed. On the interpoly insulating film (ONO film) 15, a control gate 16 with a stacked structure of polysilicon 16a and WSi (tungsten silicide) 16b is formed to a thickness of 10 nm to 500 nm. For example, phosphorus, arsenic, or boron is added to the polysilicon 16a at a concentration of $10^{17}$ (cm$^{-3}$) to $10^{21}$ (cm$^{-3}$). The control gate 16 may be only a polysilicon film.

The metal silicide may be NiSi, MoSi, TiSi, CoSi, or the like. In addition, the control gate 16 may be a control gate electrode composed of a stacked structure of polysilicon and a metal such as Al or W.

On both sides of the control gate electrode 16, n-type source-drain diffused layers 17 are formed. On both ends of the memory cell in the direction perpendicular to the surface of the figure, element isolating regions composed of an insulating film, such as a silicon oxide film, are formed in the silicon substrate to a depth of, for example, 10 to 500 nm.

The well, gate, and source-drain diffused regions, which are each connected to electrodes, can control voltages.

In the floating-gate cell shown in FIG. 16, a basic method of writing and erasing data is the same as explained in the prior art. It is particularly desirable that the write pulse duration tpgm be set so as to agree with the following equation (4), by making the same analysis of the ONO film as in equation (2):

$$tpgm \geq 6 \times [(\in ox\ Ctot)/(C1\alpha\beta)] \times \exp\{/Eox(0)\} \quad (4)$$

In the ONO film in the second embodiment, it is assumed that the captured charge centroid is at a place a distance tox in equivalent oxide film thickness, for example, the floating-gage electrode, the electric field in the lower oxide film of the ONO film is Eox, the capacitance between the captured charge centroid and the control gate electrode is C1, the sum of the capacitance between the captured charge centroid and the control gate and the capacitance of the floating gate and the captured charge centroid is Ctot, and the permittivity of the silicon oxide film is E OX. Here, it is assumed that the equivalent oxide film thickness of the lower oxide film of the ONO film is toxeq, the equivalent oxide film thickness of SiN is tNeq, the equivalent oxide film thickness of the upper oxide film is tboxeq, and electron and hole currents flow more through the lower oxide film than through the upper oxide film, and that toxeq<tboxeq holds. In this embodiment, in particular, ΔVpgm is defined as a step up voltage which is applied between the floating gate and the control gate, and ΔVth(pgm) is defined as a threshold voltage increase of the control gate in a condition that the floating gate potential is constant. Under these assumptions, the relationship between C1 and Ctot is expressed by the following equation:

$$C1/Ctot=1-(tNeq+tboxeq)/(toxeq+tNeq+tboxeq)$$

Furthermore, in the case of FN tunnel current when an Si gate electrode is used, $\alpha=3.2\times10^{-6}$ [A/V$^2$] and $\beta=2.4\times10^{10}$ [V/m] hold. Thus, for example, in the ONO film with toxeq=4 [nm], tNeq=5 [nm], and tboxeq=5 [nm], C1/Ctot= 0.286 holds. When Eox(0)≧10 [MV/cm], equation (4) is satisfied in the pulse duration range of tpgm≧2.0×10$^{-5}$ [s]. Accordingly, ΔVth(pgm) can be considered to be almost equal to ΔVpgm in a practical operation range using a write pulse duration of 20 μs or longer.

Similarly, when Eox(0)≧9 [MV/cm], equation (4) is satisfied in the pulse duration range of tpgm≧2.9×10$^{-4}$ [s]. These high Eox(0) conditions are, in particular, satisfied at top corners of the floating gate, because an increase of the electric field occurs at the corners. Accordingly, ΔVth(pgm) can be considered to be almost equal to ΔVpgm in a practical operation range using a write pulse duration of 0.4 ms or longer. In addition, an equation obtained by giving an offset for the inversion potential and the depletion layer charge to equation (1) holds in a write and an erase operation in the ONO film. Therefore, even if the write pulse duration tpgm takes any value, ΔVth(pgm) increases as ΔVpgm becomes larger, provided that the initial charge state is the same.

A method of applying a write pulse in the second embodiment is the same as those in the first embodiment and its modifications. It is clear that the upper limit of the electric field applied to the ONO film can be decreased, while keeping the time required to write data equal to that in a conventional equivalent, provided that the initial amount of charge in the floating gate and the ONO structure are the same as those of the conventional equivalent. Specifically, the potential of the part corresponding to Vchannel in the first embodiment is replaced with the potential of the floating gate electrode and the charge accumulation of the SiN film in the MONOS is replaced with the charge accumulation of the SiN film of the ONO film in the second embodiment. In particular, a program inhibit cell connected to Vpgm word line satisfies the condition that the floating gate potential is constant during the program operation. Consequently, the second embodiment similarly produces the effect of decreasing the interface level of the ONO film and therefore improving the reliability, the second effect, and the third effect explained in the first embodiment.

Furthermore, the second embodiment is characterized in that the ONO film satisfies the expression tboxeq<toxeq and particularly in that, when the film thickness tboxeq of the upper oxide film is 4 nm or less, electrons or holes are injected from the control gate electrode into the SiN film of the ONO film. In this case, by decreasing the maximum electric field under the condition that electrons are injected into the SiN of the ONO film, an increase in the interface level and the current flowing from the silicon nitride film via the interface level can be reduced.

The voltage conditions under which electrons are injected from the control gate electrode into the SiN film of the ONO film are required in erasing the data in memory cell.

Figure 17:
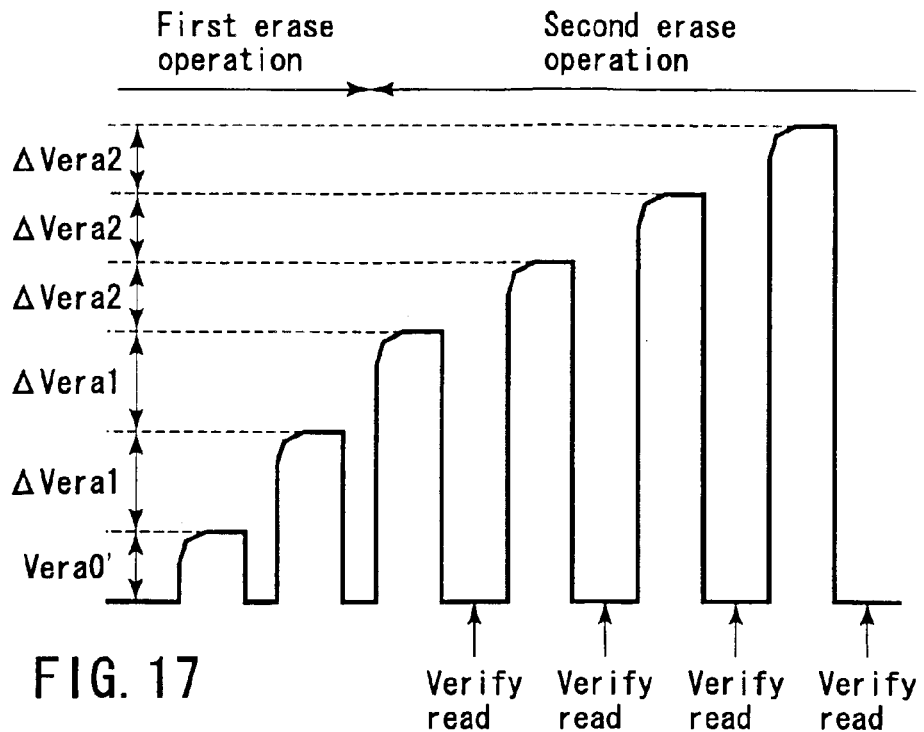
FIG. 17 shows an erase operation waveform according to the second embodiment.
Figure 18A:
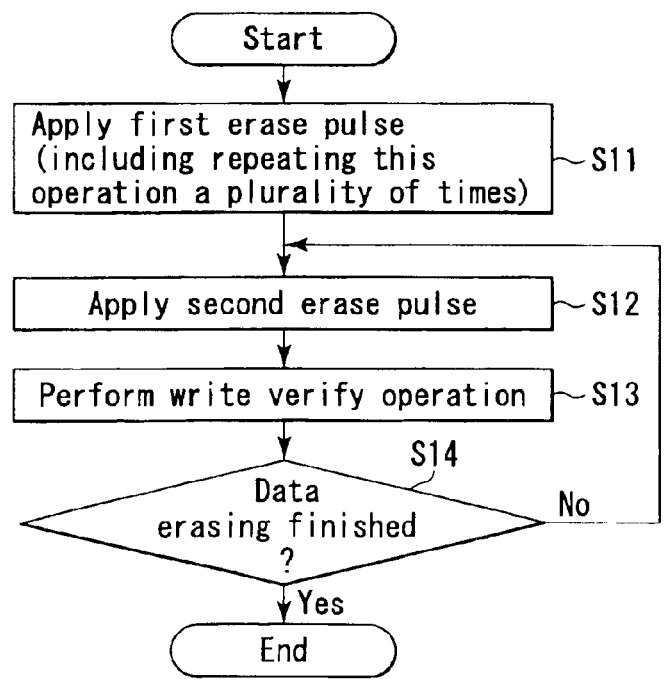
FIG. 18A is a flowchart for data erase sequence in the second embodiment.
Figure 19:
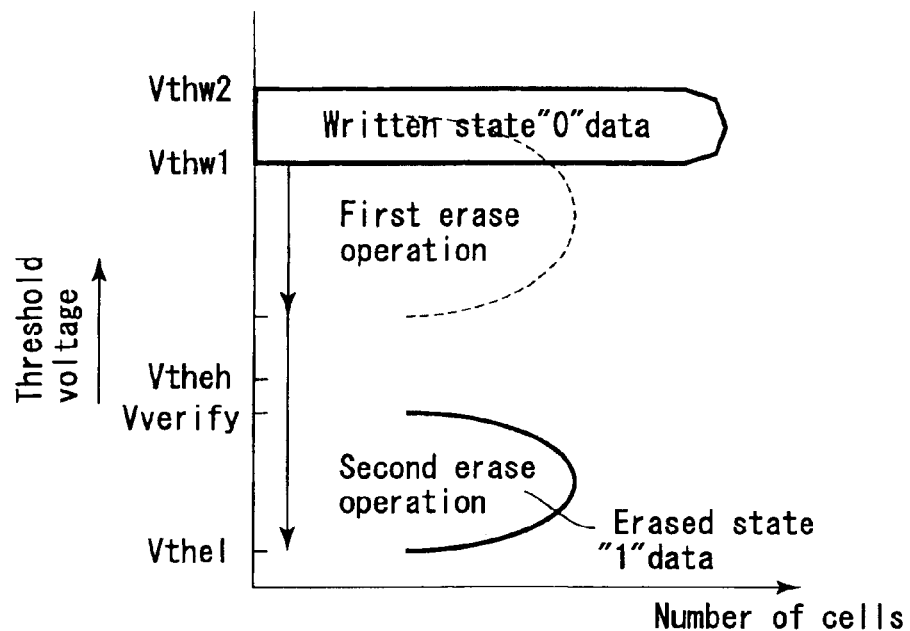
FIG. 19 is a diagram showing the change of the threshold distribution in erasing the data in a memory cell in the second embodiment.

FIGS. 17, 18A, and 19 show an erase and an erase verify read operation, erase sequence, and erase and write threshold distributions in the second embodiment, respectively.

To erase the data, the control gate voltage of a memory cell is set to 0V, the source and drain are brought into the floating state, and a high-voltage erase pulse is applied to a well in which, for example, a semiconductor substrate or a memory cell is formed. In this state, electrons are injected from the semiconductor substrate via a tunnel insulating film into a charge accumulation layer to shift the threshold voltage of Va of the memory cell in the negative direction, thereby erasing the data. Alternatively, a negative voltage may be applied to the gate and a positive voltage of Vb may be applied to either the source electrode or the drain electrode, thereby erasing the data. In this case, Va–Vb has to be an erase pulse voltage as shown in FIG. 17.

In the first erase operation, an erase pulse voltage acting as a start voltage of Vera0' (V) is applied as shown in FIG. 17. Thereafter, the erase operation is repeated n times (n≧1) with an erase pulse voltage increased in steps of the step-up voltage ΔVera1 (step S11). First, it is assumed that the threshold of the memory cell has been set in the range from Vthw1 as the lower limit to Vthw2 as the upper limit. Moreover, it is also assumed that the lower limit of the threshold of the memory cell in the second embodiment after an erase operation is Vtheл and the upper limit is Vtheh and that the verify voltage to check whether the erase operation has been completed is Vverify. Because of fluctuation in the charge retention characteristic of the cell, Vverify<Vtheh holds.

In the second embodiment, after the first erase operation has been completed, the threshold values of all of the memory cells have not reached the erase end decision voltage Vverify as shown in FIG. 19. therefore, a verify operation is not needed. As a result, the time required to make an erase end verify determination can be decreased.

After the first erase operation, to carry out the second erase operation, the step-up voltage is set to ΔVera2 (<ΔVera1) and an erase pulse is applied (step S12) and an erase verify read operation is carried out (step S13). Then, an erase end determination is made (step S14). The second erase operation is repeated until the end has been verified.

The voltage of the first erase pulse in the second erase operation is set to Vera0 and the voltage of the first erase pulse in the first erase operation is set to Vera0'. The initial voltage Vera0' is set in the range of 5V or higher to 20V or lower. Specifically, the absolute value of the amount of shift in the threshold after one pulse is applied in the first erase operation is ΔVth(era1) and the absolute value of the amount of shift in the threshold after one pulse is applied in the second erase operation is ΔVth(era1). Taking the threshold distribution of FIG. 19 into account, ΔVth(era1) is set to a voltage that satisfies the expression (Vthw1−Vverify)/(n+1) ≦ΔVth(era1)≦(Vthw1−Vverify+Vth(era2))/(n+1) and the equation Vera0'=Vera0−ΔVth(era1) is fulfilled.

The first erase pulse causes the threshold of the memory cell erased the earliest to be Vthw1−ΔVth(era1) and the threshold value of the memory cell erased the latest to be Vthw2−ΔVth(era1). As a result, a distribution shown in FIG. 19 is obtained, taking into account variations in the cells caused by erasure. Then, a second and a third erase pulse are applied. It is assumed that the increment in the second pulse with respect to the first erase pulse and the increment in the third pulse with respect to the second erase pulse are ΔVth(era1). Thus, the third pulse causes the threshold of the memory cell erased the earliest to be Vthw1−(n+1)×ΔVth(era1). Because this threshold value is in the range of Vverify and Vthel, the erase operation is completed. On the other hand, the third pulse causes the threshold value of the memory cell erased the latest to be Vthw2−(n+1)×ΔVth(era1).

Thereafter, a step-up voltage ΔVera2 higher than the preceding voltage is applied, thereby carrying out a verify operation so as to cause the erase threshold voltage to lie between Vverify and Vthel. To realize the same threshold distribution as that in a conventional equivalent, ΔVera2 is set in the same manner as in the prior art. By setting the voltage range as described above, the electric field applied to the ONO film in an erase operation can be made smaller, with the time required to carry out the erase operation remaining unchanged.

It should be noted that the threshold voltage does not decrease below Vverify even after an n-th pulse application, or in the first erase operation. As a result, a verify operation need not be carried out in the first erase operation, which enables the data to be erased at a higher speed. In a method of applying an erase voltage to the p-type well side of the semiconductor or memory cell, since a plurality of memory cell blocks are generally formed on a single semiconductor substrate or well, it takes a long time to charge or discharge them. For this reason, a method of applying a voltage continuously without carrying out a verify operation in the first erase operation is effective in erasing the data. This method will be explained below as a modification of the second embodiment. With this method, the erase time is kept short and the reliability is improved.

Figure 18B:
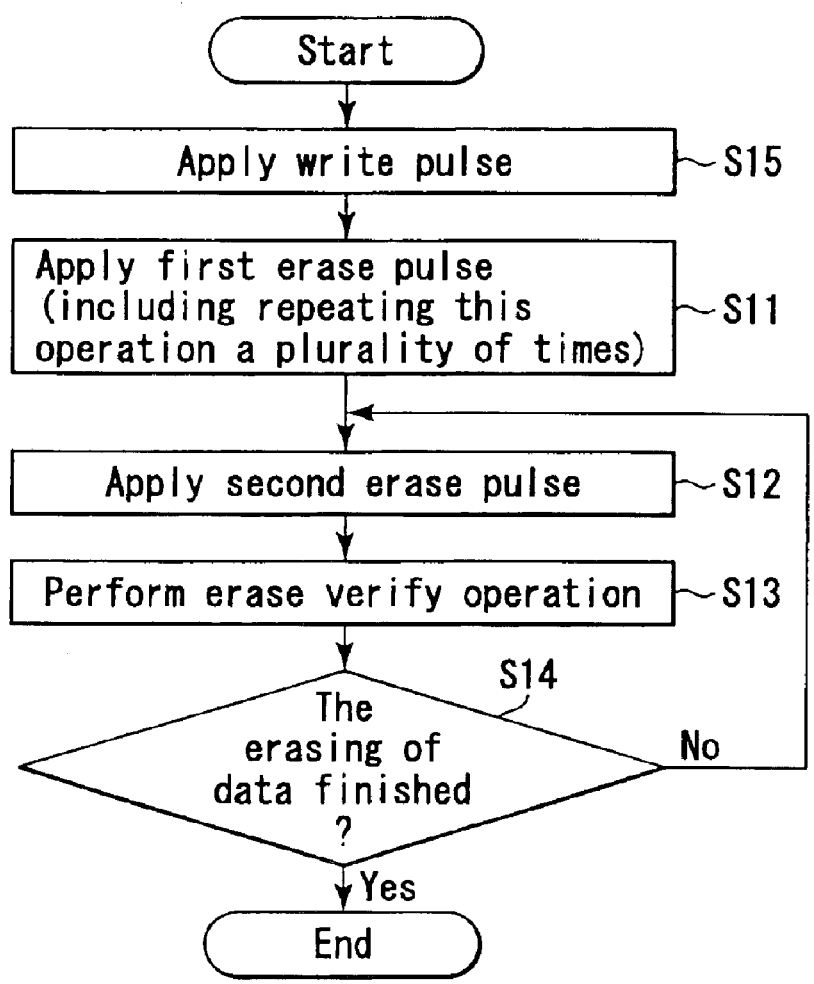
FIG. 18B is a flowchart for erase operation.

Furthermore, as shown in FIG. 18B, before the first erase pulse is applied, a write pulse may be applied (S15), thereby bringing all of the cells in the erased block into the written state. With this configuration, it is not necessary to apply the first erase pulse to the cells already in the erased state. As a result, the maximum erase electric field applied to the ONO film can be made weaker, which improves the reliability of the cells. In addition, excessive erasure can be prevented.

[Modification of Second Embodiment]

Figure 20:
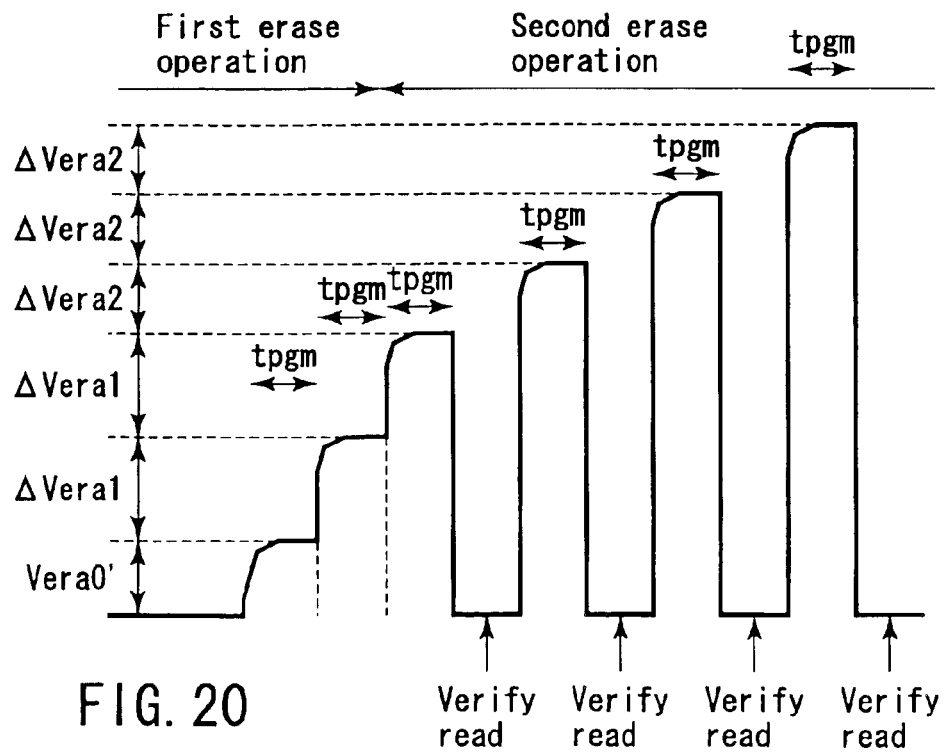
FIG. 20 shows an erase operation waveform in a first modification of the second embodiment.
Figure 21:
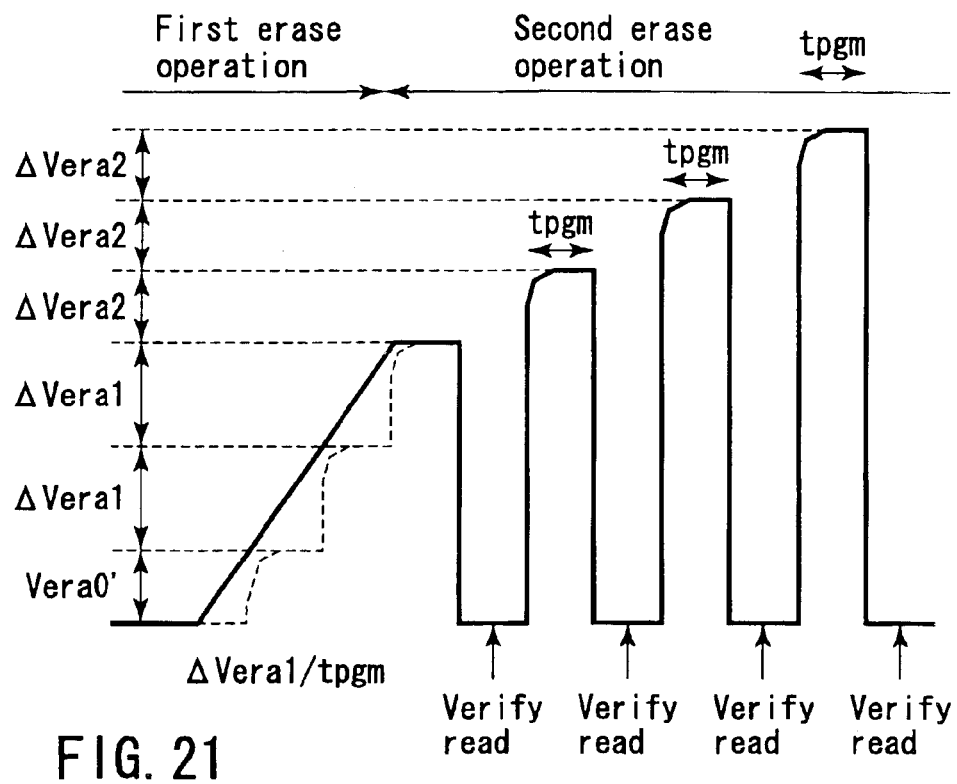
FIG. 21 shows an erase operation waveform in a second modification of the second embodiment.

FIGS. 20 and 21 show erase pulse waveforms of modification 1 and modification 2 of the second embodiment. Unlike the embodiment of FIG. 17, modification 1 uses a stepwise pulse stepped up continuously as an erase pulse in the first erase operation instead of a discrete pulse with idle time. Since a verify operation is not needed in the first erase operation, the following operation can be carried out. In modification 1, the erase time in the first erase operation can be shortened and the pulse voltage is stepped up continuously in the first erase operation so as to be higher than the preceding one by $\Delta$Vera1. Thus, it is not necessary to step up the pulse voltage from the ground potential which is needed in a verify operation. As a result, the pulse voltage can be made more stable than in the second erase operation as shown in FIG. 20. Furthermore, the load on the step-up circuit can be made lighter, which enables the occupied area of the step-up circuit to be reduced.

In modification 2 of FIG. 21, an erase pulse in the first erase operation is a triangular pulse rising linearly. In this case, the increase rate of a triangular erase voltage can be expressed as ($\Delta$Vera1/tpgm) using Vera1, where the second pulse width is tpgm. In modification 2, too, the erase time in the first erase operation can be shortened. The pulse voltage is stepped up continuously in the first erase operation at a slow change rate of ($\Delta$Vera1/tpgm), which enables the pulse voltage to be made more stable than in modification 1. Furthermore, the load on the step-up circuit can be made lighter, which enables the occupied area of the step-up circuit to be reduced.

In the second embodiment and its modifications, it is desirable that the erase pulse width in the first erase operation should be set equal to the erase pulse width in the second erase operation. With this setting, the time constant of the pulse width control circuit in the program voltage generator circuit can be made constant, which enables the circuit to be simplified. However, even if the pulse width in the first erase operation is made different from that in the second erase operation, a similar effect, of course, is produced, provided that the amount of shift in the threshold voltage in a program operation using equation (1) and designing is done so as to meet, for example, the expression $\Delta$Vth(pgm1)>$\Delta$Vth(pgm2). Particularly in the region of toxeq>tboxeq, when designing is done so as to meet the expression $\Delta$Vth(pgm1)=$\Delta$Vth(pgm2), this shortens the time required to carry out an erase verify operation.

By using the erase or write pulse applying method in the second embodiment, an increase in the interface level in the ONO film used as an interpoly film of a floating-gate nonvolatile semiconductor memory is reduced more than in a conventional equivalent. This enables the current flowing from the silicon nitride film via the interface level to be reduced, which maintains the high reliability of the ONO film and improves the retention characteristic of the ONO film.

The interface level has been used as a quantitative parameter of reliability. This has its origin in the formation of a dangling bond and a change in the bond angle at the interface, which is well known physically. It is also possible to suppress the charge trap generation caused by a similar origin, which improves the reliability.

In the second embodiment, when the floating-gate memory cell has a charge accumulation layer made of a conductive material film and the lower oxide film or the upper oxide film in the ONO film has a thickness of 4 nm or less, use of an erase sequence of applying a stepping-up erase pulse suppresses the electric field applied to the second gate insulating film, which enables the desired threshold distribution to be obtained without degrading the reliability.

A narrow erase threshold is particularly achieved, when the erase operation mode includes two consecutive step-ups: the first erase operation of applying an erase pulse voltage with a first step-up voltage and the second erase operation of applying an erase voltage with a second step-up voltage lower than the first step-up voltage. In addition, a verify read operation after the first erase operation need not be carried out. Therefore, without a verify read operation in the first erase operation, a verify read operation in the second erase operation is carried out, which enables the data to be erased at a higher speed.

[Third Embodiment]

Next, a third embodiment of the present invention will be explained. The third embodiment is characterized in that, in a MONOS memory cell using an insulating film as a charge accumulation layer, a threshold distribution width in a step-up write operation is made narrower than that in a conventional floating-gate memory cell by operating the cell while making the threshold voltage at the central part of the channel differ from that at the edge part in consideration of the fact that there arises an offset in the distribution of charges in the charge accumulation layer.

A nonvolatile semiconductor memory cell in the third embodiment is the same as in the first embodiment, which is as shown in FIGS. 5A and 5B. On a semiconductor substrate 1, for example, a p-type well is formed at, for example, a boron or indium impurity concentration of $10^{14}$ ($cm^{-3}$) to $10^{19}$ ($cm^{-3}$). On the p-type well 2, a tunnel insulating film 4 composed of a silicon oxide film or silicon oxynitride film of, for example, 0.5 to 10 nm thick is formed. On the tunnel insulating film 4, a charge accumulation layer 5 composed of, for example, a silicon nitride film is formed to a thickness of 3 to 50 nm. On the charge accumulation layer 5, a block insulating film 6 composed of a silicon oxide film or silicon oxynitride film of, for example, 3 to 30 nm thick is formed.

On the block insulating film 6, gate electrodes 7 (7a, 7b) are formed. The gate electrodes 7 are composed of a stacked structure of n-type or p-type polysilicon to which phosphorus, arsenic, or boron are heavily added or Wsi (tungsten silicide) and polysilicon, or a stacked structure of NiSi, MoSi, TiSi, CoSi, or the like and polysilicon, or a stacked structure of such metal as Al or W and polysilicon. The thickness of the structure is 10 nm to 500 nm.

On both sides of the gate electrode, n-type source-drain diffused layers 8 are formed. Furthermore, element isolating regions composed of an insulating film 3, such as a silicon oxide film, are formed in the silicon substrate at both ends of the memory cell to a depth of, for example, 10 to 500 nm. The well, gate, and source-drain diffused regions, which are each connected to electrodes, can control voltages.

Figure 22:
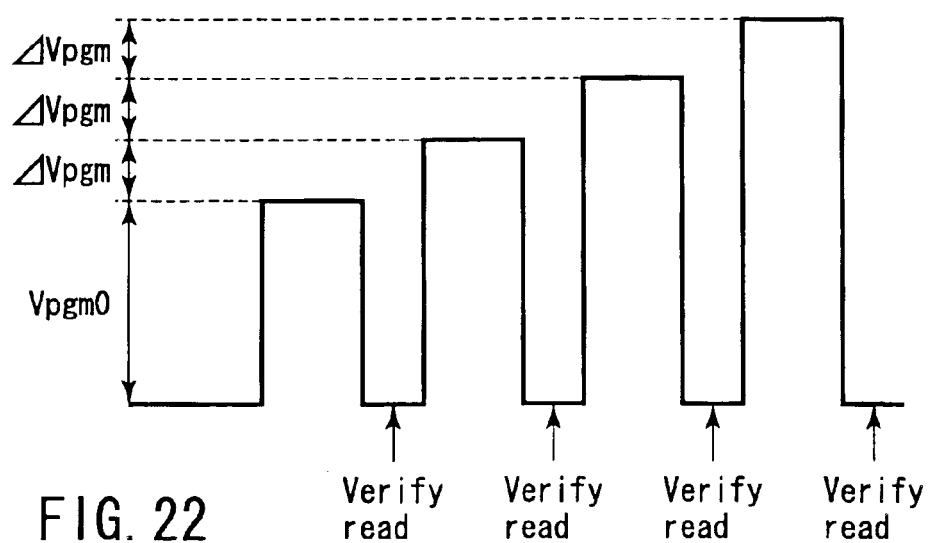
FIG. 22 shows a write operation waveform in a third embodiment of the present invention using a MONOS memory cell.
Figure 23:
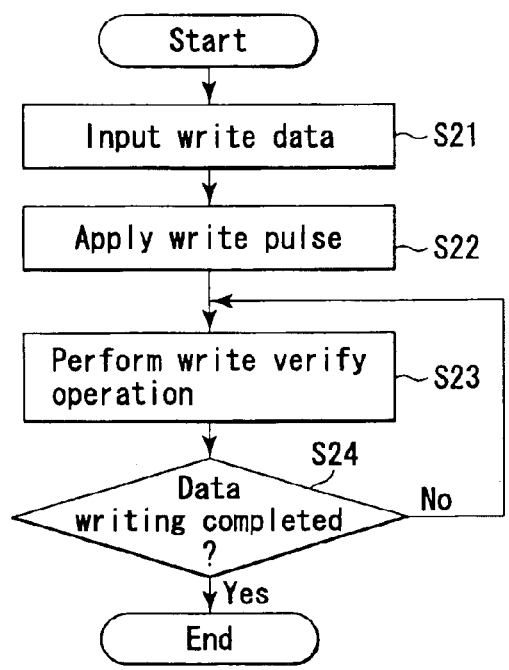
FIG. 23 is a flowchart for write sequence in the third embodiment.
Figure 24:
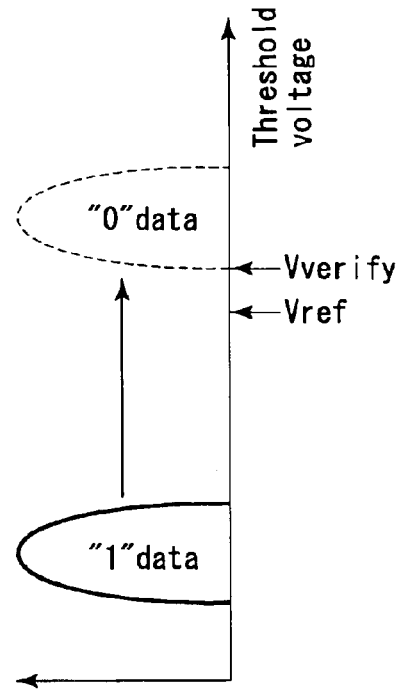
FIG. 24 is a diagram to help explain the data threshold distribution of a memory cell in the third embodiment.

A read operation in the third embodiment will be explained by reference to FIGS. 22, 23, and 24. FIG. 22 shows a write operation waveform. FIG. 23 shows a write sequence. FIG. 24 shows a threshold distribution in a cell array.

To write data, a high-voltage write pulse is applied to the gate electrode, with the well and source-drain diffused layers at 0V. In this state, electrons are injected from the semiconductor substrate into the charge accumulation layer via the tunnel insulating layer. In this way, the threshold voltage of the memory cell is shifted in the positive direction, thereby writing the data. Specifically, the write data is inputted (step s21) and a write pulse voltage is applied (step S22). Thereafter, to check whether the writing has been done sufficiently, a verify read operation is carried out (step S23). From the result of the verify read operation, it is determined whether the threshold voltage of the memory cell is higher than the desired threshold voltage Vverify (step S24). If it is determined that the former is higher than the latter, the write operation is completed. If the former has not reached the desired threshold voltage, the write voltage is stepped up by $\Delta$Vpgm and the write operation is carried out again and then the verify read operation is carried out again. This is repeated until the desired threshold voltage has been reached.

A write pulse voltage applied to the gate electrode starts at an initial voltage of Vpgm0 (V) and rises in increments of a step-up voltage of $\Delta$Vpgm. The initial voltage Vpgm0 is, for example, about 5V to 15V and the step-up voltage $\Delta$Vpgm is, for example, about 0.1 to 1.0V.

To erase the data, an erase voltage of Vera is applied to the well, with the control gate electrode at 0V. This causes holes to be injected from the semiconductor substrate via the tunnel insulating film into the charge accumulation layer, which shifts the threshold voltage of the memory cell in the negative direction, thereby erasing the data.

To read the data, the well and source are set to 0V, a positive voltage is applied to the drain, and a decision voltage of Vref is applied to the gate electrode. In this state, whether the threshold voltage of the memory cell is higher or lower than Vref is determined, depending on whether a current flows between the source and the drain. In this determination, data "0" (written state) and data "1" (erased state) are decided.

The effect of the third embodiment will be explained in comparison with a conventional floating-gate memory cell.

Figure 25:
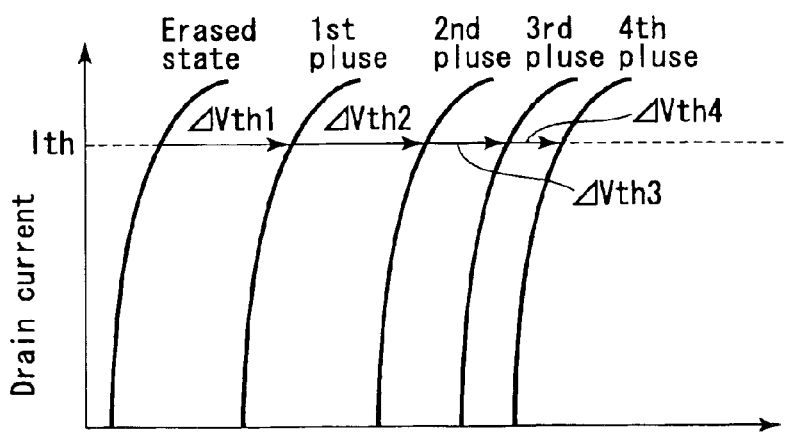
FIG. 25 shows a drain-current-gate-voltage characteristic in writing data in the third embodiment.

In a floating-gate memory cell, when the write pulse is stepped up in increments of $\Delta$Vpgm, the threshold voltage is shifted by $\Delta$Vpgm each time the number of write pulses increases by one. On the other hand, FIG. 25 shows the relationship between a drain-current (Id)-gate-voltage (Vg) characteristic of a MONOS memory cell and the number of write pulses. If the amount of shift in the threshold by a first write pulse is $\Delta$Vth1, that by a second write pulse is $\Delta$Vth2, ..., then the expression $\Delta$Vth1$\geq\Delta$Vth2$\geq\Delta$Vth3$\geq\Delta$Vth4$\geq$ ... holds. That is, as the number of write pulses increases, the amount of shift in the threshold decreases.

Figure 26:
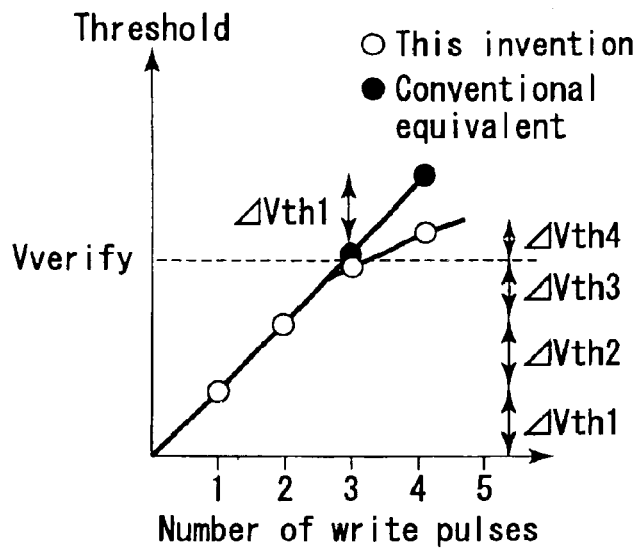
FIG. 26 shows the relationship between the number of write pulses and the change of the threshold in a memory cell in the third embodiment.

FIG. 26 shows the relationship between the number of write pulses in the MONOS memory cell in the third embodiment and the threshold voltage of the memory cell in comparison with a conventional floating-gate memory cell. It is assumed that the threshold voltage is a little lower than the verify voltage Vverify on a third pulse and the write operation is completed on a fourth pulse. When an increase in the number of pulses and a variation in the threshold voltage are linear, the threshold voltage of a memory cell into which the data has been written is Vth=Vverify+$\Delta$Vth1. On the other hand, in the case of a MONOS memory cell where the variation of the threshold voltage decreases gradually, the threshold voltage of a memory cell into which the data has been written is Vth=Vverify+$\Delta$Vth4.

Figure 27:
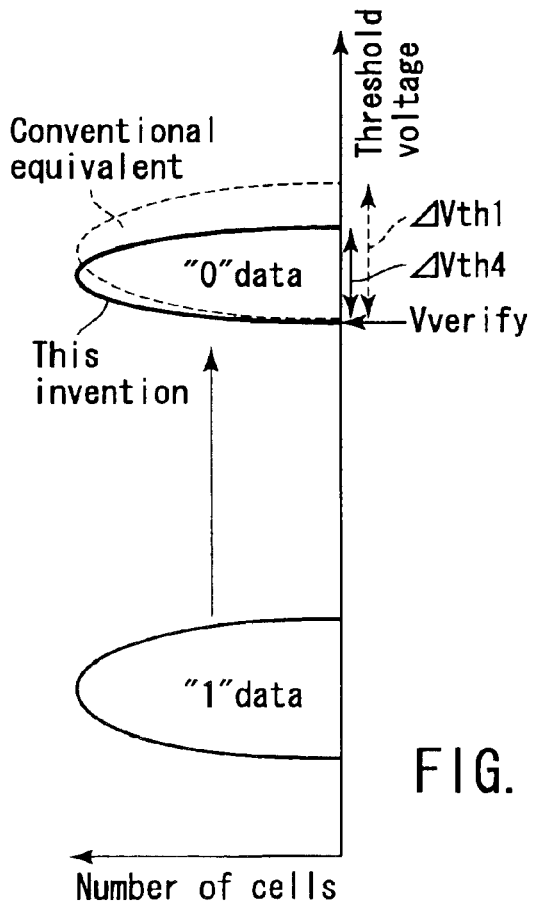
FIG. 27 is a diagram to help explain the data threshold distribution of a memory cell in the third embodiment.

Therefore, as shown in FIG. 27, the write threshold width in the third embodiment becomes $\Delta$Vth4, which is narrower than the threshold width $\Delta$Vth1 (=$\Delta$Vpgm) in the prior art. On the other hand, as shown in FIG. 26, the number of write pulses needed until the write operation is completed is the same as in the prior art.

Next, the reason why the MONOS memory cell in the third embodiment has a write characteristic as shown in FIG. 26 and a preferable mode of the third embodiment will be explained concretely.

Figure 28:
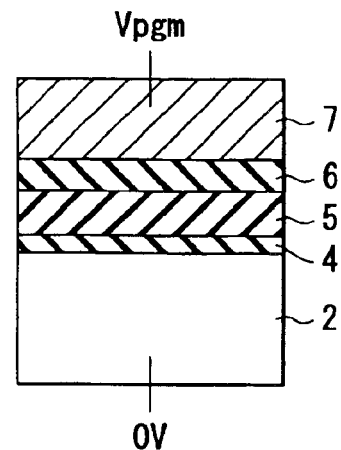
FIG. 28 is a sectional view to help explain the relationship between biases in writing data into a memory cell in the third embodiment.
Figure 29:
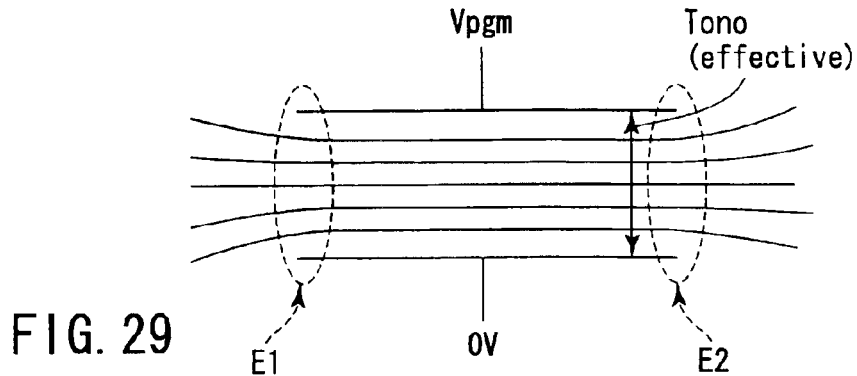
FIG. 29 shows a potential distribution in a gate insulating film in a write operation in the third embodiment.

FIG. 28 is a sectional view of the cell of FIG. 5A to help explain how a voltage is applied in a write operation. The write voltage Vpgm is applied between the semiconductor substrate and the gate electrode. FIG. 29 shows an equivalent circuit of FIG. 28. The configuration of FIG. 28 can be represented as a parallel-plate capacitor. Although the gate insulating film has a stacked structure of the tunnel oxide film 4/charge accumulation layer 5/block insulating film 6, its film thickness is represented by an equivalent oxide film thickness of Tono (effective) in FIG. 29.

When a write voltage is applied, a potential distribution in the gate insulating film is as shown in FIG. 29. The equipotential lines are straight in the central part of the channel region of the cell but curve at both ends E1, E2 in the direction of channel width. This means that the electric field in the insulating film gets weaker at the ends.

Figure 30:
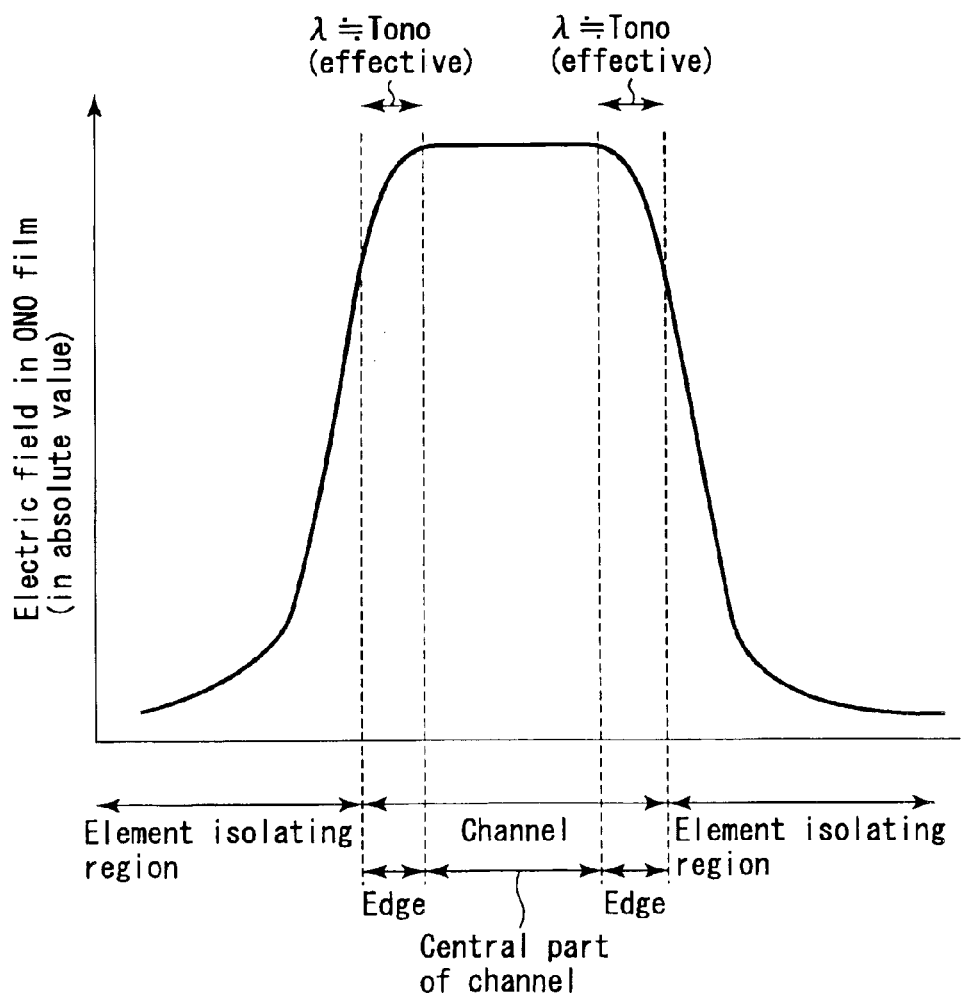
FIG. 30 is a diagram to help explain an electric field distribution in an ONO film in a write operation in the third embodiment.

FIG. 30 shows the electric field in the gate insulating film at that time. The electric field becomes weaker at the edges of the channel than at the center of the channel. If the length of either edge region where the electric field is weaker in the gate insulating film is $\lambda$nm, $\lambda$ is generally almost equal to the equivalent oxide film thickness Tono(effective) of the gate insulating film.

Since the electric field gets weaker in the $\lambda$-nm region at the channel edges in a write operation, the number of charges injected into the charge accumulation layer is smaller at the edges than that into the central part of the channel. This holds true not only in a write operation but also in an erase operation. On the other hand, in the third embodiment, since the charge accumulation layer is an insulating film, the injected charges are trapped by the insulating film and therefore hardly move in the charge accumulation layer. This is how it differs from a conventional floating-gate memory cell.

Figure 31:
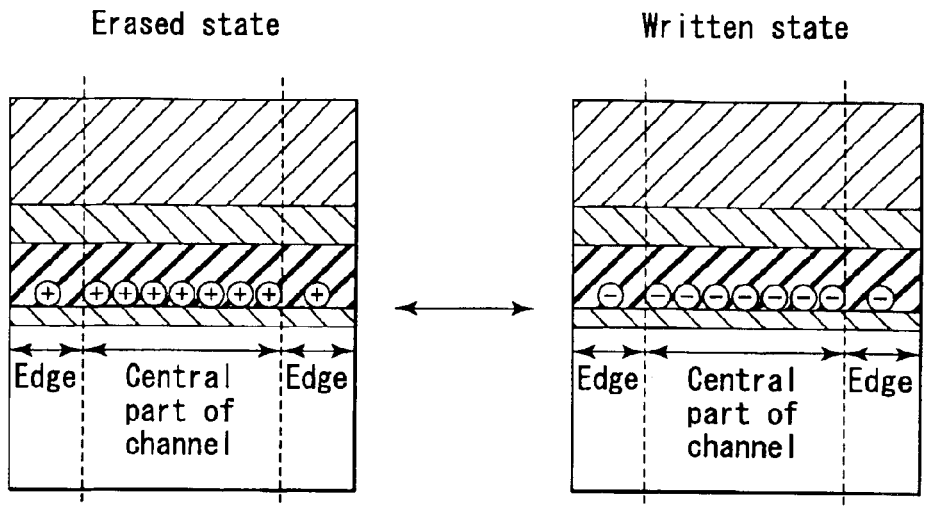
FIG. 31 is sectional views to help explain a state where charges are accumulated in a memory cell in the third embodiment.

FIG. 31 shows how charges are accumulated in the charge accumulation layer, using a case where positive charges are trapped in the charge accumulation layer in an erase operation and negative charges are trapped in the charge accumulation layer in a write operation. In the $\lambda$-nm regions at both edges, the number of charges trapped is smaller than that at the center of the channel. As a result, the variation of the threshold voltage at the edge parts in a write erase operation is smaller than that in the channel part.

Figure 33:
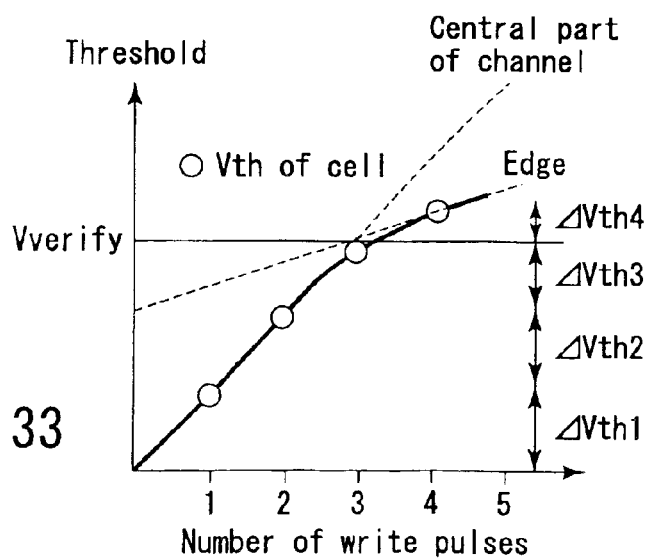
FIG. 33 is a diagram showing the number of write pulses and the change of the threshold in a memory cell in the third embodiment.

FIG. 33 shows the relationship between the number of write pulses and the threshold voltages at the center of the channel and at the edges. The variation of the threshold voltage with respect to the number of write pulses at the edge parts is smaller than that in the central part of the channel. The threshold voltage in the edge regions is higher at the beginning of a write operation, whereas the threshold voltage in the central part of the channel becomes higher as the write operation goes on.

Figure 32:
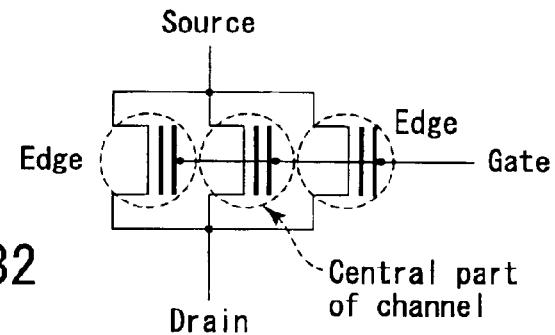
FIG. 32 shows an equivalent circuit of a memory cell in the third embodiment.

Taking into account the difference in threshold change between the central part of the channel and the edge parts, the memory cell transistor is represented by an equivalent circuit shown in FIG. 32. Specifically, when the central part of the channel and both edge parts in the direction of channel width are considered to be separate transistors, the memory transistor can be represented by three transistors obtained by connecting the separate transistors in parallel. Then, the threshold voltage of the memory cell is determined by the lower one of the threshold voltage of the central part of the channel and that of the edges.

As shown in FIG. 33, the threshold value of the memory cell is determined by the central part of the channel at the beginning of the write operation. As the write operation progresses, the threshold value is determined by the threshold voltage of the edge parts. The variation of the threshold voltage of the memory cell with respect to the number of write pulses is larger at the beginning of the write operation and gets smaller as the write operation progresses. Therefore, it is possible to make a high-speed write operation compatible with high reliability (a narrow write threshold distribution).

Figure 34:
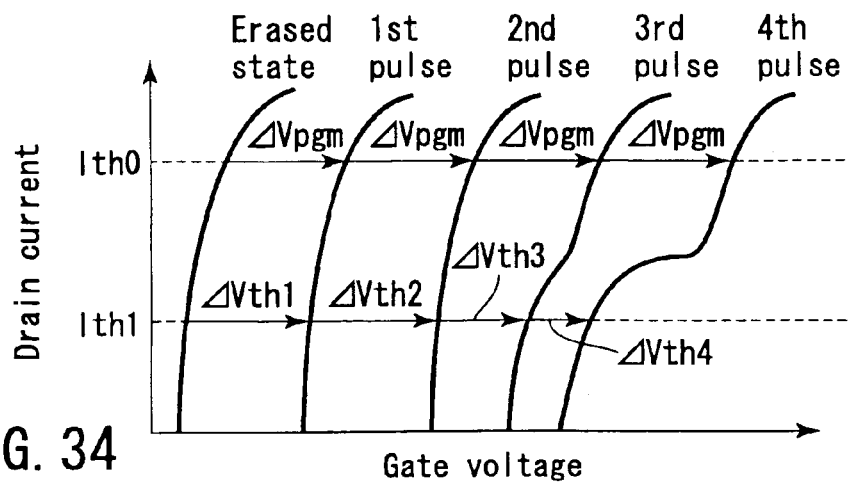
FIG. 34 is a drain-current-gate-voltage characteristic in writing data in the third embodiment.

FIG. 34 shows the change of a Id-Vg characteristic in writing data into a memory cell in the third embodiment. This is a characteristic in a case where the channel width of the memory transistor is sufficiently (e.g., 20 times or more) larger than the edge region $\lambda$=Tono(effective) where the electric field gets weaker in a write operation. Although the same Id-Vg characteristic as that of a conventional memory cell in an erase operation is obtained, a bump appears in the Id-Vg characteristic as the write operation goes on. This is because the edge parts whose threshold voltage is lower than that of the central part of the channel act as parasitic transistors.

The write characteristic of the memory cell differs according to the drain current defining the threshold voltage. When the threshold voltage is defined by a high drain current of Ith0, the threshold of the memory cell is determined by the threshold of the central part of the channel. Therefore, the variation of the threshold with respect to the number of write pulses is a constant value of $\Delta Vth1$ ($\approx \Delta Vpgm$). When the threshold voltage is defined by the small drain current Ith1, the threshold of the memory cell is determined by the threshold voltage in the central part of the channel at the beginning of the write operation. As the write operation progresses, the threshold of the memory cell is determined by the threshold voltage at the edge parts. Accordingly, to produce the effect of the third embodiment, it is necessary to set the threshold voltage by the small drain current.

As compared with FIG. 34, FIG. 25 shows an Id-Vg characteristic in a case where the channel width of the memory cell transistor is small. In this case, since the drain current flowing through the central part of the channel decreases, the contribution of the edge parts becomes greater, resulting in a characteristic where such a bump as shown in FIG. 34 is hardly seen.

A preferable channel width in the third embodiment will be described. To produce the effect of the third embodiment, the gate insulating film should have the central part of the channel to which a strong electric field is applied and the edge parts to which a weaker electric field than that of the central part of the channel is applied. Since the $\lambda$-nm region at the edge part is almost equal to the equivalent oxide film thickness Tono [nm] of the gate insulating film, it follows that about $2\lambda \approx 2 \cdot$Tono at both ends. In addition to this, for the channel section to exist, the channel width has to be greater than twice the reduced oxide film thickness of the gate insulating film.

The relationship between the channel width and the read operation speed will be described. Since the drain current increases as the channel width of the memory cell transistor increases, this is preferable in making the read operation faster. FIG. 34 shows an Id-Vg characteristic when the channel width is large. However, to produce the effect of the third embodiment, the drain current to define the threshold voltage has to be the low current value Ith1. In this case, the drain current becomes the same threshold voltage defining current as when the channel width is narrow (the Id-Vg characteristic of FIG. 25). As a result, the effect of making the read operation faster by widening the channel width is not produced.

The results of analysis by the inventor has shown that, even if the channel width is made larger than 10 times the edge regions $2\lambda$ at both ends where the write electric field is weaker, the increase of the channel width hardly produced the effect of making the write operation faster. Therefore, it is desirable that the channel width be equal to or less than $20\lambda$ from the viewpoint of miniaturizing memory cells. As described above, since $\lambda \approx$ Tono(effective), it is desirable that the channel width be smaller than 20 times the reduced oxide film thickness of the gate insulating film.

To sum up, it is desirable that the step-up writing method be used in MONOS memory cells and that the channel width of a cell be set in the range of 2 Tono to 20 Tono to realize a narrower write threshold than that of a conventional floating-gate memory cell.

Here, the channel width of a cell means the width of an element region in the direction perpendicular to the direction in which the on current of the memory cell flows (or the direction of channel length). Specifically, if the direction in which current flows in the element region, with the source and drain in the conducting state, is a first direction, the length between the two sides perpendicular to the first direction of the four sides defining the element region of the memory cell is the channel width. Setting the channel width in the above range is preferable to producing the effect explained by reference to FIGS. 28 to 34. In the memory cell structure shown in FIG. 5, the width of the element region sandwiched between the element isolating regions in FIG. 5A is the channel width. However, in other cell structures, including AND EEPROMs and virtual ground array EEPROMs, the channel width may be defined by the gate electrode width.

Next, a preferable write characteristic of a memory cell in the third embodiment will be explained. It is assumed that l, m, and n are integers and that the desired threshold voltage of a memory cell is reached after a write pulse is applied n times ($n \geq 1$). It also assumed that the threshold voltage of the memory cell dose not change after a first pulse is applied ($l \geq 0$) but changes after a (l+1)-th or later pulse is applied.

It is assumed that the variation of the threshold voltage is $\Delta Vth1$ when a first pulse applied is a write pulse, the variation caused by a second pulse is $\Delta Vth2$, and the variation caused by an n-th pulse is generally $\Delta Vthn$. To produce the effect of the third embodiment, it is necessary to achieve such a write characteristic as has $\Delta Vthm$ that meets the expression $\Delta Vthn < \Delta Vthm$ ($1 \leq m \leq n$). Furthermore, to make a write operation faster and narrow the write threshold distribution width, it is desirable that the average variation of the threshold voltage until the verify voltage has been reached be smaller than the variation of the threshold voltage when the last pulse is applied at the end of the write operation. That is, it is desirable that the expression $\Delta Vthn < (\Delta Vth1+1+\Delta Vth1+2+ \ldots +\Delta Vthn-1)/(n-l-1)$ holds.

Furthermore, it is desirable that the variation of the threshold voltage caused by the write pulse immediately before the verify voltage is reached be large (or the write speed should be fast) and small after the verify voltage is exceeded (or the write speed should be slow). That is, it is desirable that the expression $\Delta Vthn < \Delta Vthn-1$ holds.

Next, a preferable mode of the memory cell structure in the third embodiment will be explained.

Figure 35A:
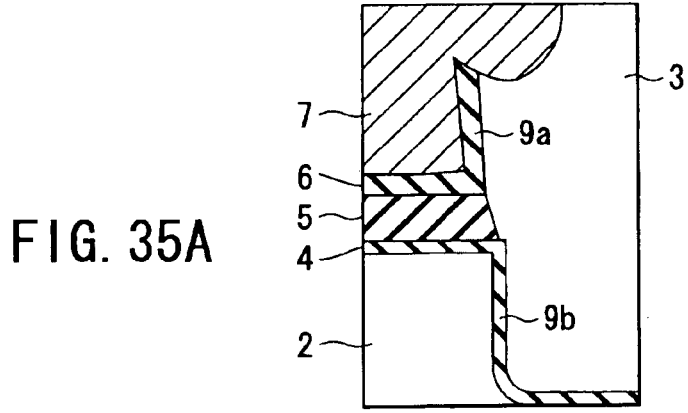
FIG. 35A shows a structure of an edge of a memory cell in the third embodiment.

FIG. 35A shows a preferable shape of the edge part (element isolating end) of FIG. 5A. It is desirable that both ends of the charge accumulation insulating film 5 be shaped so that they extend outward from the ends of the polysilicon gate electrode 7 and the ends of the element region of the semiconductor substrate (or the ends of the channel region). Alternatively, they may project into either the gate electrode 7 or the element region.

Furthermore, it is desirable that the block insulating film 6 be shaped so that it is thicker at the ends in the direction of channel width than in the central part of the channel. Alternatively, it is desirable that the equivalent oxide film thickness of all of the gate insulating films, including the tunnel insulating film 4, charge accumulation insulating film 5, and block insulating film 6, be thicker at the element isolating ends.

Such a shape makes it possible to weaken the electric field applied to the gate insulating film at the element isolating ends in a write operation as shown in FIG. 29.

Furthermore, it is desirable that sidewall oxide films 9a, 9b are formed on the sidewalls of the gate polysilicon and the semiconductor substrate. It is also desirable that the corners of the element isolating ends of the gate polysilicon and semiconductor substrate be rounded. Oxidizing the sidewalls and rounding the corners prevents the concentration of the electric field compared with when the corners are sharp. As a result, it is easy to weaken the write electric field at the element isolating ends.

It is preferable to form the charge accumulation layer 5 into a semi-tapered shape because this shape makes it easy to embed the charge accumulation layer 5 in an element isolating trench in a later process. The angle of the semi-taper should be in the range of 60° to 89° with respect to the surface of the semiconductor substrate. As shown in FIG. 35A, the polysilicon sidewall oxide film 9a is caused to project into the trench more than the charge accumulation layer 5 as a result of the oxidation of the polysilicon gate electrode. This structure is preferable to reducing damage to the charge accumulation layer in embedding the element isolation insulating film and forming a more reliable device structure. Moreover, the polysilicon sidewall oxide film 9b is caused to project into the trench more than the charge accumulation layer 5 as a result of the oxidation of the semiconductor substrate. This structure makes it easy to embed the silicon oxide film in the element isolating trench in a later process.

The inventors' detailed examination has shown that it is desirable that both ends of the charge accumulation insulating film 5 should extend from the ends of the element isolating regions (channel regions) in the direction of the channel width in the range of 0.5 nm or more to 15 nm or less. It was found that it is desirable if the thickness of the oxide film 9b formed on the inner wall of the trench is in the range of 1 nm or more to 16 nm or less.

Figure 35B:
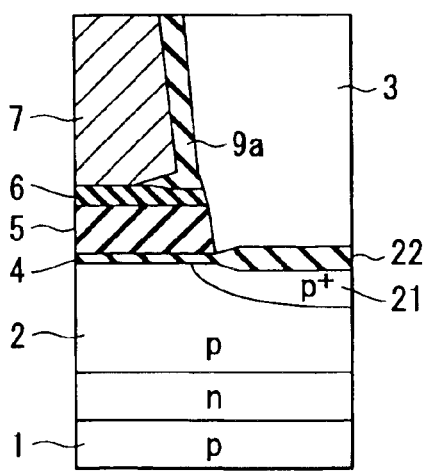
FIG. 35B shows another structure of an edge of a memory cell in the third embodiment.
Figure 35C:
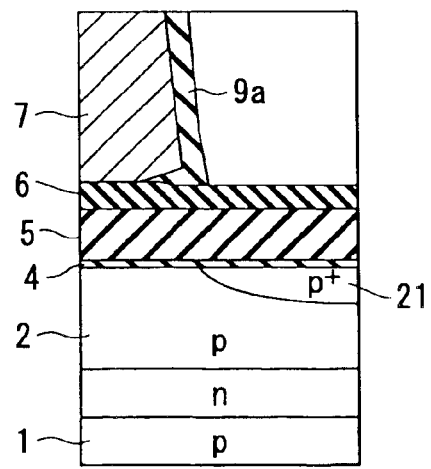
FIG. 35C shows another structure of an edge of a memory cell in the third embodiment.

FIGS. 35B and 35C each show a case where the memory cell end structure with another element isolation structure is caused to correspond to FIG. 35A. As shown in FIG. 35B, in place of the element isolation insulating film, a $p^+$-type layer 21 into which, for example, boron or indium p-type impurities have been implanted in the range of $10^{11}$ cm$^{-2}$ to $10^{14}$ cm$^{-2}$ may be formed, thereby isolating the elements in adjacent cells. In this case, the element isolating film 22 or the sidewall film 9a has been formed beforehand on the top of the source and drain electrodes. Therefore, by limiting p-type impurity ions so that they stop at the element isolating film 22, p-type impurities can be prevented from entering the n-type source and drain regions. The p-type impurity implantation energy is in the range of 1 eV to 100 eV.

The charge accumulation insulating film 5 does not have to be removed from the element isolation p-type region 21. It may be shared by adjacent cells, as shown in FIG. 35C.

In FIGS. 35B and 35C, it is not necessary to etch the silicon substrate deeply to form the element isolating region. Thus, the electric field in a write operation does not concentrate at the corners of the silicon substrate at the element isolating ends. As a result, it is easy to weaken the electric field in the gate insulating film at the element isolating ends.

In the third embodiment, an insulating film is used as the charge accumulation layer of a memory cell and the electric field is weakened at the channel edges in a write operation, thereby making the threshold voltage in the central part of the channel different from that at the edge parts. Therefore, by making the write speed of the memory cell faster until the verify potential has been reached and slower after the verify potential has been exceeded, it is possible to make high-speed writing compatible with a narrow threshold distribution, or high reliability, in a write operation.

The step-up voltage ΔVpgm in a step-up write operation is not necessarily constant and may be varied according to the number of write pulses. In addition, the step-up voltage ΔVpgm may be set to ΔVpgm=0V to use a constant write voltage. Furthermore, the write pulse width Tpgm is not necessarily constant and may be varied according to the number of write pulses.

[Fourth Embodiment]

Figure 36A:
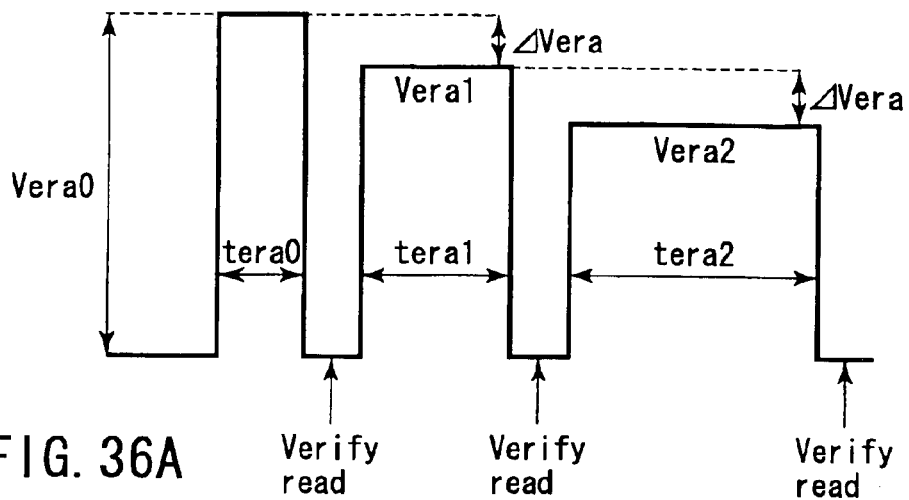
FIG. 36A shows an erase operation waveform according to a fourth embodiment of the present invention.

FIG. 36A shows an erase operation waveform in a fourth embodiment of the present invention. The fourth embodiment is characterized in that the data is erased using a plurality of erase pulses Vera0, Vera1, Vera2, and that the absolute value of the erase pulse voltage is decreased in steps of ΔVera as the erase operation progresses and the erase pulse width is made longer as follows: tera0<tera1<tera2< . . . . By doing this, it is possible to realize high-speed erasing and a narrow erase threshold distribution. In addition, it is possible to alleviate the deterioration of the reliability of the memory cells after a rewrite operation is carried out repeatedly and realize high reliability.

In a case where a nonvolatile memory cell in the fourth embodiment is a MONOS memory cell using an insulating film as a charge accumulation layer, its sectional views are the same as those in the first embodiment as shown in FIGS. 5A and 5B. On a semiconductor substrate 1, for example, a p-type well 2 is formed at a boron or indium impurity concentration of $10^{14}$ (cm$^{-3}$) to $10^{19}$ (cm$^{-3}$). On the p-type well 2, a tunnel insulating film 4 composed of a silicon oxide film or silicon oxynitride film of, for example, 0.5 to 10 nm thick is formed. To inject holes by direct tunneling, it is desirable if tunnel insulating film 4 equal to or less than 4 nm.

On the tunnel insulating film 4, a charge accumulation layer 5 composed of, for example, a silicon nitride film is formed to a thickness of 3 to 50 nm. On the charge accumulation layer 5, a block insulating film 6 composed of a silicon oxide film or silicon oxynitride film of, for example, 3 to 30 nm thick is formed. On the block insulating film 6, a gate electrode 7 with a stacked structure of n-type or p-type polysilicon 7a to which phosphorus, arsenic, or boron are heavily added and Wsi (tungsten silicide) 7b is formed to a thickness of 10 nm to 50 nm. The gate electrode may have a stacked structure of NiSi, MoSi, TiSi, CoSi, or the like and polysilicon, or a stacked structure of a metal such as Al or W and polysilicon.

On both sides of the gate electrode, n-type source-drain diffused layers 8 serving as the source and drain are formed. Furthermore, element isolating regions 3 composed of an insulating film, such as a silicon oxide film, are formed in the silicon substrate at both ends of the memory cell to a depth of, for example, 10 to 500 nm. The well, gate, and source-drain diffused regions, which are each connected to electrodes, can control voltages.

To write data, a high-voltage pulse is applied to the gate electrode, with the well and source-drain diffused layers at 0V. In this state, electrons are injected from the semiconductor substrate into the charge accumulation layer via the tunnel insulating layer. In this way, the threshold voltage of the memory cell is shifted in the positive direction, thereby writing the data. The data may be written by the method in the first embodiment or by the method in the second embodiment.

To erase the data, the gate electrode is set to 0V and an erase voltage pulse is applied to the well a plurality of times, which causes holes to be injected from the semiconductor substrate into the charge accumulation insulating film. As shown in FIG. 36A, the erase pulse is a high voltage pulse Vera0 at the beginning of the erase operation. As the write operation progresses, erasing is done with a voltage lowered in steps of ΔVera. The erase pulse width is a short pulse at the beginning of the write operation. As the erase operation progresses, the erase pulse becomes longer.

Figure 36B:
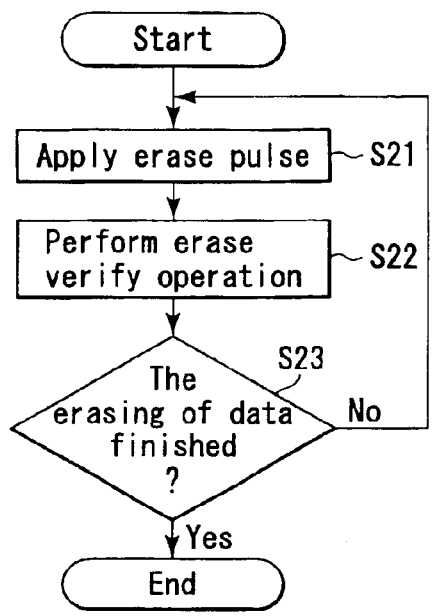
FIGS. 36B to 36E are flow charts for the erase operation.

FIG. 36B shows an erase operation. In the erase operation of FIG. 36B, an erase pulse is applied (S21) and, each time an erase pulse is applied, a verify read operation of verifying whether the memory cells have reached the desired erase threshold voltage is carried out (S22, S23).

Figure 36C:
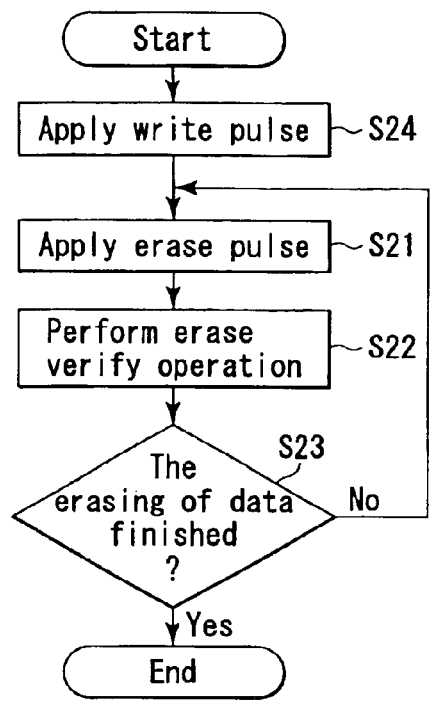
Figure 36D:
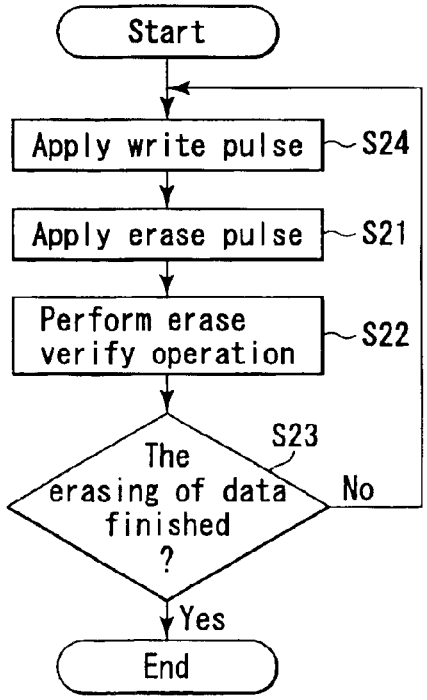
Figure 36E:
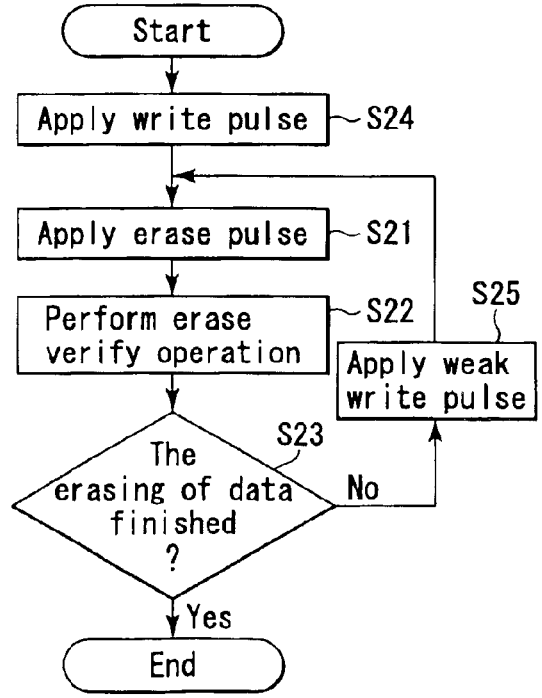

In contrast, in FIGS. 36C to 36E, before an erase pulse is applied, a write pulse is applied, thereby bringing the memory cells into the written state beforehand. With this configuration, it is not necessary to apply an erase pulse to the cells already in the erased state. As a result, the maximum erase electric field applied to the ONO film can be made weaker, which improves the reliability of the cells. In addition, excessive erasure can be prevented. Furthermore, as explained later, when a cell has already been erased close to the saturation erase voltage, a gate reverse injection from the gate electrode caused by the application of further erase pulses can be prevented. As a result, the reliability of the cells can be improved and the erase threshold distribution can be narrowed.

In FIG. 36C, before an erase operation is started, a write pulse is applied only once (S24). In FIG. 36D, a write pulse is applied each time an erase verify operation is carried out (S23 to S24). In FIG. 36E, a weak write pulse lower in voltage or shorter than the pulse in a write operation (S24) is applied each time an erase verify operation is carried out (S25) in addition to the operation in FIG. 36C. When the method of applying a weak write pulse is used as in FIG. 36E, the maximum electric field applied to the ONO film decreases as compared with a case where an ordinary write pulse is applied as shown in FIG. 36D. Furthermore, the total number of charges injected into the ONO film decreases. Consequently, a decrease in the reliability of the cells after writing and erasing are done repeatedly can be minimized.

In the erase sequences shown FIGS. 36D and 36E, a write pulse is applied each time an erase verify operation is carried out. Therefore, as shown in FIG. 36A, the erase pulse is not limited by a method of lowering the voltage gradually and may be produced by a method of raising the voltage gradually. The reason is that a gate reverse injection from the gate electrode can be avoided by always applying a write pulse before the application of an erase pulse.

Furthermore, the number of pulses used in the write pulse applying operation and erase pulse applying operation in each of FIGS. 36C to 36E may one or more.

To read the data, the well and source are set to 0V, a positive voltage is applied to the drain, and a decision voltage of Vref is applied to the gate electrode. In this state, whether the threshold voltage of the memory cell is higher or lower than Vref is determined according to whether current flows between the source and the drain. In this determination, data "0" (written state) and data "1" (erased state) are decided.

Figure 37:
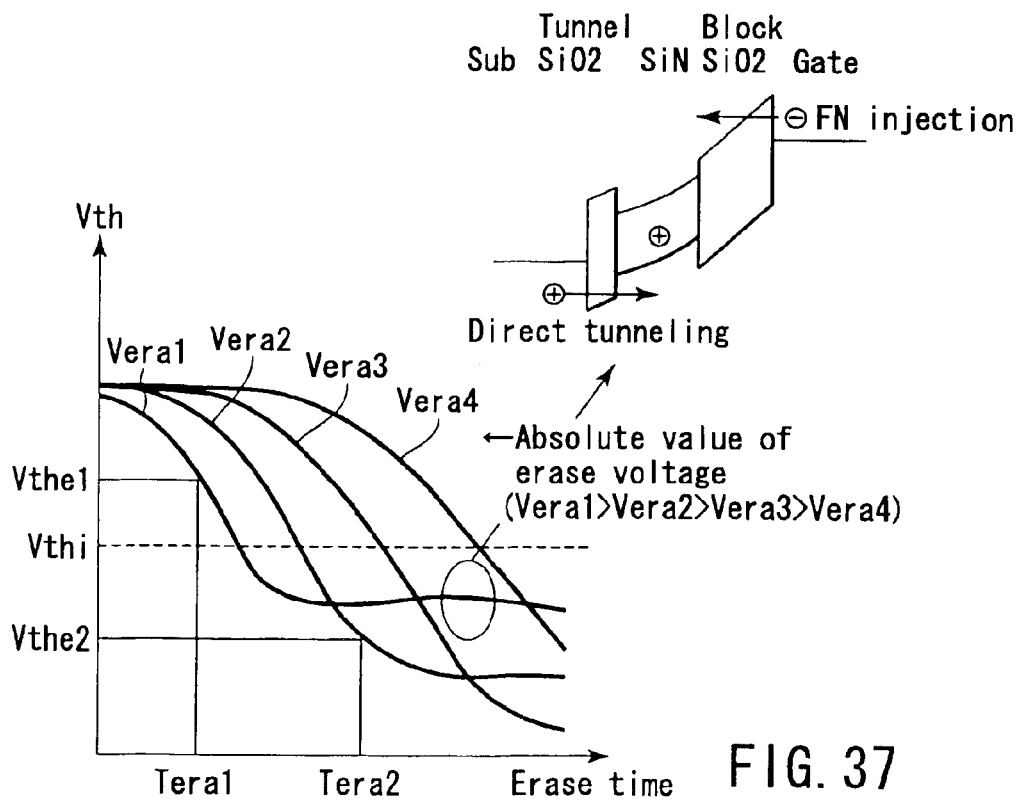
FIG. 37 is a diagram showing the relationship between the erase time and the change of the threshold in a memory cell in the fourth embodiment.

FIG. 37 shows an erase characteristic of a MONOS memory cell using an insulating film as a charge accumulation layer. When the erase time is made longer, a saturation phenomenon where the erase threshold voltage does not drop any further is observed. This saturation phenomenon is caused when the number of holes injected from the substrate by direct tunneling equals the number of electrons injected from the gate electrode by FN tunneling, as shown in FIG. 37. Specifically, at the beginning of an erase operation, holes are injected from the substrate into the charge accumulation layer, causing the threshold voltage of the memory cell to shift in the negative direction. However, as the erase operation progresses, the electric field in the block oxide film gets stronger, thereby injecting electrons from the gate electrode through the block insulating film. As a result, the electrons recombine with holes in the charge accumulation insulating film and neutralize the holes injected from the substrate. Hereinafter, this phenomenon is referred as the gate reverse injection phenomenon.

FIG. 37 shows an erase characteristic on a different erase pulse voltage Vera (absolute value). When an erase pulse is high in voltage, the saturation erase threshold voltage is shallow and the erase time required to reach saturation is short. Here, that the erase threshold voltage is shallow means that the variation of the threshold voltage from the written state is small.

In the erasing method in the fourth embodiment, erasing is done shallowly with a first erase pulse set at a high voltage for a short time (a first erase operation). With a second and later erase pulses, erasing is done deeply, while lowering the voltage of the pulse gradually for a long time (a second erase operation). A method of changing the erase pulse voltage at least in two stages is compared with a case where a voltage equal to or higher than the first erase voltage is used even after the second and later erase pulses.

It is assumed that the memory cell has been erased close to the erase saturated voltage of FIG. 37 after the application of the first erase pulse. Since the memory cell is almost at the saturation threshold voltage, even when the second erase pulse is applied at the same voltage as that of the first erase pulse, the memory cell cannot be erased more deeply. In addition, when the second erase pulse is applied at a voltage higher than that of the first erase pulse, since the saturation threshold voltage becomes shallower as the erase voltage becomes higher, the threshold voltage of the memory cell moves toward the shallower state, preventing the erase operation from being completed. Furthermore, since the gate reverse injection from the gate electrode permits extra electrons to pass through the block oxide film and recombine with holes, which causes the problem of degrading the reliability of the gate insulating film.

On the other hand, with the fourth embodiment, since the erase voltage is lowered gradually after the second and later erase pulses, the gate reverse injection phenomenon can be avoided, preventing the reliability of the memory cell from deteriorating. In addition, each time the erase pulse is applied, the erase threshold voltage can be made deeper.

[Fifth Embodiment]

Figure 38:
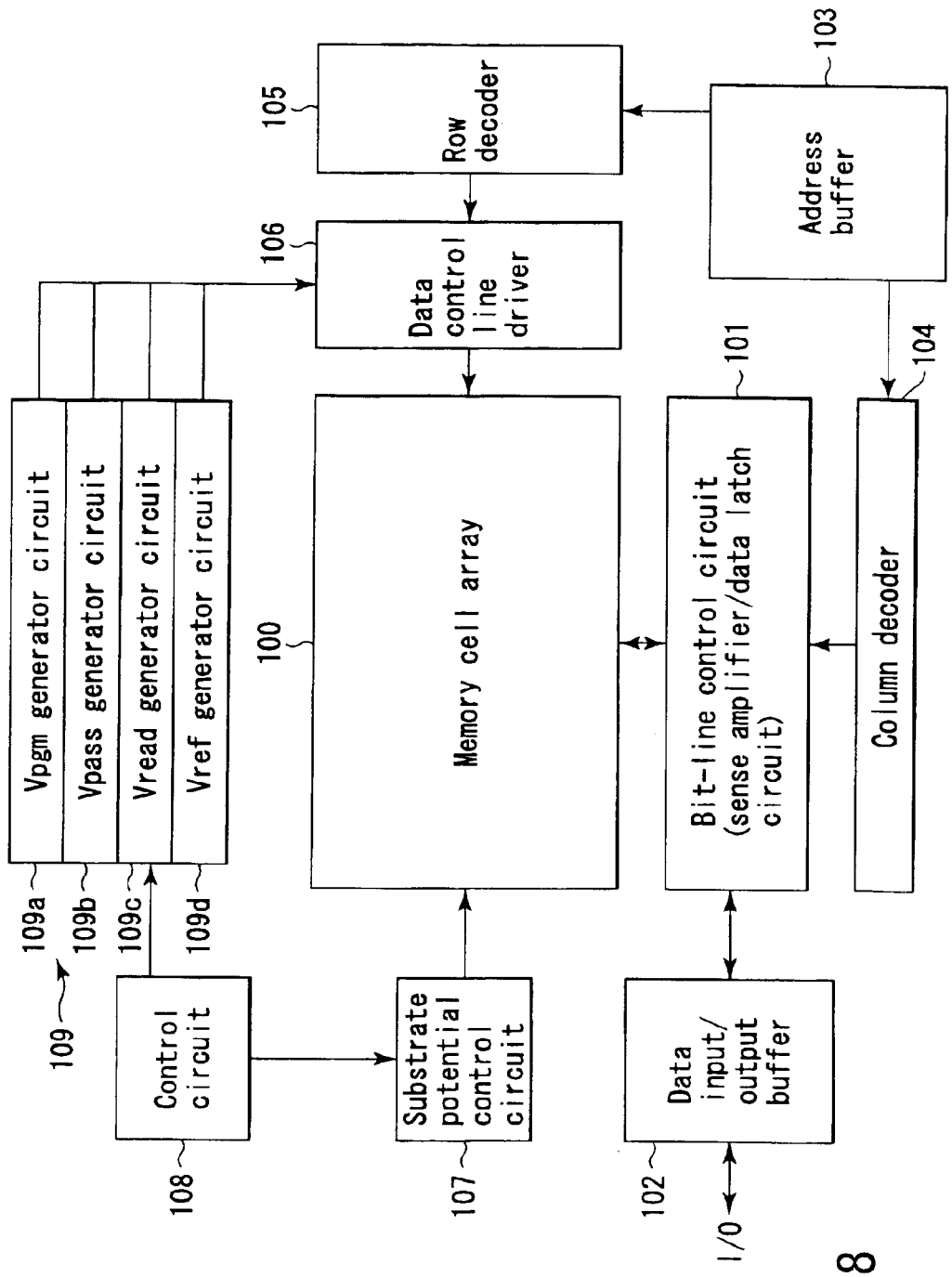
FIG. 38 shows the configuration of an EEPROM according to a fifth embodiment of the present invention.

In a fifth embodiment of the present invention, the data writing and erasing methods in the first to fourth embodiments are applied concretely to a NAND EEPROM, which will be explained below. FIG. 38 shows the configuration of a NAND EEPROM. A cell array 100 is composed of NAND cells arranged in a matrix. A NAND cell is composed of nonvolatile memory cells connected in series.

A bit line control circuit 101 is provided to sense bit line data in the memory cell array 100 or hold the write data. The bit line control circuit 101, which includes a sense amplifier circuit and a data latch circuit, is composed mainly of, for example, flip-flop circuits.

The bit line control circuit 101 is connected to a data input/output buffer 102. This connection is controlled by the output of a column decoder 104 which decodes an address signal from an address buffer 103. The data supplied to a data input/output terminal I/O is written into the memory cell array 100. The data in the memory cell array 100 is read onto the data input/output terminal I/O.

A row decoder 105 and a data control line driver 106 select a memory cell in the memory cell array 100. Specifically, the row decoder 105 and a data control line driver 106 control a data control line (hereinafter, referred to as a word line) and select gate lines SSL, GSL. On the basis of the decode output from the row decoder 105, the data control line driver 106 applies a necessary control voltage to the selected data control line and the select gate line.

A substrate potential control circuit 107 controls the potential in the substrate region (normally, a p-well) in which the cell array 100 is formed. Specifically, the substrate potential control circuit 107, which is controlled by a control circuit 108, generates the ground potential GND in writing the data and reading the data, and an erase voltage in erasing the data.

An internal voltage generator circuit 109, which is controlled by the control circuit 108, generates various internal voltages to apply a necessary voltage to the selected memory cell in the memory cell array 100. Specifically, the internal voltage generator circuit 109 includes a write voltage (Vpgm) generator circuit 109a, a Vpass generator circuit 109b for generating a pass voltage (Vpass) in a write operation, a Vread generator circuit 109c for generating a pass voltage (Vread) in a write operation (including a verify read operation), and a read voltage (Vr) generator circuit 109d.

The pass voltage Vpass in a write operation and the pass voltage Vread in a read operation are lower than the write voltage Vpgm but higher than the power-supply voltage Vcc.

The Vpgm generator circuit 109a contains a voltage setting circuit (not shown) which monitors its output and variably sets the initial voltage or the step-up increment in generating a write voltage pulse stepped up sequentially in a write operation. There is preferably provided a voltage setting circuit which variably sets the pass voltage Vpass in a write operation and the pass voltage Vread in a read operation according to the variation of the write voltage Vpgm.

The configuration of the Vpgm generator circuit 109a and a basic method of controlling the write voltage and the step-up voltage may be known ones (for example, those disclosed in U.S. Pat. Nos. 6,031,760 and 6,108,238). In the fifth embodiment, however, two or more step-up voltages can be set in a write or an erase operation. During a series of write and erase operations, step-up voltages can be changed. In addition, write and erase pulse widths can be changed. These step-up voltage values and pulse widths, which are held in the chip in the form of, for example, trimming data, are reflected in write and erase sequence control programmed in the control circuit 108.

Figure 39A:
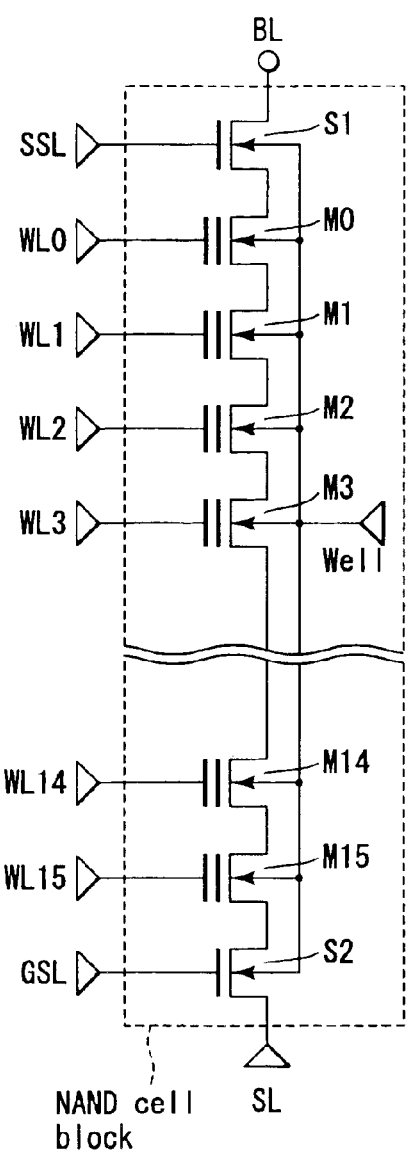
FIG. 39A is an equivalent circuit diagram of a NAND cell unit.
Figure 39B:
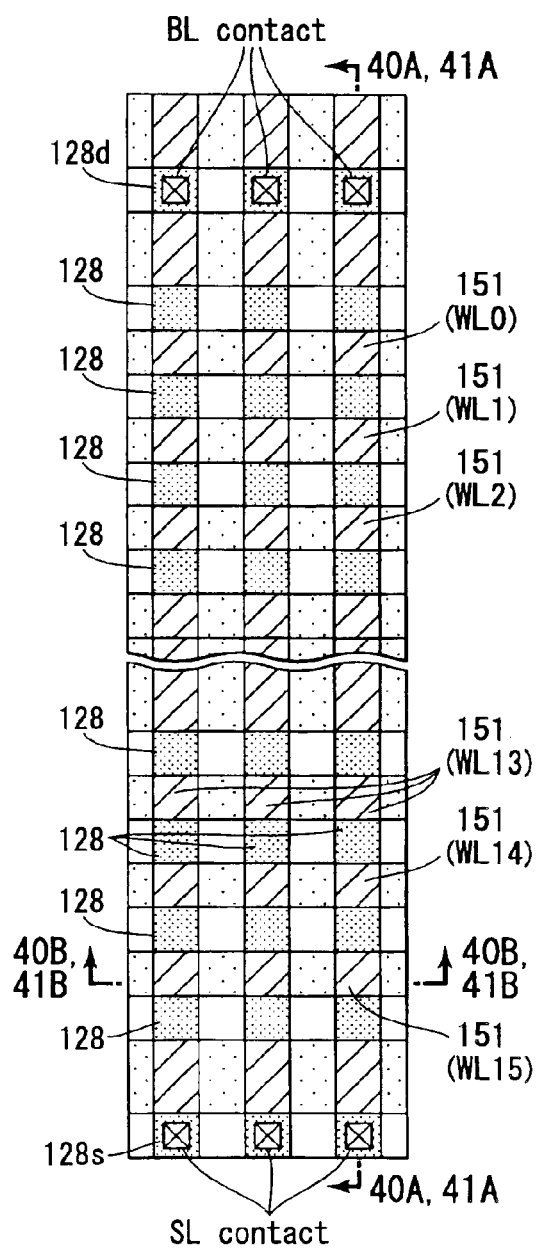
FIG. 39B is a plan view of FIG. 39A.

FIGS. 39A and 39B are an equivalent circuit diagram of a NAND cell unit (NAND cell block) and a plan view of three NAND cell units, respectively. In a NAND cell unit, nonvolatile memory cells M0 to M15 each having a floating gate composed of an insulating film, such as a silicon nitride film insulating film, or polycrystalline silicon are connected in series as a charge accumulation layer. One end of the charge accumulation layer is connected to a bit line BL via a select transistor S1 and the other end is connected to a common source line SL. The control gates of the memory cells M0 to M15 are connected to word lines WL0 to WL15. The select transistors S1, S2 select one from a plurality of NAND cell units arranged along bit line BL and connects it to bit line BL. The gate electrodes of the select transistors S1, S2 are connected to select gates SSL, GSL, respectively.

The select gate lines SSL and GSL are made continuously of a conductive material in the direction of a row of the memory cell array in the same layer as that of the word lines WL0 to WL15 to which the control gates of the memory cells are connected. The NAND cell unit requires at least one select gate line SLL and at least one select gate line GSL. Although in the fifth embodiment, a NAND cell unit composed of 16 memory cells connected in series has been explained, the number of memory cells connected to bit lines and word lines has only to be more than one. Use of $2^n$ memory cells (n is a positive integer) is preferable to decoding addresses.

Figure 40A:
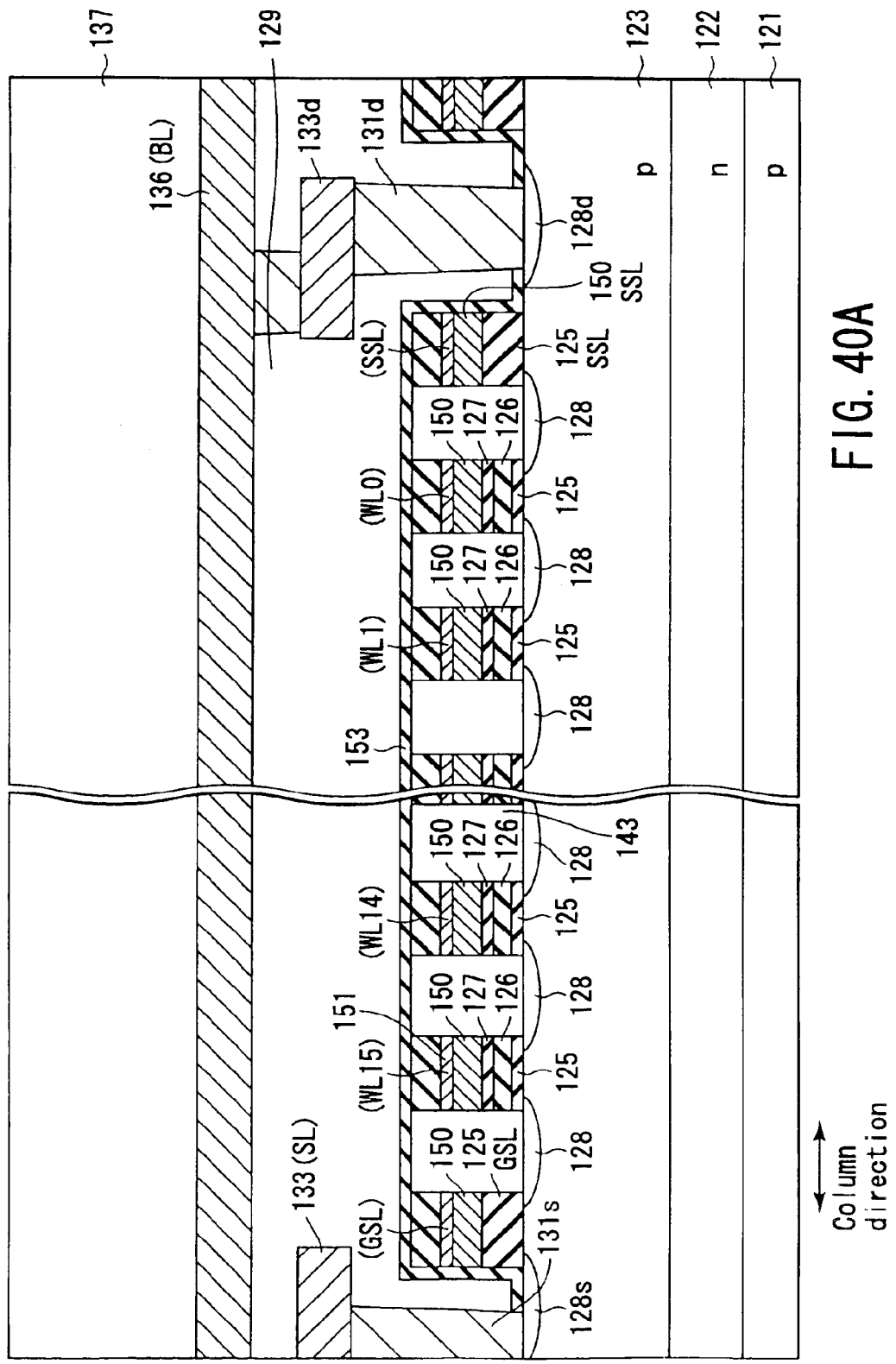
FIG. 40A is a sectional view taken along line 40A–40A' of FIG. 39B in the case of a MONOS memory cell.
Figure 40B:
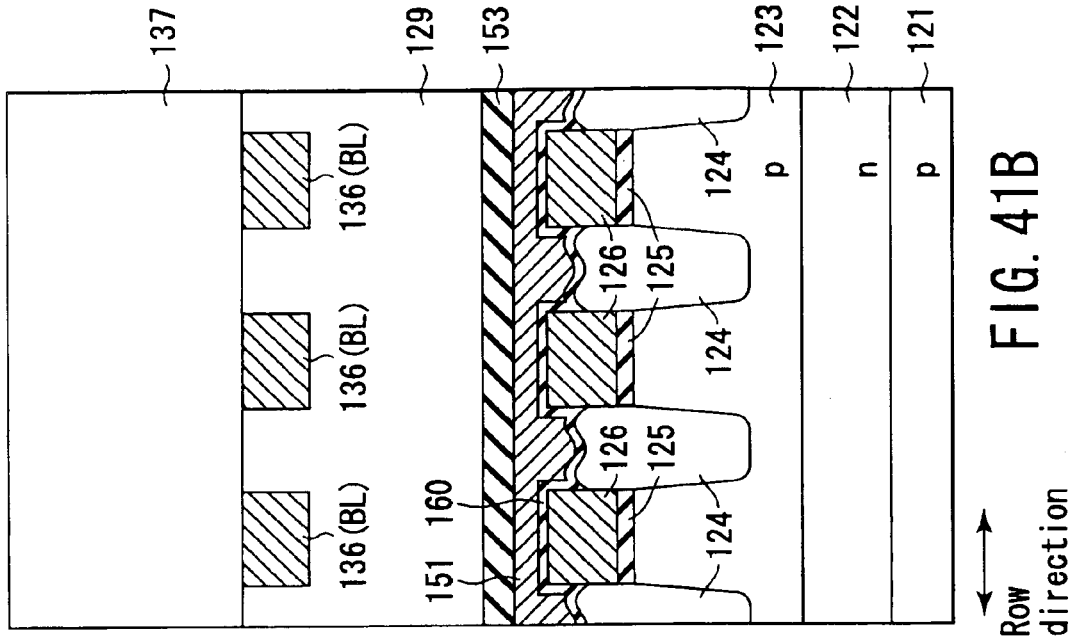
FIG. 40B is a sectional view taken along line 40B–40B' of FIG. 39B in the case of the MONOS memory cell.

FIGS. 40A and 40B show sectional views taken along line 40A–40A' and line 40B–40B' of FIG. 39B, respectively. A cell array is formed in a p-well 123 formed in an n-well 122 on a p-type silicon substrate 121. In the p-well 123, for example, the boron concentration is set in the range of $10^{14}$ cm$^{-3}$ to $10^{19}$ cm$^{-3}$. The p-well 123 is isolated from the p-type silicon substrate 121 by the n-type silicon region 122. A voltage can be applied to the p-well 123 independently. This reduces the load on the step-up circuit in an erase operation, suppressing the power consumption.

The gate insulating film of the memory cells M0 to M15 is composed of a tunnel insulating film 125 made of a silicon oxide film or silicon oxynitride film of 1 nm to 10 nm thick, a charge accumulation layer 126 of 3 nm to 50 nm thick made of, for example, a silicon nitride film on the tunnel insulating film 125, and a block insulating film 127 made of a silicon oxide film or silicon oxynitride film of, for example, 2 nm to 10 nm thick on the charge accumulation layer 126. The stacked tunnel insulating film 125, charge accumulation layer 126, and block insulating film 127 constitute an ONO-structure gate insulating film. A select transistor has a gate insulating film differing in film thickness from that of a memory cell.

On those gate insulating films, gate electrodes are formed. A gate electrode has a two-layer structure of a first-layer polycrystalline silicon film 150 put only in the element region and a second-layer polycrystalline silicon layer 151 which is laid on top of the first film 150 and serves as the word lines WL0 to WL15 and the select gate lines CSL, SSL.

The top of is covered with a mask insulating film 152 made of a silicon nitride film or silicon oxide film of 5 nm to 20 nm thick. Between individual cells, an interlayer insulating film 143 is embedded flat. Furthermore, all of the NAND cell unit including the memory cells M0 to M15 and select transistors S1, S2 is covered with a barrier insulating film 153 made of a silicon nitride film of 5 nm to 50 nm thick.

At the gate electrode, n-type diffused layers acting as the source and drain 128 are formed in a self-aligning manner.

The gate length of a memory cell is set to 0.5 μm or less and 0.01 μm or more. The source and drain n-type diffused layers 128 are formed to a thickness of 10 nm to 500 nm at, for example, a phosphorus, arsenic, or antimony surface concentration of $10^{17}$ cm$^{-3}$ to $10^{21}$ cm$^{-3}$. These n-type diffused layers 128 are shared by adjacent memory cells, thereby realizing a NAND cell unit.

Diffused layers 128s, 128d at both ends of the NAND cell unit are connected via an interlayer insulating film 129 to a common source line 133 and a bit line 136, respectively. Specifically, in the interlayer insulating film 129, contact plugs 131s, 131d are formed in an embedded manner and the common source line 133 (SL) is formed simultaneously with a relay electrode 133d on the bit line side. In addition, the bit line is laid in such a manner that it is connected to the relay electrode 133d.

Figure 41B:
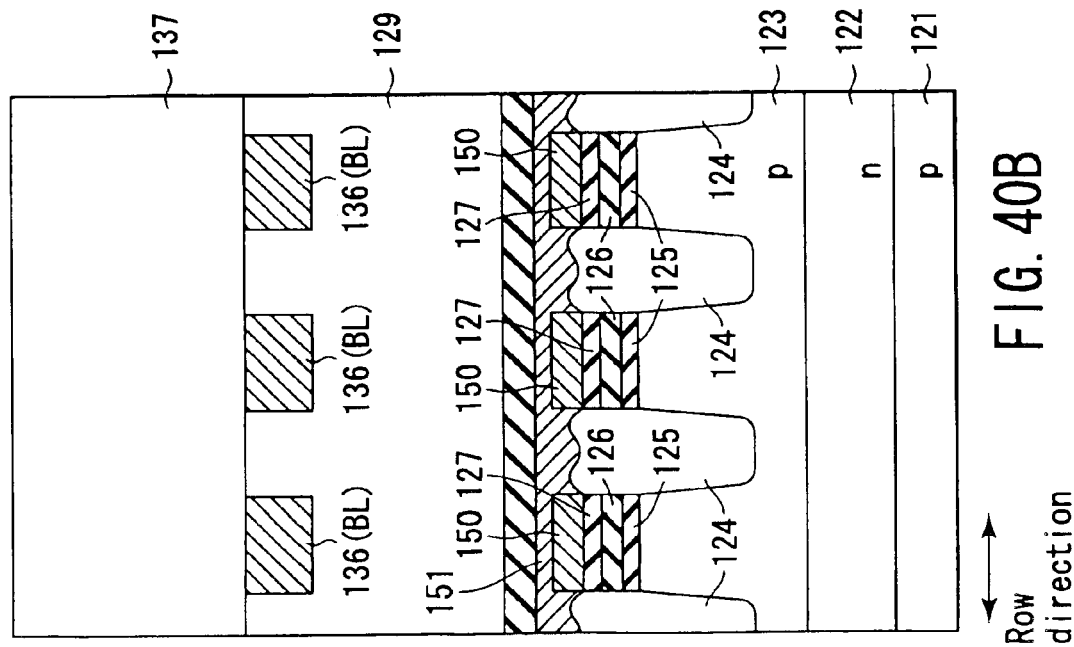
FIG. 41B is a sectional view taken along line 41B–41B' of FIG. 39B in the case of the floating-gate memory cell.
Figure 41A:
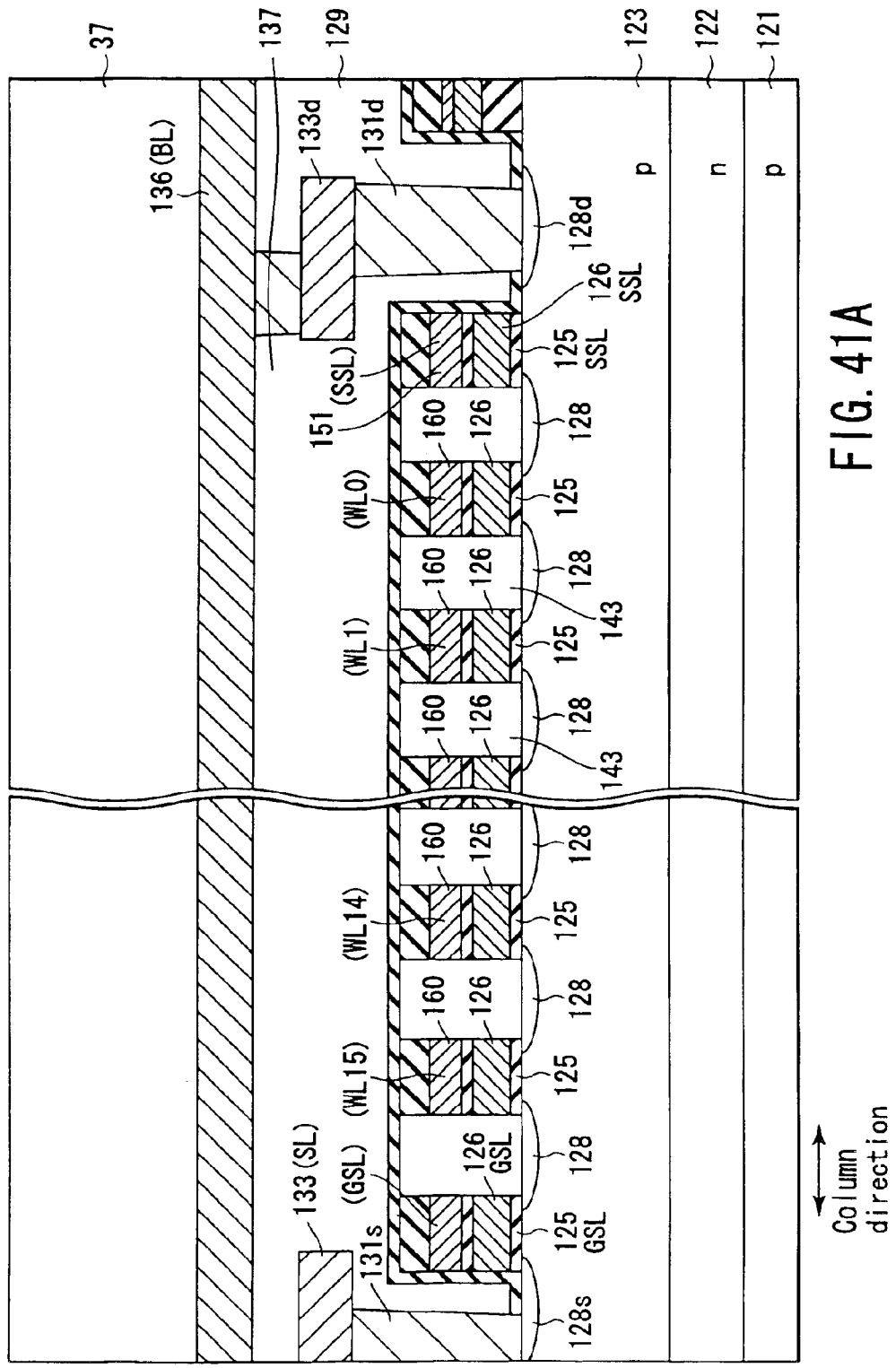
FIG. 41A is a sectional view taken along line 41A–41A' of FIG. 39B in the case of a floating-gate memory cell.

FIGS. 41A and 41B show a configuration of a floating-gate memory cell in such a manner that they correspond to FIGS. 40A and 40B, respectively. In this case, on the tunnel insulating film 125, a floating gate 126 is made of polysilicon as a charge accumulation layer. Above the floating gate 126, a control gate electrode 151 acting as a word line or a select gate is formed via an ONO film 160. The other parts are the same as those in FIGS. 40A and 40B.

Figure 43:
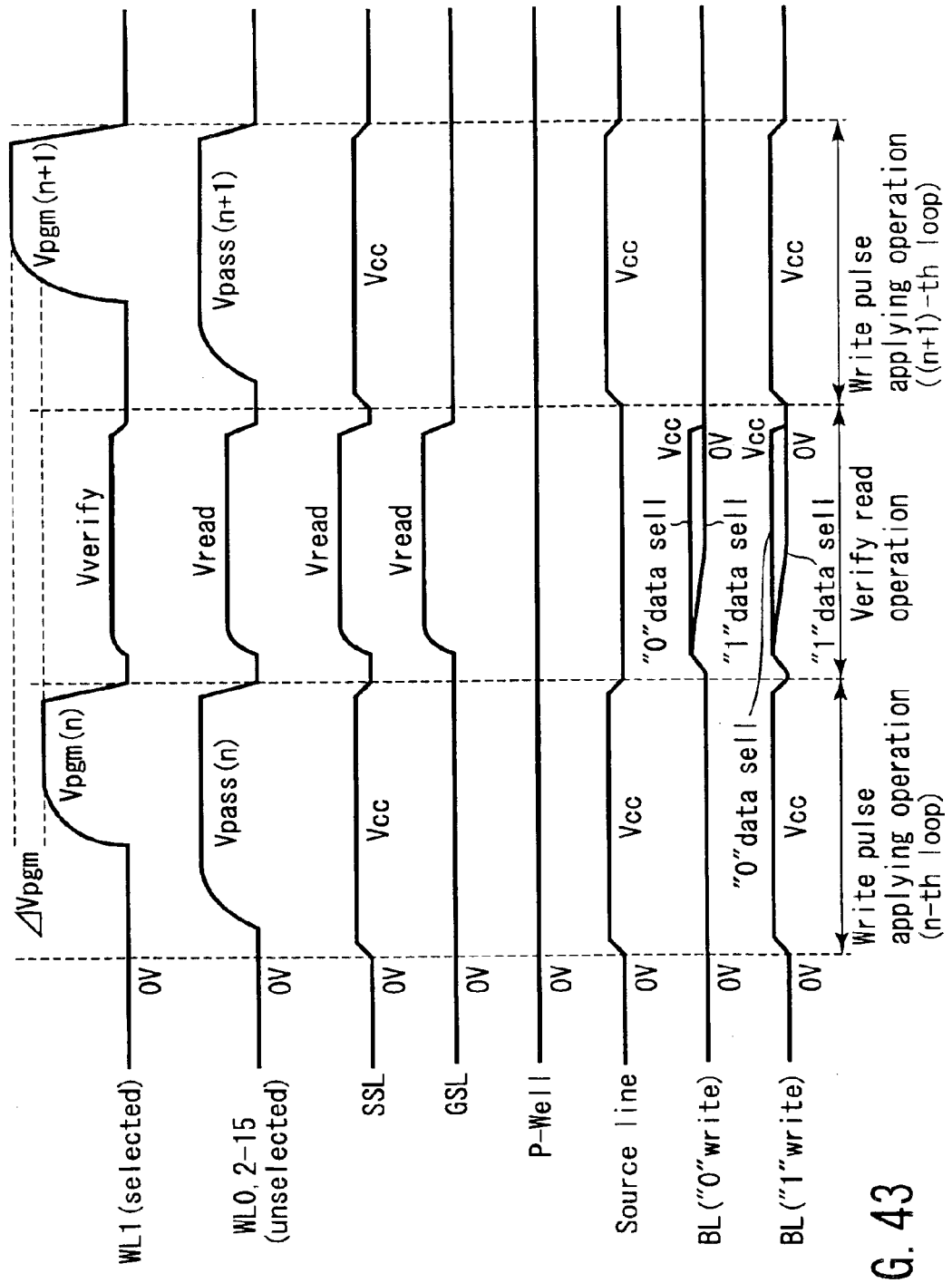
FIG. 43 is a timing chart for a write operation in the fifth embodiment.

FIG. 43 shows an example of the timing for a write pulse applying operation and a verify read operation in the fifth embodiment. Here, "0" write means that the threshold voltage of the memory cell is high (in the written state) and "1" write means that the threshold voltage of the memory cell is low (in the erased state). Immediately before a write operation is started, all of the memory cells are in the "1" state.

Figure 42:
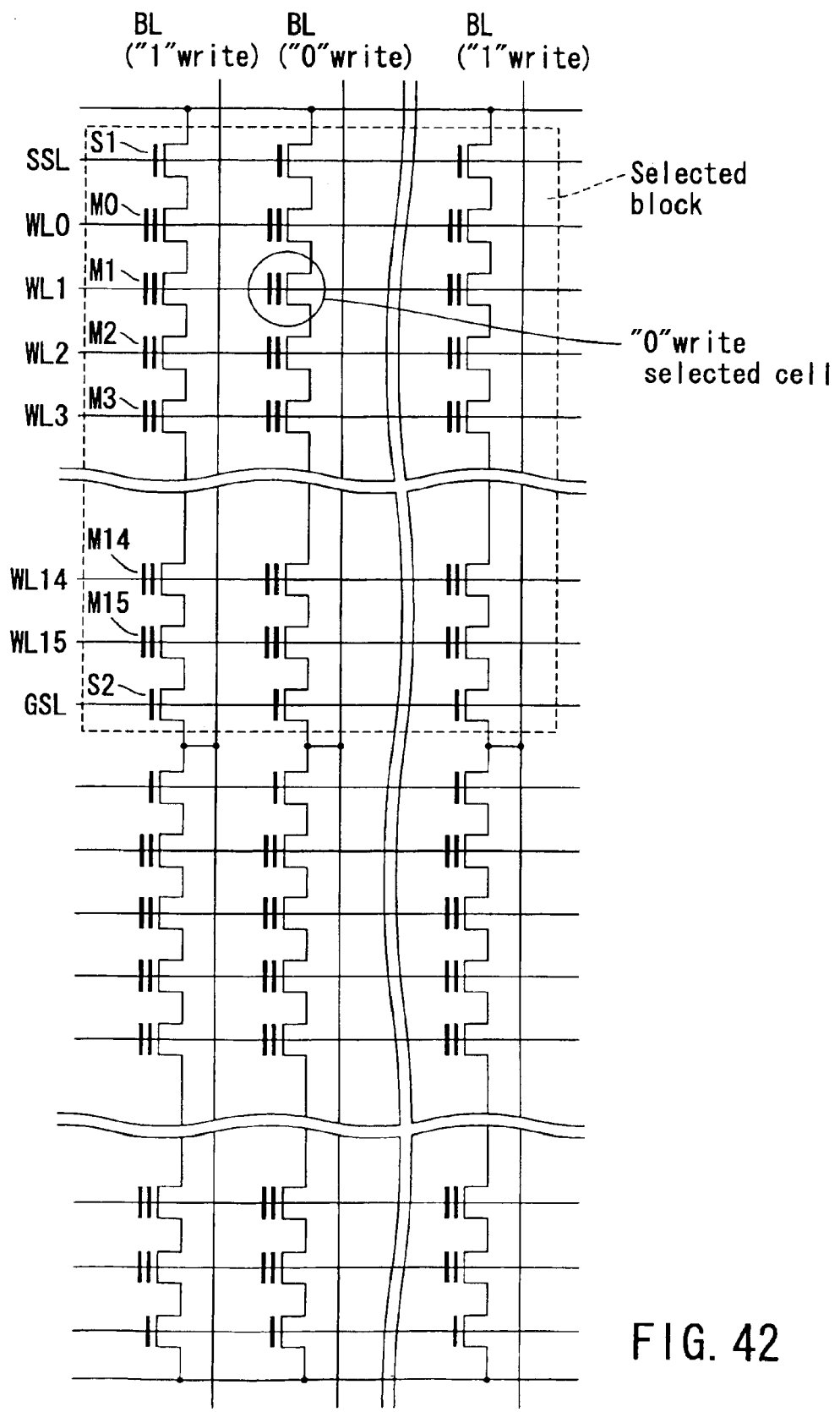
FIG. 42 is a diagram to help explain the way of selecting a memory cell in a write operation in the fifth embodiment.

The operation of the memory cell array of FIG. 42 will be explained, centering on the "0" written memory cell circled in the selected block enclosed by a broken line. In FIG. 43, WL1 shows the operation timing of the word line to which the memory cell selected for "0" write is connected and WLφ, WL2 to WL15 show the operation timing of the word lines not selected for writing. SSL shows the operation timing of a select gate line on the bit line side. P-Well shows the operation timing of a p-well in which the memory cell array 100 has been configured. Source line shows the operation timing of a source line in the memory cell array. BL ("1" write) shows the operation timing of the bit line corresponding to "1" data write. BL ("0" write) shows the operation timing of the bit line corresponding to "0" data write.

FIG. 43 is a timing chart for the operation when the writing method explained in FIGS. 22 to 24 is used. Hereinafter, a first loop write operation (or n=1) and a verify read operation will be explained. When a write operation is started, the select gate line SSL, source line, and BL ("0" writing) change their voltage from the reference voltage 0V to the power-supply voltage Vcc. Then, the unselected word lines WL0, WL2 to WL15 are charged to an intermediate voltage of Vpass (1). Next, a write voltage of Vpgm(1) is applied to the selected word line WL1, thereby writing the data into the memory cell. At this time, Vpgm0 is applied to the control gate of the memory cell into which "0" is to be written and 0V is applied to its source, drain, and channel section.

Although the intermediate voltage Vpass(1) is applied to the control gates of the memory cells connected to the unselected word lines WL0, WL2 to WL15, writing is not done because the intermediate voltage Vpass is lower than the voltage necessary for writing. In addition, Vpgm(1) is applied to the control gate of the memory cell (the memory cell connected to BL ("1" write)) connected to the selected word line and not selected for writing. Since the voltages of the source, drain, and channel section are stepped up to a write disable intermediate voltage, the electric field applied to the gate insulating film is weaker than a sufficient electric field for writing. As a result, the data is not written.

The reason why the voltages of the source, drain, and channel section are stepped up to the write disable intermediate voltage is as follows. In a NAND cell block connected to the bit line BL ("1"write), Vcc is applied to the control gate of the bit-line-side select transistor and the bit-line-side diffused layer. If the threshold voltage of the select transistor is Vthsg, the potential of the source-line-side diffuse layer is Vcc−Vthsg, making the selected transistor nonconducting. In addition, 0V is applied to the control gate of the source-line-side select transistor. Since 0V is lower than the threshold of the select transistor, the select transistor becomes nonconducting. As a result, the diffused layer of the NAND cell block connected to the bit line BL ("1" write) goes into the floating state. In this state, when the write voltage Vpgm(1) is applied to the control gate of the memory cell, the voltage of the channel section rises to the write disable intermediate potential, about half of the write voltage, but the memory cell is not written into.

Next, when a verify read operation is started, the bit line is precharged at Vb1. Then, the verify voltage Vverify is applied to the selected word line WL1 and the read intermediate voltage Vread is applied to the unselected word lines WL0, WL2 to WL15, and select gate lines SSL and GSL. When the selected memory cell holds "0" data (in the written state), no memory cell current flows, with the result that the bit line remains at Vb1. When the selected memory cell holds "1" data (in the erased state), memory cell current flows, with the result that the potential of the bit line drops. A sense amplifier senses the potential change and reads the state of the data. On the basis of the state of the data, it is determined whether the data write operation has been completed. If the result of the determination has shown that the write operation has not been completed, each of the write voltage and the write intermediate voltage is stepped up and a second write pulse applying operation is carried out.

Figure 44A:
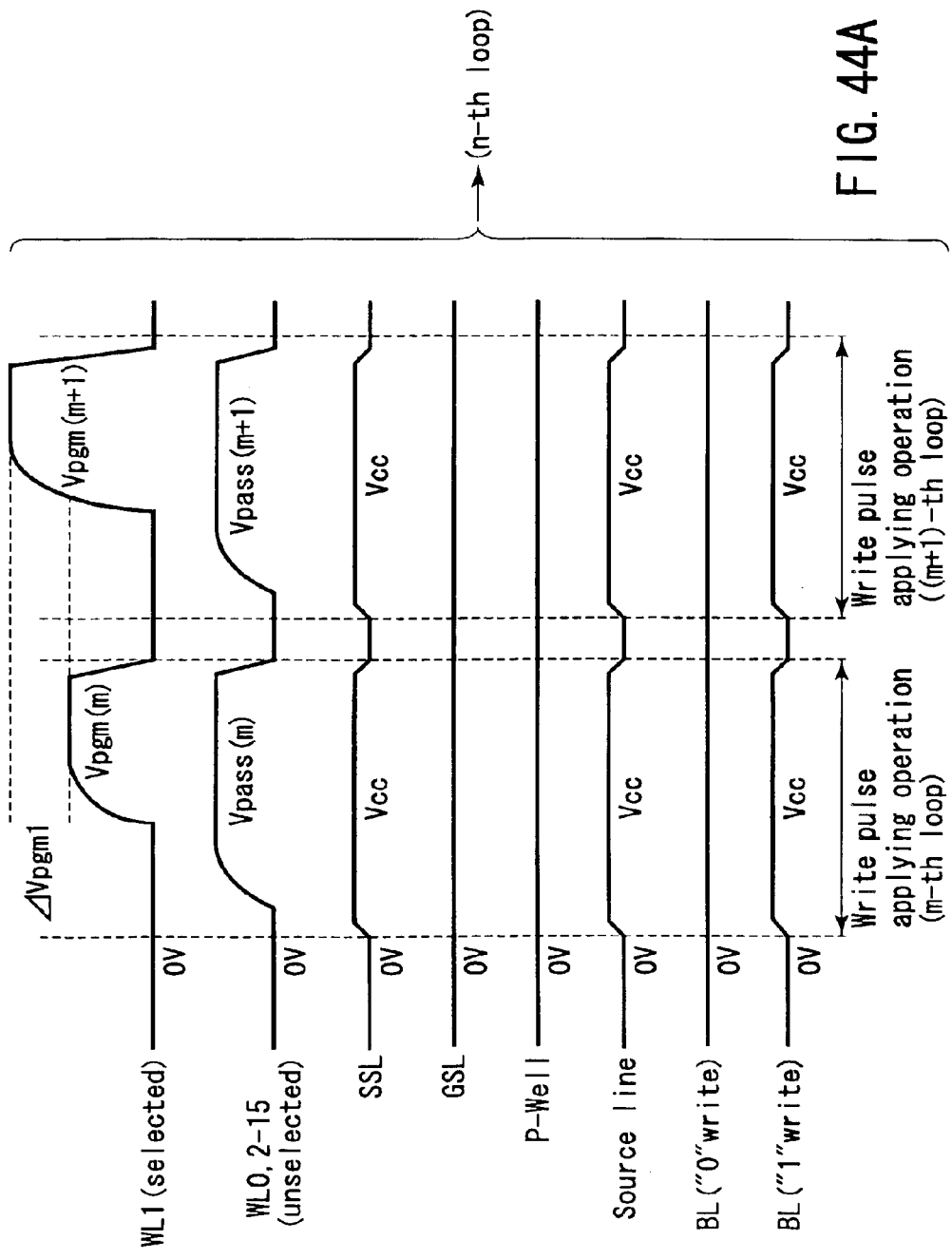
FIGS. 44A and 44B are another timing charts for a write operation in the fifth embodiment.
Figure 44B:
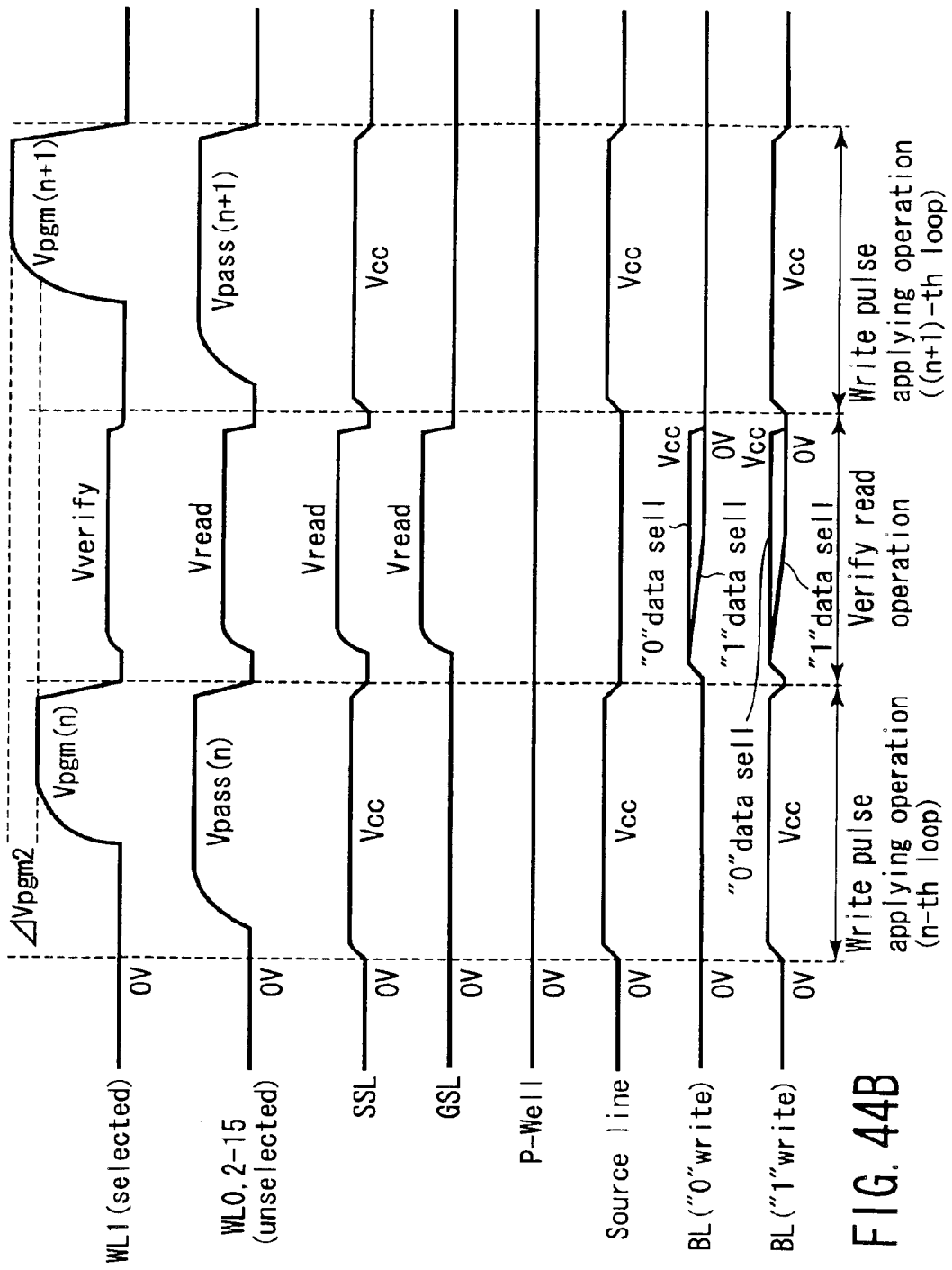

FIGS. 44A and 44B are timing charts for the operation when the writing method of the first embodiment explained in FIGS. 6 to 9 is used. This writing method is characterized in that the step-up voltage ΔVpgm1 in the first write operation is greater than the step-up voltage ΔVpgm2 in the second write operation and that a verify write operation is not carried out in the first write operation. Moreover, the write pulse applying time in the first write operation is shorter than the write pulse applying time in the second write operation.

In addition, the write operation and erase operation explained in each of the above embodiments can be used. In the write or erase operation explained in FIGS. 6, 10, 14, 15, 17, 20, and 21, a verify read operation immediately after the first pulse is applied in the second write or erase operation may be eliminated. Even when such a verify read operation is eliminated, the same effect as described above is achieved.

While in each of the above embodiments, a NAND cell array has been used, the method of arranging memory cells in the present invention is not limited to the NAND structure explained in the embodiments. Even when the present invention is applied to the AND structure shown in FIG. 45, the NOR structure shown in FIG. 46, the virtual grand array structure shown in FIG. 47, or the like, the same effect as that of each of the above embodiment is produced.

[Sixth Embodiment]

Next, a sixth embodiment of the present invention will be explained.

Jpn. Pat. Appln. KOKAI Publication No. 07-169284 has disclosed, for example, a method of writing data, while keeping the step-up width of the write voltage (the step-up voltage width) constant and the write time constant. In addition, Jpn. Pat. Appln. KOKAI Publication No. 11-31391 has disclosed a method of decreasing the step-up voltage width progressively, while keeping the write time constant.

Figure 2:
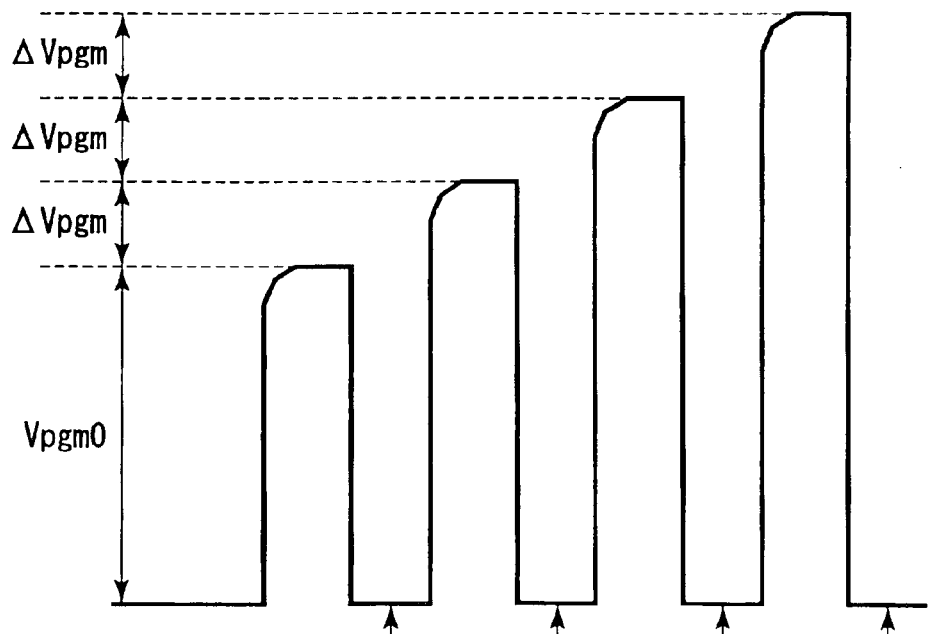
FIG. 2 shows a data write operation waveform in a floating gate memory cell.
Figure 48:
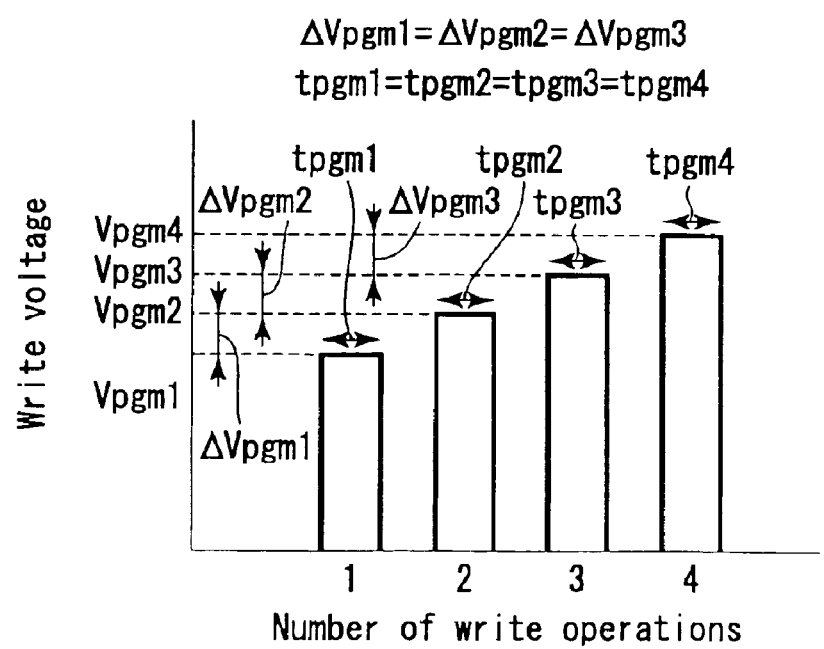
FIG. 48 shows the relationship between the number of write operations and the write voltage in the prior art.

FIG. 48 shows a write voltage and the number of write operations related to a conventional writing method similar to the invention shown in FIG. 2 disclosed in Jpn. Pat. Appln. KOKAI Publication No. 07-169284. FIG. 48 shows a case where a write operation is completed by four write operations. Second and later step-up voltage widths have the same value as that of the step-up voltage width $\Delta Vpgm$ between a first write voltage Vpgm1 and a second write voltage Vpgm2. The width of a rectangular bar in the bar graph represents the write time. The write time tpgm is constant, regardless of the number of write operations. In this way, with $\Delta Vpgm$ being constant, as the write voltage is made higher, the application of the write voltage and the verification of the threshold voltage are carried out repeatedly. When the threshold voltages of all of the memory cells connected to the same word line have reached a specific value, the writing of the memory cells connected to the word line is completed. This operation is carried out word line by word line in sequence, thereby writing the data into all of the memory cells.

Next, referring to FIGS. 49 and 50, a change in the threshold voltage distribution of the memory cell produced by four conventional write operations will be explained.

Figure 49:
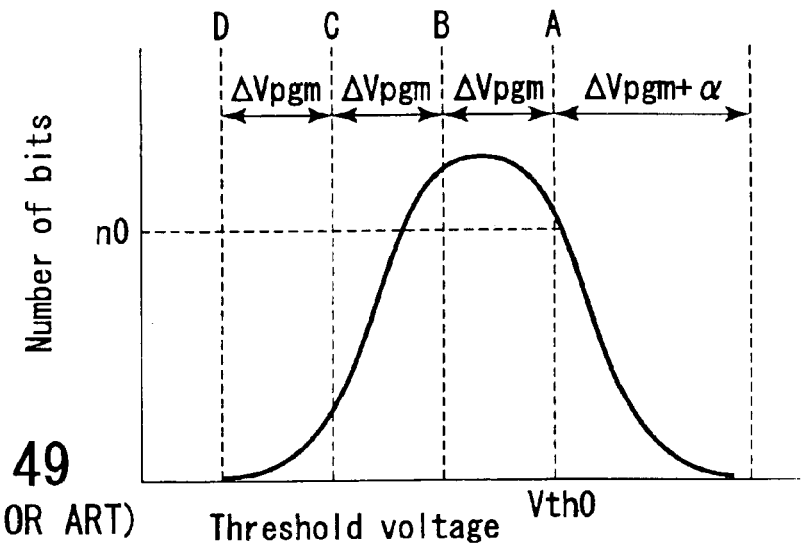
FIG. 49 shows a threshold voltage distribution in a memory cell after a first write operation in the prior art.

FIG. 49 shows a threshold voltage distribution of the memory cell after writing is done at the first write voltage Vpgm1. In the figure, solid line A indicates a specific threshold voltage of Vth0 after writing and dotted lines B, C, and D indicate the threshold voltages of the memory cells whose threshold voltage reaches Vth0 in a second, a third, and a fourth write operation, respectively. The number of memory cells whose threshold voltage is the highest among the memory cells written into in the second write operation is assumed to be n0. It is known that, after all of the write operations have been completed, the distribution width of the threshold voltages of the memory cells is greater than the step-up voltage, because the distribution width is varied as a result of being influenced by the data stored in the adjacent memory cells. For this reason, the step-up voltage width is made smaller than the value obtained by dividing the threshold voltage width resulting from one write operation by the number of write operations. That is, when the width of the threshold voltage distribution is $4\Delta Vpgm+\alpha$ ($\alpha>0$), the step-up voltage width is set to $\Delta Vpgm$. At this time, in one write operation, the threshold voltage distribution width of the a memory cell whose threshold voltage is higher than a specific threshold voltage of Vth0 is $\Delta Vpgm+\alpha$.

Figure 50:
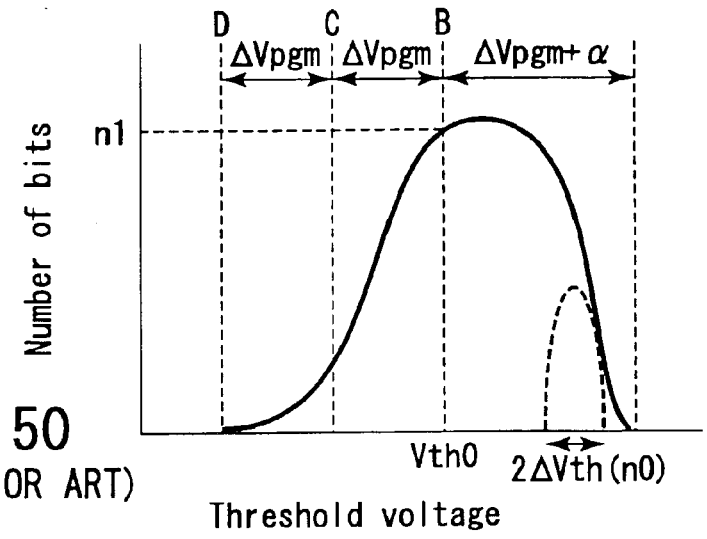
FIG. 50 shows a threshold voltage distribution in the memory cell after a second write operation in the prior art.

FIG. 50 shows a threshold voltage distribution of memory cells after the second write operation is carried out. Variations in the threshold voltages of n0 memory cells whose threshold voltage becomes the highest in the second write operation are represented by a dotted line in FIG. 50. If half of the variation width is $\Delta Vth(n0)$, the write voltage is stepped up by $\Delta Vpgm$. As a result, the threshold voltage distribution width of the memory cells whose threshold voltage is higher than Vth0 in the second write operation is $\Delta Vpgm+\Delta Vth(n0)$. Here, since $\alpha$ is half the variation width when data is written into more than n0 memory cells, it follows that $\alpha>\Delta Vth(n0)$.

Figure 51:
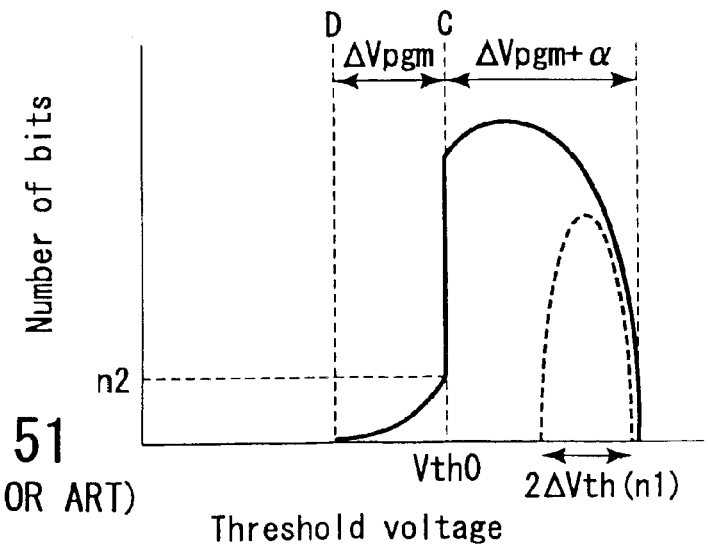
FIG. 51 shows a threshold voltage distribution in the memory cell after a third write operation in the prior art.
Figure 52:
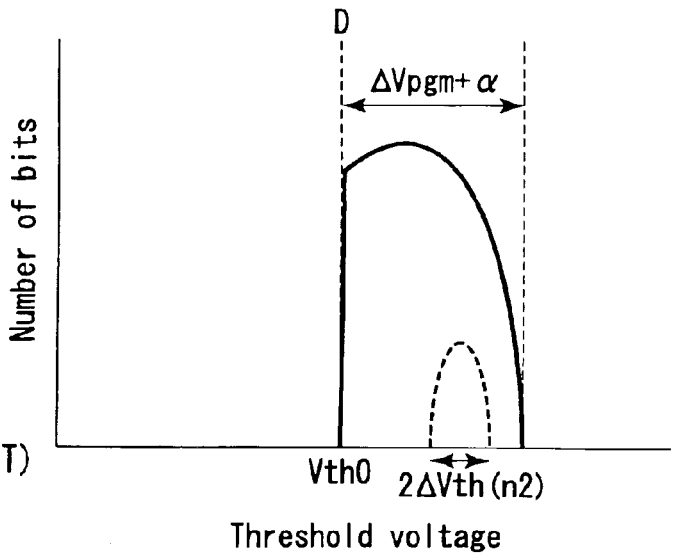
FIG. 52 shows a threshold voltage distribution in the memory cell after a fourth write operation in the prior art.

FIGS. 51 and 52 show threshold voltage distributions after a third and a fourth write operation, respectively. It is assumed that, of the memory cells written into in the third and fourth write operations, the number of memory cells whose threshold voltage is the highest is n1 and n2, respectively, and that the variations in the threshold voltages of these memory cells in the third and fourth write operations are $\Delta Vth(n1)$ and $\Delta Vth(n2)$. Since a is half the variation width when data is written into more than n1 and n2 memory cells, it follows that $\alpha>\Delta Vth(n1)$ and $\alpha>\Delta Vth(n1)$.

In the fourth write operation, the threshold voltages of all of the memory cells become higher than the specific threshold voltage Vth0 and the write operation is completed. The threshold voltage distribution width after the all of the write operations have been completed is $\Delta Vpgm+\alpha$, as shown in FIG. 52.

Since variations in the threshold voltages of the memory cells connected to a word line take the form of a normal distribution due to variations in the manufacture, as the total number of memory cells increases, variations in the threshold voltages in writing data at the same voltage become larger. At this time, the write operation is ended without making the write time longer. That is, to carry out a write operation, while keeping the number of write operations constant, it is necessary to make $\Delta Vpgm$ larger.

However, as shown in FIG. 48, when $\Delta Vpgm$ is simply made larger, the step-up voltage width becomes greater in each write operation. As a result, the threshold distribution width ($\Delta Vpgm+\alpha$) after the completion of the write operation becomes greater, which causes the problem of impairing the controllability of the threshold distribution width.

Furthermore, when the first write voltage is lowered to increase the number of write operations without changing $\Delta Vpgm$ in order to prevent the threshold voltage from exceeding the maximum allowed value, the write time increases, making high-speed writing difficult.

Furthermore, in a method of decreasing the step-up voltage width $\Delta Vpgm$ gradually as disclosed in Jpn. Pat. Appln. KOKAI Publication No. 11-31391, as the number of write operations increases, the step-up voltage width $\Delta Vpgm$ decreases. As a result, the number of write operations necessary to set the threshold voltage of the memory cell written into slow to a specific value and therefore this causes the problem of increasing the write time.

The sixth embodiment makes it possible to set a specific threshold voltage in a memory cell at a high speed without increasing the number of write operations and the write time.

Figure 53:
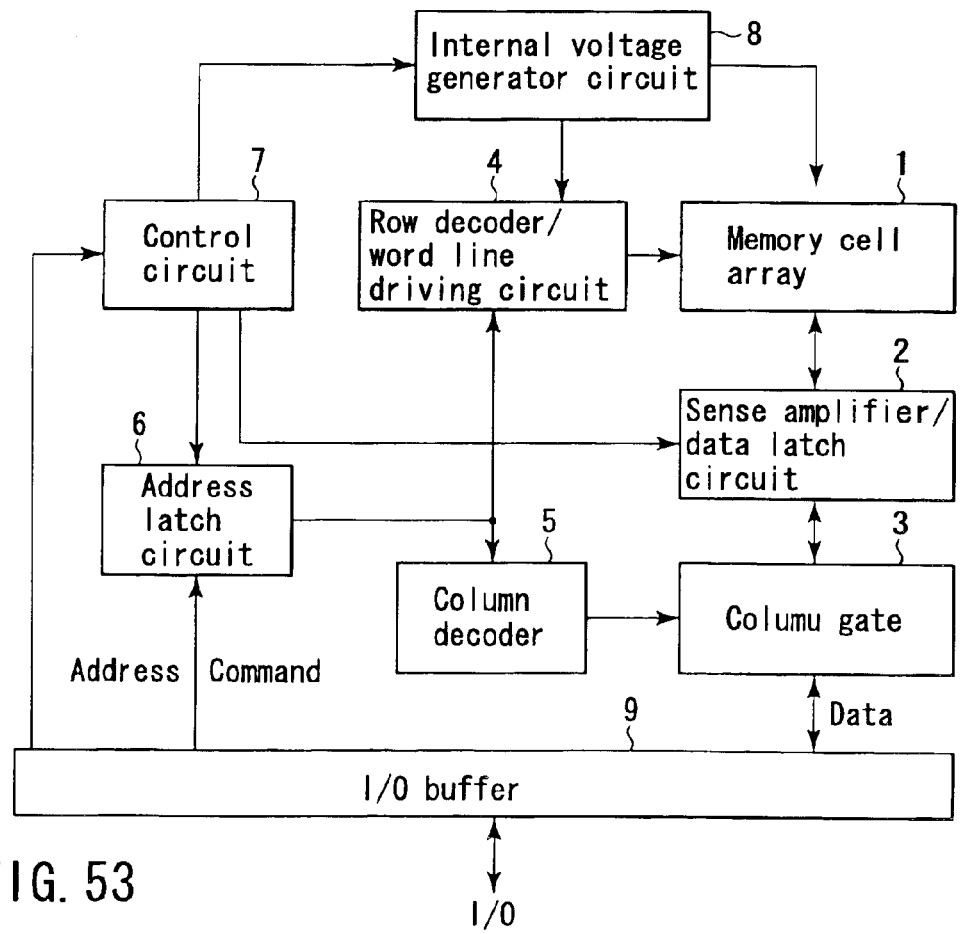
FIG. 53 schematically shows the configuration of a semiconductor nonvolatile semiconductor memory device according to the present invention.
Figure 54:
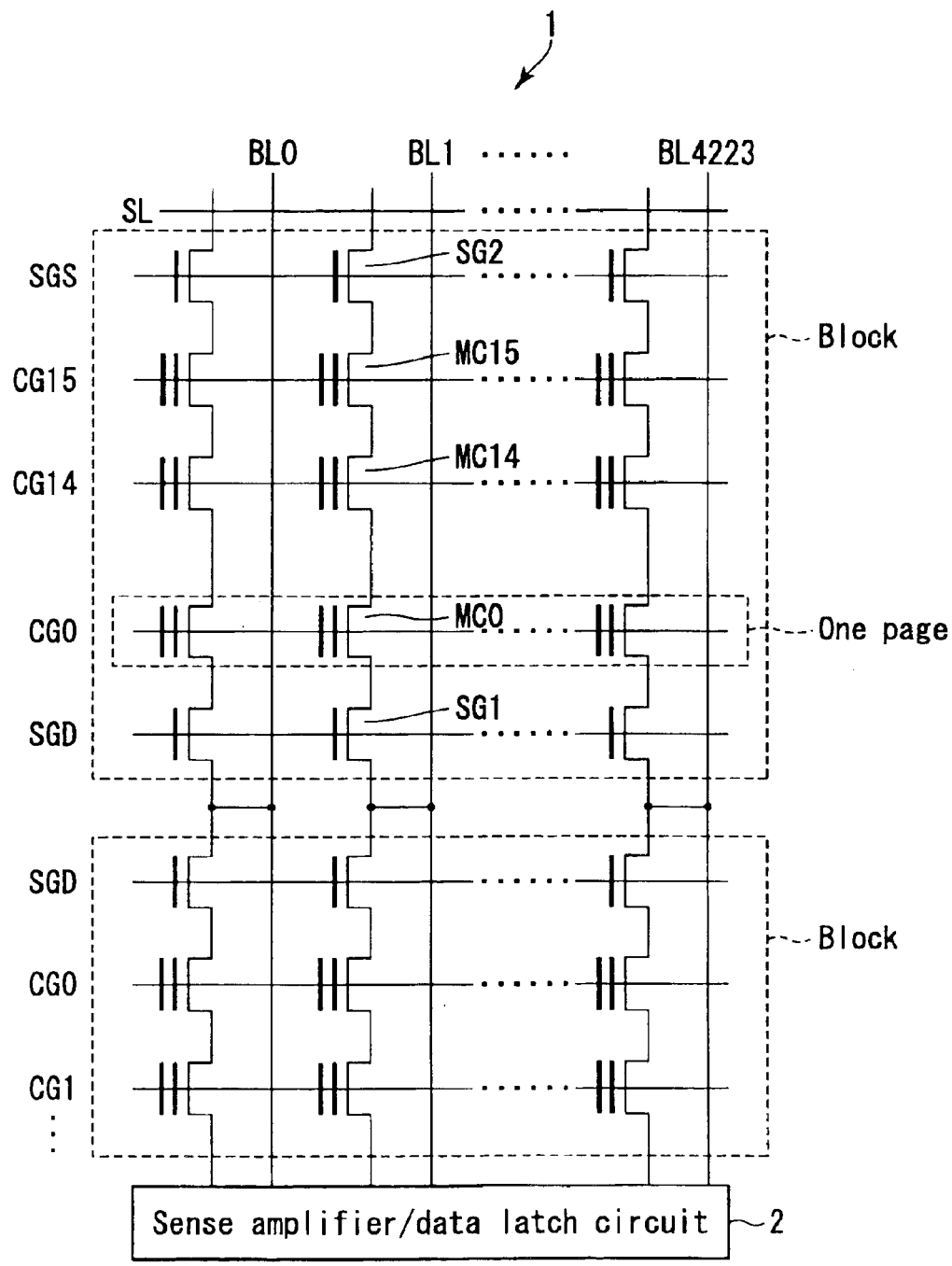
FIG. 54 is a schematic circuit diagram showing the configuration of the memory cell array shown in FIG. 53.

FIG. 53 schematically shows the configuration of a NAND nonvolatile memory. FIG. 54 schematically shows the configuration of a memory cell array. As shown in FIG. 54, a memory cell array 1 is composed of a plurality of NAND cell units. In each NAND cell unit, a plurality of (in the example of FIGS. 54, 16) memory cells MC (MC0 to MC15) are connected in series in such a manner that the adjacent cells share their source and drain diffused layers. The memory cells MC are MOSFETs with a stacked gate structure where a floating gate and a control gate are stacked one on top of the other. One end of the NAND cell unit is connected via select gate SG1 to a bit line BL. The other end of the NAND cell unit is connected via select gate SG2 to a common source line SL.

The control gates of the memory cells arranged in the row direction are connected in common to a control gate line (word line) CG (CG0 to CG15). The gates of select gates SG1 arranged in the row direction are connected to a select gate line SGD. The gates of select gates SG2 arranged in the row direction are connected to a select gate line SGS.

The area where the memory cells are connected to a single control gate line CG is an area into which data is written in unison and which constitutes one page. A plurality of NAND cell units arranged in the row direction constitute a block. The data is erased in blocks in unison.

The bit line BL of the memory cell array 1 is connected to a sense amplifier/data latch circuit 2. The sense amplifier/data latch circuit 2 is connected to an I/O buffer 9 via a column gate 3 driven by a column decoder 5 shown in FIG. 53. The sense amplifier/data latch circuit 2 senses the data read from a memory cell and latches the data to be written into a memory cell. In addition, the sense amplifier/data latch circuit 2 latches the voltage read from a memory cell to check the threshold voltage of the data written in a write operation.

A row decoder/word line driving circuit 4 is also connected to the memory cell array 1. The row decoder/word line driving circuit 4 selects and drives the control gate line of the memory cell array 1. An address latch circuit 6 is also connected to the I/O buffer 9. The address latch circuit 6 holds an external address supplied from the I/O buffer 9 and supplies the address to the column decoder 5 and the row decoder/word line driving circuit 4.

A control circuit 7 controls the sense amplifier/data latch circuit 2, address latch circuit 6, and an internal voltage generator circuit 8 on the basis of a command supplied from the I/O buffer 9. Specifically, the control circuit 7 controls the operation of writing data and verifying the writing of data and the operation of erasing the data and verifying the erasing of the data. The internal voltage generator circuit 8, which includes, for example, a step-up circuit, generates various levels of voltages for a necessary length of time according to each operation mode. Specifically, the internal voltage generator circuit 8 generates, for example, a write voltage of Vpgm supplied to the selected control gate line in a write operation. The internal voltage generator circuit 8 also generates an erase voltage of Vera supplied to the well in an erase operation. Furthermore, the internal voltage generator circuit 8 generates a verify voltage for verifying the threshold voltage of the memory cell after the write operation and a verify voltage for verifying the erasure after the erase operation. In addition, the internal voltage generator circuit 8 generates necessary voltages for read operations and the like.

In the write operation, with the substrate (well) kept at a reference potential (e.g., the ground potential GND), Vpgm is applied to the control gate line for a specific time tpgm, thereby injecting electrons from the substrate into the floating gate, which changes the threshold voltages of the memory cells. After a first write operation, the threshold voltages of the memory cells are verified control gate line by control gate line. The memory cells whose threshold voltage has reached the specific threshold voltage are brought into the write disable state. After a second write operation is carried out with a stepped-up write voltage, the threshold voltage is verified. Thereafter, when the threshold voltages of all of the memory cells connected to the control gate line have reached the specific value, the operation of writing the data into the memory cells connected to the control gate line is completed. This operation is carried out on all of the remaining control gate lines sequentially, thereby completing the write operation on all of the memory cells.

The write operation will be explained concretely below.

Figure 55:
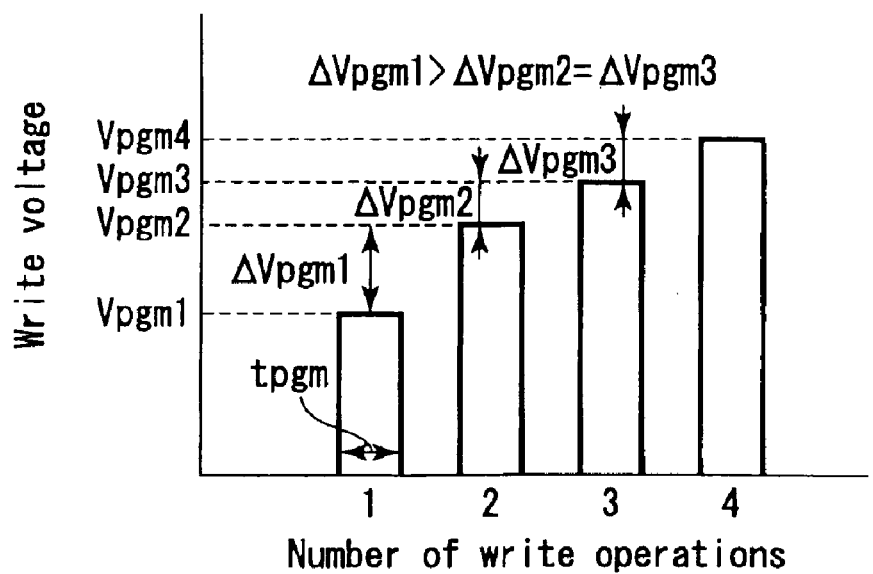
FIG. 55 shows the relationship between the number of write operations and the write voltage according to a sixth embodiment of the present invention.

FIG. 55 shows the dependence of the write voltage on the number of write operations in the sixth embodiment. In the sixth embodiment, a case where the write operation is completed by four write operations. The number of write operations is not limited to four and may be more than four.

In the sixth embodiment, the first write voltage Vpgm1 is set lower than that in the prior art and the step-up voltage width $\Delta$Vpgm1 between Vpgm1 and the second write voltage Vpgm2 is set greater than the second and later step-up voltage widths $\Delta$Vpgm2, $\Delta$Vpgm3. At this time, the second and later step-up voltage widths $\Delta$Vpgm2, $\Delta$Vpgm3 are set constant, regardless of the number of write operations. The width of a rectangular bar in the bar graph represents the write time. The write time is constant, regardless of the number of write operations.

Next, referring to FIGS. 56 to 59, a change in the threshold voltage distribution of memory cells using the writing method of the sixth embodiment will be explained.

Figure 56:
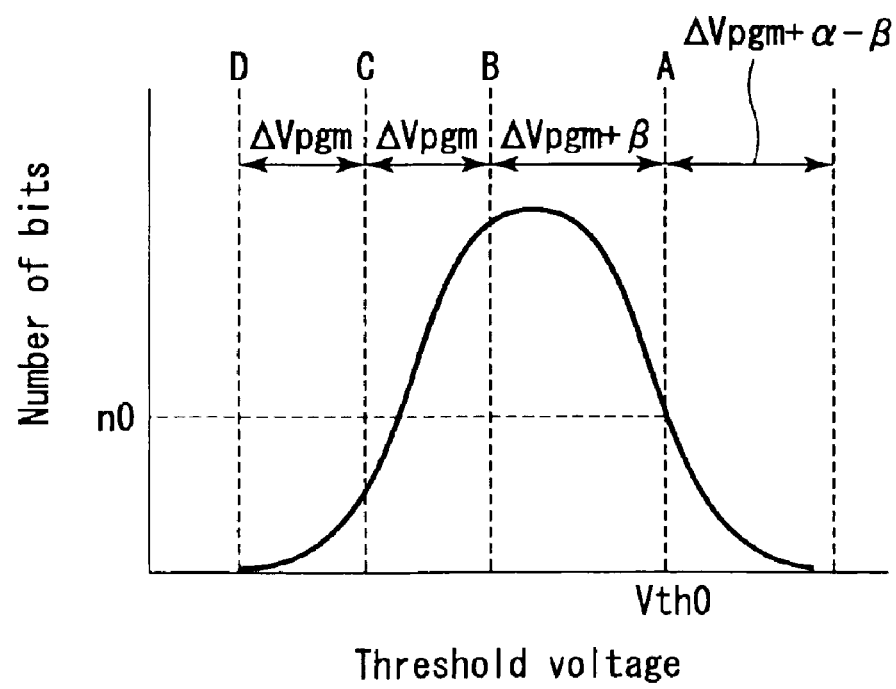
FIG. 56 shows a threshold voltage distribution of memory cells after a first write operation in the sixth embodiment.

FIG. 56 shows a threshold voltage distribution of memory cells after writing is done at the first write voltage Vpgm1. In the figure, solid line A indicates a specific write voltage of Vth0 and dotted lines B, C, and D indicate the threshold voltages of the memory cells whose threshold voltage reaches Vth0 in a second, a third, and a fourth write operation, respectively. In the first write operation, the threshold voltages of at least two memory cells become equal to or higher than Vth0. Of the memory cells written into in the second write operation, the number of memory cells whose threshold voltage is the highest is n0. It is assumed that, when the width of the threshold voltage distribution is 4$\Delta$Vpgm+$\alpha$, it follows that $\Delta$Vpgm1=$\alpha$Vpgm+$\beta$($\beta$>0) and $\alpha$Vpgm2=$\alpha$Vpgm3=$\alpha$Vpgm. Then, the threshold voltage distribution width of the memory cells whose threshold voltage is higher than Vth0 (the write operation is completed) is $\Delta$Vpgm+$\alpha$-$\beta$ as shown in FIG. 56.

Figure 57:
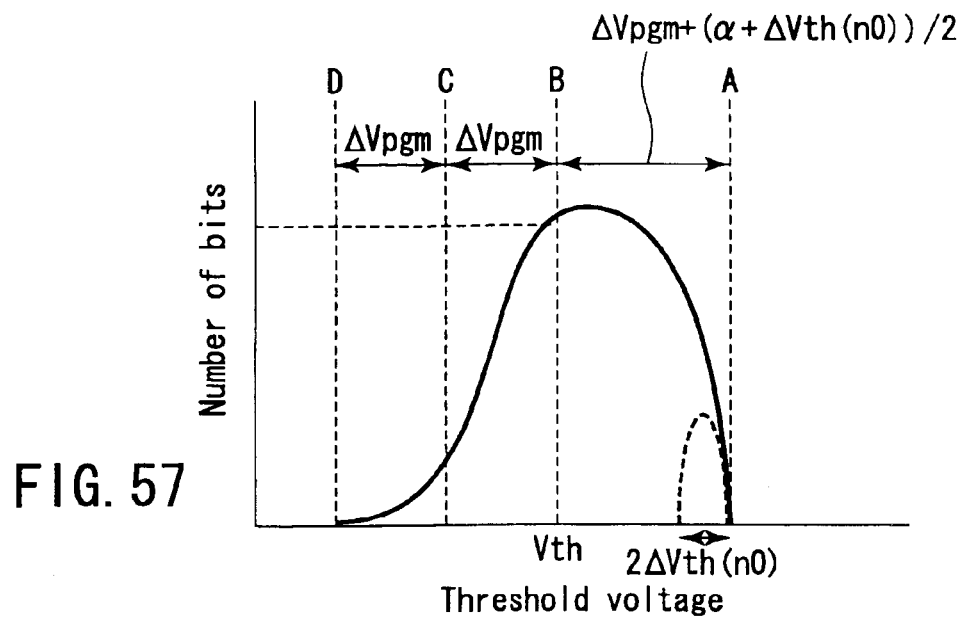
FIG. 57 shows a threshold voltage distribution of the memory cells after a second write operation in the sixth embodiment.

FIG. 57 shows a threshold voltage distribution of memory cells after the second write operation is carried out. In FIG. 57, a dotted line represents variations in the threshold voltages of n0 memory cells whose threshold voltage becomes the highest in the second write operation. If half of the variation width is $\Delta$Vth(n0), the threshold voltage distribution width of the memory cells whose threshold voltage is higher than Vth0 is $\Delta$Vpgm+$\beta$+$\Delta$Vth(n0), because the write voltage is stepped up by $\Delta$Vpgm+$\beta$ in the second write operation. The condition under which the threshold voltage distribution width $\Delta$Vpgm+$\alpha$-$\beta$ of the memory cells written into in the first write operation and the threshold voltage distribution width $\Delta$Vpgm++$\Delta$Vth(n0) of the memory cells written into in the second write operation both become the smallest is when $\beta$=($\alpha$-$\Delta$Vth(n0))/2 holds. At this time, the threshold voltage distribution width of the memory cells written into is $\Delta$Vpgm+($\alpha$+$\Delta$Vth(n0))/2.

On the other hand, in a conventional writing method with the step-up voltage remaining unchanged, the threshold voltage distribution width of the memory cells written into in the second operation is $\Delta$Vpgm+$\alpha$, which differ from the threshold voltage distribution width $\Delta$Vpgm+($\alpha$+$\Delta$Vth(n0))/2 in the writing method of the sixth embodiment by ($\alpha$-$\Delta$Vth(n0))/2.

Here, since $\alpha$ is half of the variation width when more than n0 memory cells are written into, the expression $\alpha$>$\Delta$Vth(n0) holds. Thus, it follows that ($\alpha$-$\Delta$Vth(n0))/2>0. Use of the writing method of the sixth embodiment enables the threshold voltage distribution width of the memory cells written into in the second operation to be made smaller than use of the conventional writing method.

Figure 58:
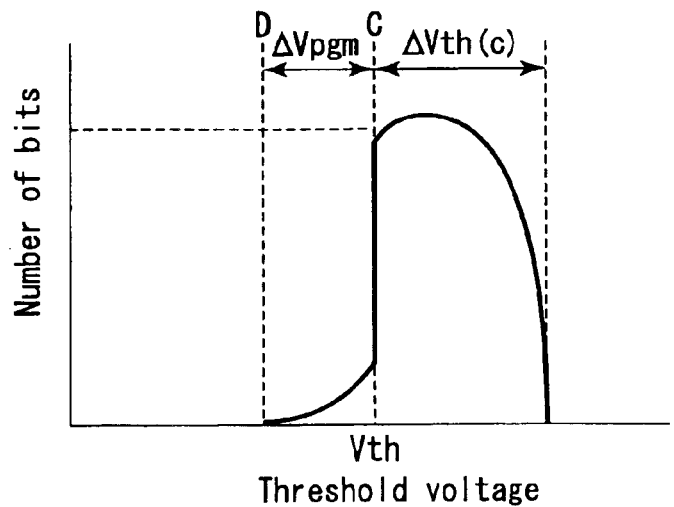
FIG. 58 shows a threshold voltage distribution of the memory cells after a third write operation in the sixth embodiment.
Figure 59:
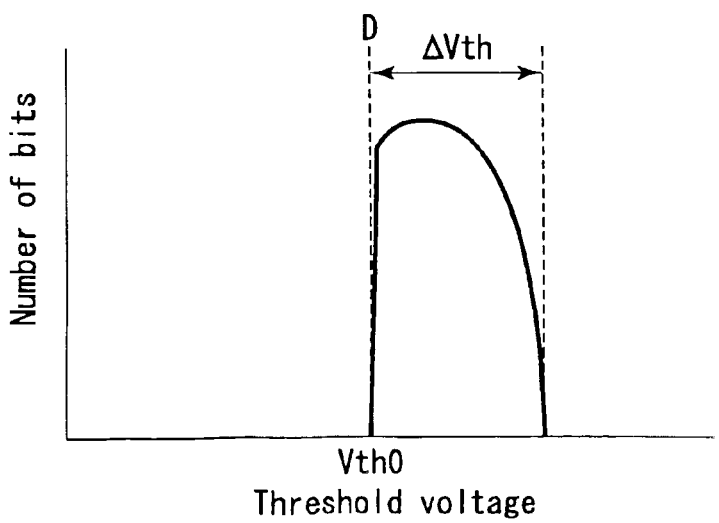
FIG. 59 shows a threshold voltage distribution of the memory cells after a fourth write operation in the sixth embodiment.

FIGS. 58 and 59 show threshold voltage distributions after the third and fourth write operations, respectively. The third and fourth write operations are the same as conventional write operations. Therefore, the threshold voltage distributions resulting from the third and fourth write operations are the same as those in the prior art. As a result, since the threshold voltage distribution produced by up to the second write operation is smaller, use of writing operations in the sixth embodiment enables the threshold voltage distribution width after the completion of all of the write operations to be made so much smaller.

Figure 60A:
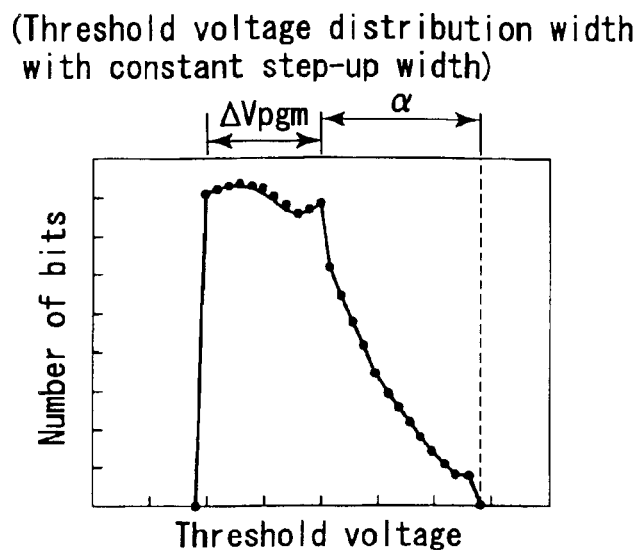
FIGS. 60A and 60B show the relationship between a threshold voltage distribution width and the number of bits in the prior art and that in the sixth embodiment, respectively.
Figure 60B:
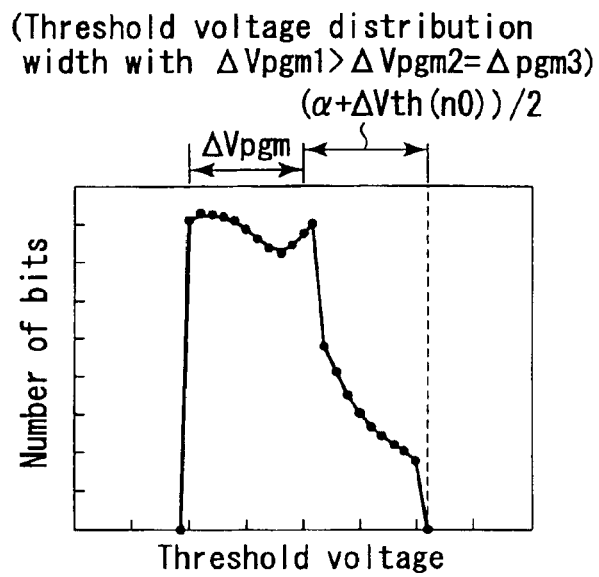

FIGS. 60A and 60B show a threshold voltage distribution after a write operation in prior art and that in the sixth embodiment. FIG. 60A shows a case where the step-up voltage width is made constant in the prior art. FIG. 60B shows a threshold voltage distribution after a write operation in the sixth embodiment. In the sixth embodiment, as shown in FIG. 60B, in the second write operation, the threshold voltage distribution width is $\Delta Vpgm+(\alpha 30\ \Delta Vth(n0))/2$. In the prior art of FIG. 60A, however, the threshold voltage distribution width is $\Delta Vpgm+\alpha$. Therefore, the threshold voltage distribution width in the sixth embodiment is narrower than that in the prior art by $(\alpha-\Delta Vth(n0))/2$.

Next, referring to FIGS. 61 to 64, the effect of the sixth embodiment will be explained in comparison with a conventional method of decreasing the step-up voltage gradually.

Figure 61:
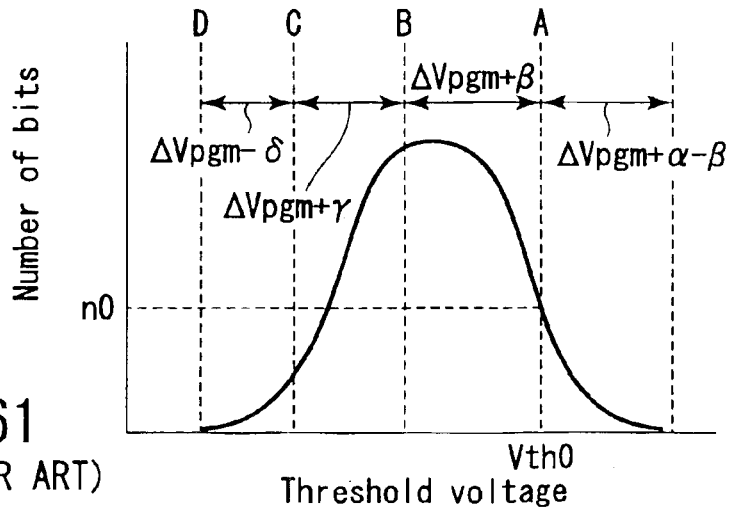
FIG. 61 shows a threshold voltage distribution of memory cells after a first write operation in one other conventional equivalent.

FIG. 61 shows a threshold voltage distribution of a memory cell after writing is done at the first write voltage Vpgm1 by the method of decreasing the step-up voltage gradually. In the figure, solid line A indicates a specific write voltage of Vth0 and dotted lines B, C, and D indicate the threshold voltages of the memory cells whose threshold voltage reaches Vth0 in a second, a third, and a fourth write operation, respectively. Of the memory cells written into in the second write operation, the number of memory cells whose threshold voltage is the highest is n0. The width of the threshold voltage distribution is $4\Delta Vpgm+\alpha$. If $\Delta Vpgm1=\Delta Vpgm+\beta(\beta>0)$, making $\beta$ larger than the value determined by the writing method of the sixth embodiment causes the threshold voltage distribution width $\Delta Vpgm+\beta$ of the memory cells written into in the second write operation to be larger than that in the sixth embodiment. As a result, the threshold voltage distribution width after the completion of all of the write operations becomes larger.

Figure 62:
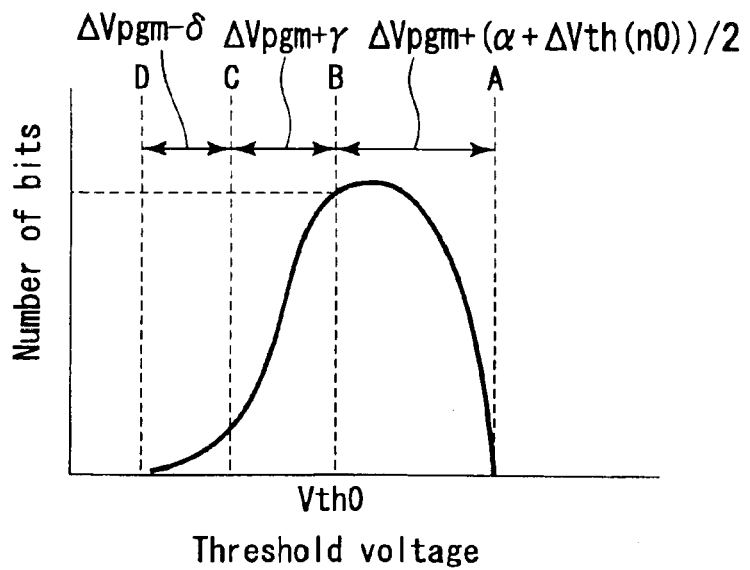
FIG. 62 shows a threshold voltage distribution of the memory cells after a second write operation in the one other conventional equivalent.

FIG. 62 shows a threshold voltage distribution width of the memory cells after the second write operation when $\beta$ is made equal to the above value determined by the writing method of the sixth embodiment, or when the value of $\beta$ is made smaller than the above value. Here, the first write voltage Vpgm1 is lower than the first write voltage Vpgm1 in the sixth embodiment.

If the step-up width $\Delta Vpgm2$ between the first write voltage and the second write voltage is $\Delta Vpgm+\gamma$ ($\beta>\gamma>0$), the voltage necessary to write the data into the memory cell the latest remains unchanged, regardless of the writing method. Therefore, when the number of write operations is the same, the step-up width $\Delta Vpgm3$ between the second write voltage and the third write voltage is $\Delta Vpgm-\delta(\delta>0)$.

Figure 63:
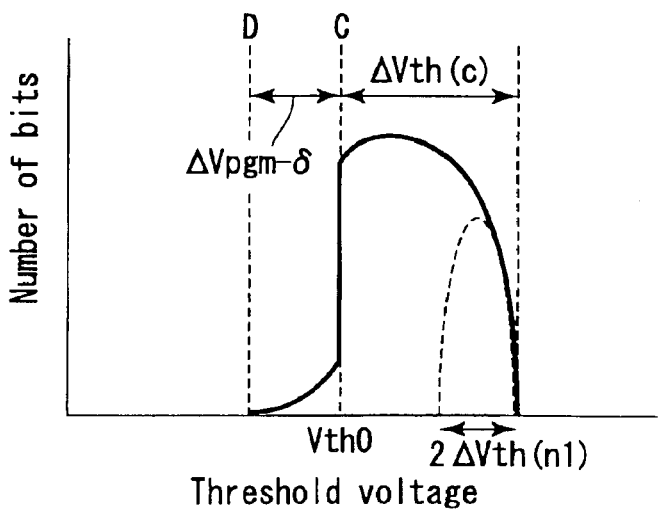
FIG. 63 shows a threshold voltage distribution of the memory cells after a third write operation in the one other conventional equivalent.

FIG. 63 shows a threshold voltage distribution of the memory cells after the third write operation is carried out. Since $\Delta Vpgm2$ is larger than $\Delta Vpgm$, the threshold voltage distribution width of the memory cells written into in the third write operation is larger than that in the writing method of the sixth embodiment. Furthermore, of the memory cells written into in the third write operation, if the number of memory cells whose threshold voltage is the highest is n1, then the threshold voltage distribution width of the memory cells written into in the third write operation is $\Delta Vpgm2+\gamma+\Delta Vth(n1)$.

Figure 64:
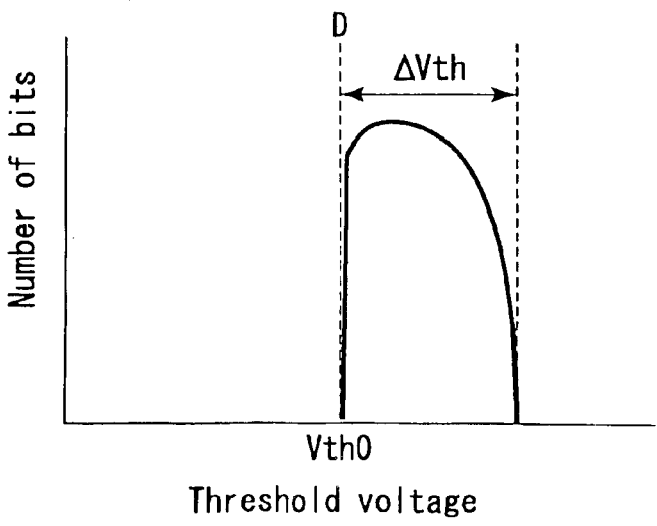
FIG. 64 shows a threshold voltage distribution of the memory cells after a fourth write operation in the one other conventional equivalent.

Since the threshold voltage distribution of the memory cells is a normal distribution, n1, the number of memory cells whose threshold voltage is the highest of the memory cells written into in the third write operation is much larger than n0, the number of memory cells whose threshold voltage is the highest of the memory cells written into in the second write operation. Therefore, as shown in FIG. 63, $\Delta Vth(n1)$, half of the threshold voltage variation when n1 memory cells are written into, becomes very large. As a result, the threshold voltage distribution width $\Delta Vpgm+\gamma+\Delta Vth(n1)$ of the memory cells written into in the third write operation is larger than the threshold voltage distribution width $\Delta Vpgm+\beta+\Delta Vth(n0)$ of the memory cells written into in the second write operation. That is, the threshold voltage distribution width $\Delta Vth(c)$ of the memory cells written into in the third write operation is larger than $\Delta Vth(c)$ of FIG. 58 in the sixth embodiment. Therefore, the threshold voltage distribution width $\Delta Vth$ after the completion of the fourth write operation in FIG. 64 is larger than the threshold voltage distribution width $\Delta Vth$ of FIG. 59 in the sixth embodiment. Consequently, use of the writing method in the sixth embodiment enables the threshold voltage distribution width $\Delta Vth$ after the completion of all of the write operations to be made smaller than the conventional writing method.

The writing method in the sixth embodiment is such that the first write voltage Vpgm1 is set lower than that in the prior art, the step-up voltage width $\Delta Vpgm1$ between Vpgm1 and the second write voltage Vpgm2 is made greater than the second and later step-up voltage widths $\Delta Vpgm$, and the second and later step-up voltage widths $\Delta Vpgm$ are made constant, regardless of the number of write operations. That is, the number of cells whose threshold voltage exceeds the specific threshold voltage in the first write operation is made smaller. As a result, the threshold voltage distribution width of the memory cells after the completion of all of the write operations can be made smaller.

Furthermore, since the threshold voltage distribution width of the memory cells after the write operation can be made smaller without increasing the step-up voltage width and the number of write operations, high-speed writing is possible.

[Seventh Embodiment]

Figure 65:
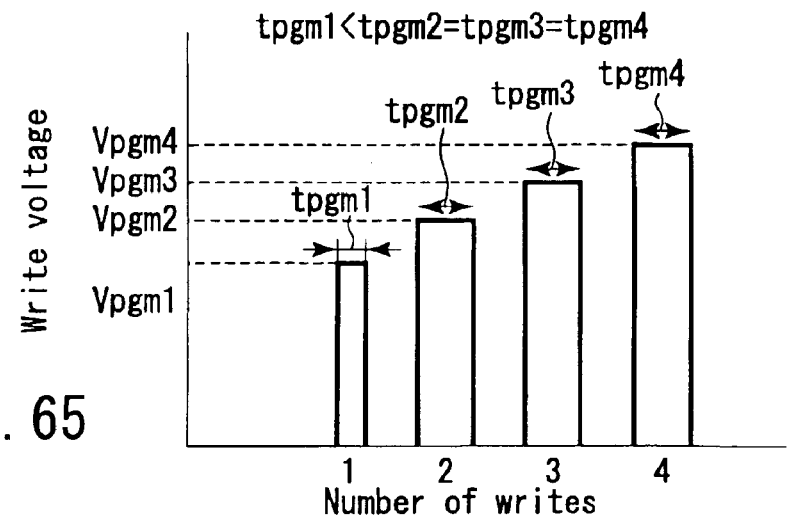
FIG. 65 shows the relationship between the number of write operations and the write voltage in a seventh embodiment of the present invention.

FIG. 65 is a diagram to help explain a writing method according to a seventh embodiment of the present invention, showing the dependence of the write voltage on the number of write operations. The method in the seventh embodiment is such that the first write time is made shorter than the second and later write times, thereby shortening the total write time and narrowing the threshold voltage distribution width of the memory cells after the completion of all of the write operations.

In the seventh embodiment, a case where the data is written by four write operations will be explained. As shown in FIG. 65, the first write time tpgm1 is made shorter than the second and later write times tpgm. The write voltage is increased in increments of a specific step-up voltage width of $\Delta Vpgm$.

When the first write operation is carried out under the above condition, the write voltage is the same as in the prior art, but the write time is shorter than in the prior art, with the result that variations in the threshold voltages of the memory cells written into are smaller than that in the prior art. Specifically, the number of memory cells whose threshold voltage exceeds a specific threshold voltage of Vth0 is smaller than in the prior art and the same threshold voltage distribution as that in the sixth embodiment shown in FIG. 56 is obtained. At this time, optimizing the write time tpgm1 enables $\beta$ of FIG. 56 to be made equal to the value determined in the sixth embodiment.

The second write operation is carried out under the same condition as in the sixth embodiment. Therefore, the threshold voltage distribution after the second write operation is as shown in FIG. 57. As a result, by shortening the write time tpgm1 and optimizing the value of β, the threshold voltage distribution width of the memory cells whose threshold voltage has exceeded Vth0 can be made smaller than that in the prior art.

Thereafter, the third and fourth write operations are carried out in the same manner as in the first embodiment, producing threshold voltage distributions shown in FIGS. 58 and 59.

Consequently, as in the sixth embodiment, in the seventh embodiment, the threshold voltage distribution width after the completion of all the write operations can be made smaller than in the prior art and high-speed writing can be realized.

[Eighth Embodiment]

Figure 66:
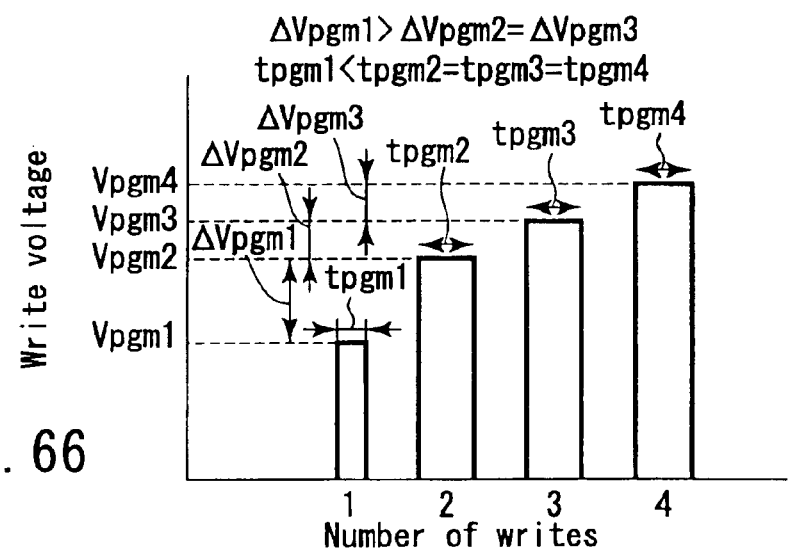
FIG. 66 shows the relationship between the number of write operations and the write voltage in an eighth embodiment of the present invention.

FIG. 66 is a diagram to help explain a writing method according to an eighth embodiment of the present invention, showing the dependence of the write voltage on the number of write operations. The width of a rectangular bar in the bar graph represents the write time.

The eighth embodiment is a method obtained by combining the sixth embodiment and the seventh embodiment. Specifically, the first write time tpgm1 is set longer than the value in the seventh embodiment and shorter than the second and later write times tpgm2, tpgm3, and tpgm4. In addition, the first write voltage Vpgm1 is set higher than the value in the sixth embodiment and lower than the value in the seventh embodiment.

The first write time tpgm1 is set longer than the value in the seventh embodiment and shorter than the second and later write times tpgm. Moreover, the first write voltage Vpgm1 is set higher than the value in the sixth embodiment and lower than the value in the seventh embodiment. Therefore, the write voltage is lower than in the prior art and the write time is shorter than in the prior art. As a result, variations in the threshold voltages of the memory cells written into in the first write operation can be made smaller than in the prior art. That is, the number of memory cells whose threshold voltage exceeds the specific threshold voltage Vth0 in the first write operation is smaller than in the prior art and the same threshold voltage distribution as that of FIG. 56 in the sixth embodiment can be obtained. At this time, by optimizing the write voltage Vptm1 and the write time tpgm1, the value of β shown in FIG. 56 can be made the value determined in the sixth embodiment.

The second write operation is carried out under the same condition as in the sixth embodiment. Therefore, the threshold voltage distribution after the second write operation is as shown in FIG. 57. As a result, by shortening the write time tpgm1 and optimizing the value of β, the threshold voltage distribution width of the memory cells whose threshold voltage has exceeded Vth0 can be made smaller than that in the prior art. Thereafter, the third and fourth write operations are carried out in the same manner as in the sixth embodiment, producing threshold voltage distributions shown in FIGS. 58 and 59.

Consequently, as explained in the sixth embodiment, the threshold voltage distribution width after the completion of all the write operations can be made smaller than in the prior art. Furthermore, the write time can be shortened and therefore a high-speed write operation can be realized.

[Ninth Embodiment]

Figure 67:
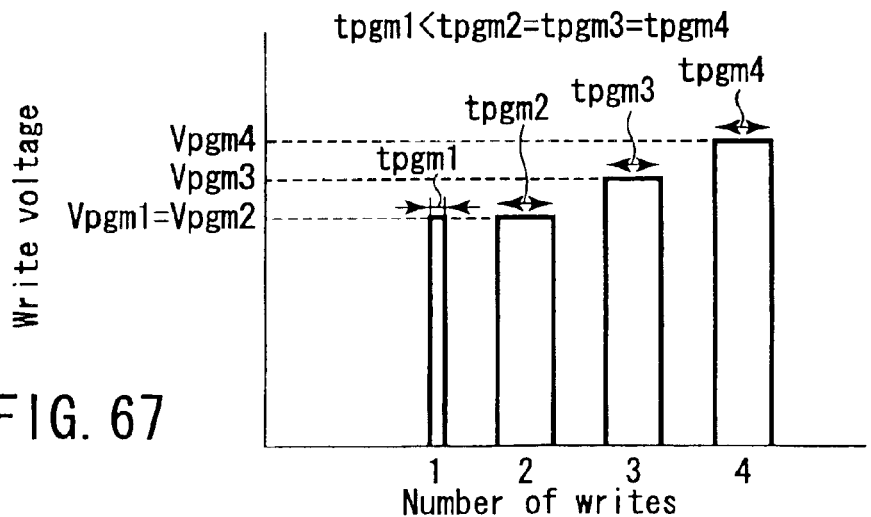
FIG. 67 shows the relationship between the number of write operations and the write voltage in a ninth embodiment of the present invention.

FIG. 67 is a diagram to help explain a writing method according to a ninth embodiment of the present invention, showing the dependence of the write voltage on the number of write operations. The width of a rectangular bar in the bar graph represents the write time.

The ninth embodiment is a modification of the seventh embodiment. In the ninth embodiment, the first write time tpgm1 is set shorter than the value in the seventh embodiment and the first write voltage Vpgm1 is set higher than the value in the seventh embodiment, for example, set to a value equal to the second write voltage Vpgm2. Although the first write voltage is higher than in the prior art, sufficiently shortening the write time enables variations in the threshold voltages of the memory cells written into in the first write operation to be made smaller than in the prior art. That is, the number of memory cells whose threshold voltage exceeds the specific threshold voltage Vth0 can be made smaller than in the prior art. As a result, in the ninth embodiment, too, the same threshold voltage distribution as that shown in FIG. 56 in the sixth embodiment can be obtained. At this time, optimizing the write time tpgm1 enables β in FIG. 56 to be made equal to the value determined in the sixth embodiment.

The second write operation is carried out under the same condition as in the sixth embodiment. Therefore, the threshold voltage distribution after the second write operation is as shown in FIG. 57. As a result, by shortening the write time tpgm1 and optimizing the value of β, the threshold voltage distribution width of the memory cells whose threshold voltage has exceeded Vth0 can be made smaller than that in the prior art. Thereafter, the third and fourth write operations are carried out in the same manner as in the sixth embodiment, producing threshold voltage distributions shown in FIGS. 58 and 59.

Consequently, as in the sixth embodiment, the threshold voltage distribution width after the completion of all the write operations can be made smaller than in the prior art. Moreover, the write time can be shortened and therefore a high-speed write operation can be realized.

While in the ninth embodiment, the first write voltage Vpgm1 has been made equal to the second write voltage Vpgm2, the first write voltage Vpgm1 is not restricted to the second write voltage Vpgm2. However, to make variations in the threshold voltages of the memory cells written into in the first write operation smaller than in the prior art, it is desirable if the first write voltage Vpgm1 in the ninth embodiment is higher than the first write voltage Vpgm1 in the seventh embodiment and equal to or lower than the second write voltage Vpgm2.

Furthermore, the sixth to ninth embodiments may be applied not only to a case where two-valued (one bit) data is stored in a single memory but also to the operation of writing data into a first page, a second page, . . . in a case where four- or more-valued (two or more bits) data is stored in a single memory.

Figure 45:
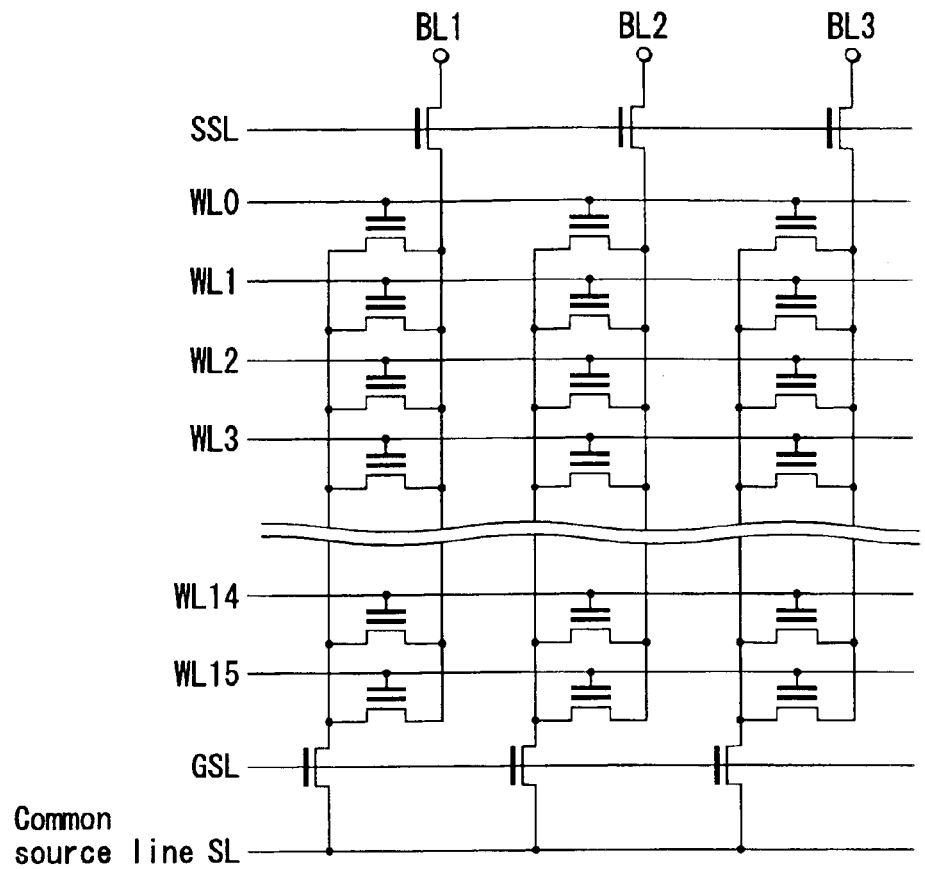
FIG. 45 shows an AND memory cell array.
Figure 46:
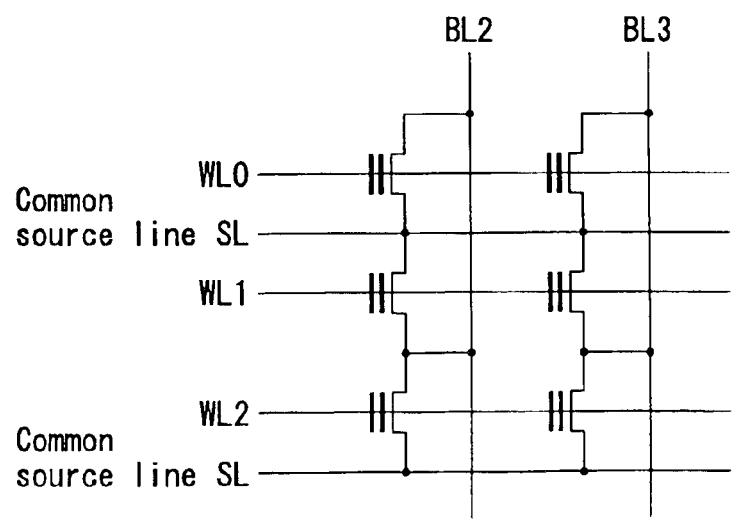
FIG. 46 shows a NOR memory cell array.
Figure 47:
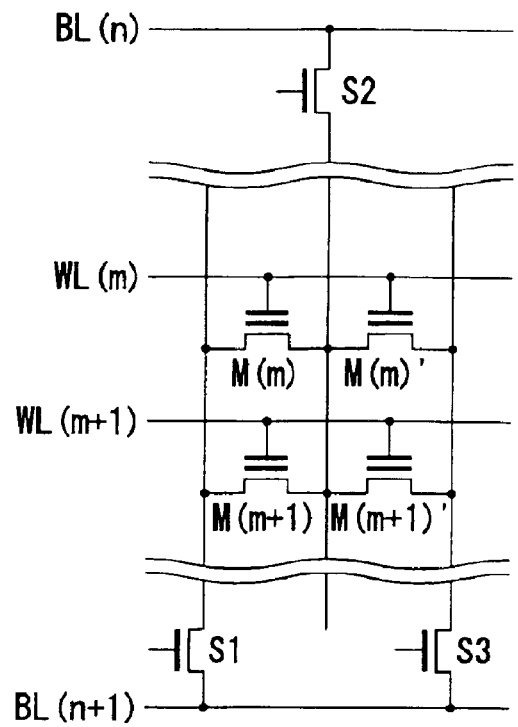
FIG. 47 shows a virtual-grand-array-type cell array.

In addition, the sixth to ninth embodiments may be applied to the AND memory cell array shown in FIG. 45, the NOR memory cell array shown in FIG. 46, and the virtual grand array cell array shown in FIG. 47.

In the first to ninth embodiments, examples of the ONO structure using a silicon nitride film as an insulating film serving as a charge accumulation layer, or as a part of the stacked insulating film placed on the floating gate have been explained. However, the material of the insulating film is not restricted to a silicon nitride film and may be, for example, an Al2O3 film and oxynitride film.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A method of writing data into a semiconductor memory, comprising:
   selecting a memory cell in a memory cell array including a plurality of memory cells; and
   applying a sequentially stepped-up pulse voltage to a gate electrode of the memory cell in at least one of a write operation and an erase operation.

2. The method according to claim 1, wherein the applying step comprises:
   applying a first voltage to the gate electrode in a first write operation; and
   applying a second voltage higher than the first voltage to the gate electrode in a second write operation.

3. The method according to claim 2, wherein the first write operation has no write verify operation, and the second write operation has a write verify operation.

4. The method according to claim 2, wherein the first write operation applies the first voltage to the gate electrode a plurality of times.

5. The method according to claim 2, wherein the first voltage is a stepwise pulse stepped up continuously.

6. The method according to claim 2, wherein the first voltage is a triangular pulse stepped up linearly.

7. A method of writing data into a semiconductor memory, comprising:
   selecting a memory cell in a memory cell array including a plurality of memory cells;
   applying sequentially a first write pulse voltage with a first stepped-up voltage to a gate electrode at a first write operation; and
   applying a second write pulse voltage with a second stepped-up voltage lower than the first stepped-up voltage in writing the data into the memory cell at a second write operation.

8. The method according to claim 7, wherein the first write operation has no verify read operation after a write pulse voltage is applied and the second write operation includes a verify read operation to determine a threshold voltage after each write pulse voltage is applied.

9. The method according to claim 7, wherein the first write operation applies the first stepped-up voltage to the gate electrode a plurality of times.

10. The method according to claim 7, wherein the first write pulse voltage is a stepwise pulse stepped up continuously.

11. The method according to claim 7, wherein the first write pulse voltage is a triangular pulse stepped up linearly.

12. A method of erasing data from a semiconductor memory, comprising:
    sequentially applying a first erase pulse voltage between a gate electrode of each of memory cells and a semiconductor substrate in a first erase operation; and
    applying a second erase pulse voltage higher than the first erase pulse voltage between the gate electrode of each of the memory cells and the semiconductor substrate in a second erase operation.

13. The method according to claim 12, wherein the first erase operation has no verify read operation after the first erase pulse voltage is applied and the second erase operation includes a verify read operation to determine a threshold voltage after the second erase pulse voltage is applied.

14. The method according to claim 12, further comprising:
    applying a write pulse voltage to the gate of each of the memory cells before the first erase operation.

15. The method according to claim 12, wherein the first erase operation applies the first erase pulse voltage to the gate electrode and semiconductor substrate a plurality of times.

16. The method according to claim 12, wherein an increment of first erase pulse voltage is greater than that of the second erase pulse voltage.

17. The method according to claim 12, wherein the first erase pulse voltage is a stepwise pulse stepped up continuously.

18. The method according to claim 12, wherein the first erase pulse voltage is a triangular pulse stepped up linearly.

19. A method of erasing data from a semiconductor memory, comprising:
    applying a first erase pulse voltage between a gate electrode of a memory cell and a semiconductor substrate, the first erase pulse voltage having a first voltage and a first pulse width; and
    applying a second erase pulse voltage between a gate electrode of a memory cell and a semiconductor substrate, the second erase pulse voltage having a second voltage smaller in absolute value than the first voltage and a second pulse width greater than the first pulse width.

20. The method according to claim 19, further comprising:
    applying a write pulse voltage before at least one of applying the first erase pulse and applying the second erase pulse.

* * * * *